United States Patent [19]
Furutani et al.

[11] Patent Number: 5,729,502
[45] Date of Patent: Mar. 17, 1998

[54] SEMICONDUCTOR MEMORY DEVICE THAT CAN READ OUT DATA AT HIGH SPEED

[75] Inventors: Kiyohiro Furutani; Hiroshi Miyamoto, both of Hyogo, Japan

[73] Assignee: Mitsubishi Denki Kabushiki Kaisha, Tokyo, Japan

[21] Appl. No.: 775,762

[22] Filed: Dec. 31, 1996

Related U.S. Application Data

[62] Division of Ser. No. 435,691, May 5, 1995, Pat. No. 5,600,607.

[30] Foreign Application Priority Data

May 31, 1994 [JP] Japan ................................. 6-118653

[51] Int. Cl.$^6$ ........................................................ G11C 8/00
[52] U.S. Cl. .......................................... 365/233; 365/189.05
[58] Field of Search .............................. 365/233, 233.5, 365/189.05, 230.08

[56] References Cited

U.S. PATENT DOCUMENTS

| | | | |
|---|---|---|---|
| 5,083,296 | 1/1992 | Hara | 365/230.08 |
| 5,210,715 | 5/1993 | Houston | 365/189.05 |
| 5,341,341 | 8/1994 | Fukuzo | 365/233 |
| 5,608,688 | 3/1997 | Park | 365/233.5 |
| 5,623,447 | 4/1997 | Shimoda | 365/233 |
| 5,640,352 | 6/1997 | Honda | 365/189.05 |

FOREIGN PATENT DOCUMENTS

| | | |
|---|---|---|
| 62-28994 | 2/1987 | Japan . |
| 3-86995 | 4/1991 | Japan . |
| 5-144255 | 6/1993 | Japan . |

*Primary Examiner*—David C. Nelms
*Assistant Examiner*—Son Mai
*Attorney, Agent, or Firm*—Lowe, Price, LeBlanc & Becker

[57] ABSTRACT

A $\phi_C$ generation circuit provides a column address buffer control signal to a column address buffer so that the column address buffer maintains a latch operation during the operation period of a differential amplifier. The column address buffer responds to a column address buffer control signal to latch an input address signal for providing a column address signal to a $\phi_D$ and PAE generation circuit. The $\phi_D$ and PAE generation circuit provides a differential amplifier activation signal to the differential amplifier according to a column address signal and a column access activation signal. The differential amplifier responds to a differential amplifier activation signal for amplifying data applied from a data input and output line to provide the same to a selector via a readout data line.

4 Claims, 37 Drawing Sheets

FIG. 30        PRIOR ART
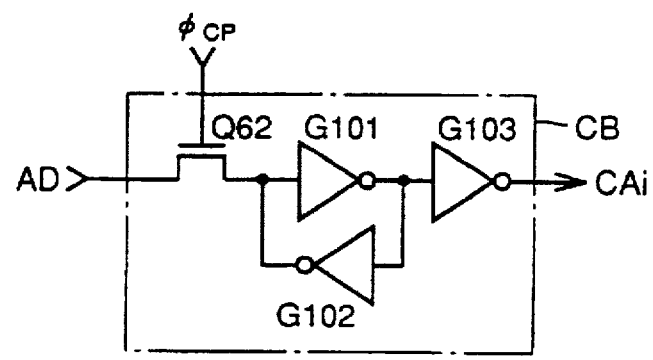
FIG. 31        PRIOR ART
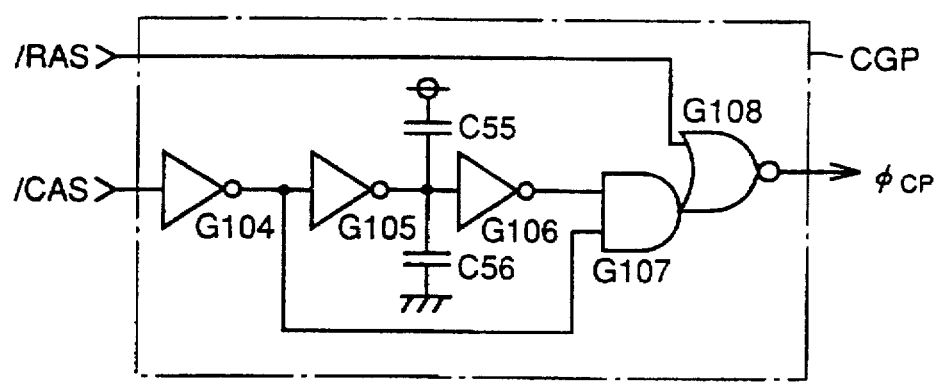
FIG. 32        PRIOR ART
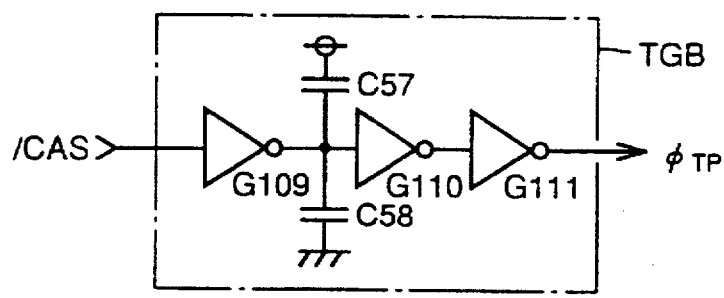

SEMICONDUCTOR MEMORY DEVICE THAT CAN READ OUT DATA AT HIGH SPEED

This application is a division of application Ser. No. 08/435,691 filed May 5, 1995, U.S. Pat. No. 5,600,607.

BACKGROUND OF THE INVENTION

1. Field of the Invention

The present invention relates to semiconductor memory devices, and more particularly, to a semiconductor memory device that reads out stored data at high speed.

2. Description of the Invention

A DRAM (Dynamic Random Access Memory) which is a conventional semiconductor memory device will be described hereinafter with reference to FIG. 23 which is a block diagram showing a structure thereof.

Referring to FIG. 23, a semiconductor memory device includes readout circuits RR0a–RR3a, RR0b–RR3b, RR0c–RR3c, RR0d–RR3d, memory cell array M0a–M3a, M0b–M3b, M0c–M3c, M0d–M3d, row decoders RDa, RDb, column decoders CDa–CDd, selectors SEPa–SEPd, output circuits DQPa–DQPd, a control circuit CCP, a row address buffer RB, a column address buffer RB, and a predecoder PD.

An externally applied address signal AD is supplied to row address buffer RD and column address buffer CB. Row address buffer RB receives an address signal AD to output a row address signal RAi. Column address buffer CB receives an address signal AD to output a column address signal CAi.

A column address signal CAi is supplied to predecoder PD. Predecoder PD receives a column address signal CAi to output a predecode signal Yi (i=0–23). Predecode signals Y0–Y3, and Y7 are applied to readout circuits RR0a–RR0d. Predecode signals Y0–Y3 and Y6 are applied to readout circuits RR1a–RR1d. Predecode signals Y0–Y3 and Y5 are applied to readout circuits RR2a–RR2d. Predecode signals Y0–Y4 are applied to readout circuits RR3a–RR3d. Predecode signals Y0–Y3 serve to select data input and output lines IO and /IO in memory cell arrays M0a–M3a, M0b–M3b, M0c–M3c and M0d–M3d corresponding to readout circuits RR0a–RR3a, RR0b–RR3b, RR0c–RR3c, and RR0d–RR3d. Predecode signals Y4–Y7 serve to select a readout circuit and a memory cell array. Predecode signals Y0–Y3 are applied to selectors SEPa–SEPd. Predecode signals Y8–Y23 are applied to column decoders CDa–CDd.

Externally applied row address strobe signal /RAS, a column address strobe signal /CAS and an address signal AD are applied to control circuit CCP. Control circuit CCP responds to each input signal to output an address change detection signal ATD, a data select control signal $\phi_D$, a differential amplifier activation signal PAE, a data transfer control signal $\phi_{TP}$, and an output buffer activation signal $\phi_E$.

A row address signal RAi is applied from row address buffer RB to row decoders RDa and RDb. Row decoders RDa and RDb respond to row address signal RAi to activate a predetermined word line in a memory cell array. Column decoders CDa–CDd respond to predecode signals Y8–Y23 to select a predetermined bit line in a memory cell array. Data of a memory connected to the selected word line and bit line are provided to a readout circuit.

Readout circuits RR0a–RR3a are connected to a selector SEPa via readout data lines RD0a–RD3a. Selector SEPa selects a readout data line selected by predecode signals Y0–Y3 from readout data lines RD0a–RD3a to provide the signal of the selected readout line to output circuit DQPa via an output data bus RBUSa. Output circuit DQPa latches the input data and outputs the same. The other readout circuits, selectors and output circuits have a similar structure and operation.

The readout circuits and memory cell array shown in FIG. 23 will be described in detail hereinafter with reference to FIG. 24. Although a readout circuit RR0a and a memory cell array M0a are shown in FIG. 24, the other readout circuits and memory cell arrays have a similar structure and operate in a similar manner. Referring to FIG. 24, a memory cell array M0a includes capacitors C41–C44 and transistors Q41–Q44 which are N type MOSFETs to form memory cells, sense amplifiers (SA) SA0–SA3, transfer gates Q31–Q38 formed of N type MOSFETs, word lines WLia and WLib, bit lines BL0–BL3, /BL0–/BL3 ("/" indicates a complementary signal line or signal), and a column select line CSLi. For the sake of simplification, the memory cell, the word line, the bit line, and the column select line are shown only partially in FIG. 24.

The gate of transistor Q41 is connected to word line WLia. Transistor Q41 is connected to bit line B20 and capacitor C41. The other capacitors C42–C44 and transistors Q42–Q44 are connected in a similar manner.

Bit lines BL0 and /BL0 are connected to sense amplifier SA0. Sense amplifier SA0 is connected to data input and output lines IO0, /IO0 via transfer gates Q31 and Q32. The other sense amplifiers SA1–SA3 are connected in a similar manner.

Transfer gates Q31–Q38 have their gates connected to column select line CSLi.

According to the above-described structure, data in a memory cell connected to a selected word line and bit line is amplified by a sense amplifier to be output to a data input and output line via a transfer gate.

Next, readout circuit RR0a will be described. Referring to FIG. 24, a readout circuit RR0a includes differential amplifiers (AMP) DA0–DA3, AND gates G61–G64, and transistors Q21–Q28 which are N type MOSFETs.

Predecode signals Y0, Y7, and a differential amplifier activation signal PAE are applied to AND gate G61. AND gate G61 provides a logical product of respective signals to transistors Q21, Q22, and differential amplifier DA0. Differential amplifier DA0 is connected to data input and output lines IO0, /IO0, and also connected to readout data lines RD0a, /RD0a via transistors Q21 and Q22.

According to the above-described structure, when predecode signals Y0 and Y7, and differential amplifier activation signal PAE all attain an H level (logical high), differential amplifier DA0 amplifies a signal applied via data input and output lines IO0, /IO0 to provide the same to readout data lines RD0a, /RD0a via transistors Q21 and Q22.

The other AND gates G62–G64, transistors Q23–Q28, and differential amplifiers DA1–DA3 are formed in a similar manner, and carry out similar operations.

According to the above-described structure, readout circuit RR0a is selected by predecode signal Y7, and differential amplifiers DA0–DA3 selected by predecode signals Y0–Y3 carry out an amplify operation when differential amplifier activation signal PAE attains an active state. Data output from a memory cell array MA0a is provided to one pair of readout data lines RD0a–RD3a, /RD0a–/RD3a. The other readout circuits and memory cell arrays have a similar structure, and operate in a similar manner.

The differential amplifier of FIG. 24 will be described in detail with reference to the circuit diagram of FIG. 25.

Referring to FIG. 25, a differential amplifier DA includes inverters G71–G74, transistors Q51–Q54 which are P type MOSFETs, and transistors Q55–Q57 which are N type MOSFETs.

A data signal input via data input and output lines IO, /IO is applied to the gates of transistors Q55 and Q56. Transistor Q55 is connected to transistors Q57 and Q52. Transistors Q57 is connected to a ground potential. A differential amplifier activation signal PAE is applied to the gate of transistors Q57. Transistor Q52 is connected to a power supply voltage $V_{cc}$. The gate of transistor Q52 is connected to a node of transistors Q53 and Q56. Transistor Q51 is connected to transistors Q52 and Q55, and also to power supply voltage $V_{cc}$. The gate of transistor Q51 receives differential amplifier activation signal PAE. Inverter G72 is connected to inverter G71 and transistor Q51. Inverter G72 outputs amplified data to readout data line RDI. Transistors Q53, Q54, Q56 and inverters G73, G74 are connected in a similar manner. Inverter G74 outputs amplified data to output data line /RDi.

According to the above-described structure, data of readout data lines RDi and /RDi attain an L level (logical low) when differential amplifier activation signal PAE attains an L level. When differential amplifier activation signal PAE attains an H level, data of readout data line RD attains an L level and data of the complementary readout data line /RD attains an H level when data input and output line IO has a higher potential than complementary data input and output line /IO. When the potential of data input and output line IO is lower than that of data input and output line /IO, data of readout data line RD attains an H level and data of readout data line /RD attains an L level. According to the above-described operation, differential amplifier DA responds to differential amplifier activation signal PAE to amplify a data signal applied from data input and output lines IO, /IO to provide the amplified data to readout data lines RDi and /RDi which are complementary to each other.

The control circuit of FIG. 23 will be described in detail with reference to the block diagram of FIG. 26.

Referring to FIG. 26, a control circuit CCP includes a column access activation signal generation circuit C1, a $\phi_R$ generation circuit RG, a $\phi_D$ and PAE generation circuit DPG, a $\phi_C$ generation circuit CGP, a $\phi_T$ generation circuit TGP, and a $\phi_E$ generation circuit EG.

A row address strobe signal /RAS is applied to column access activation signal generation circuit CEG. Column access activation signal generation circuit CEG responds to row address strobe signal /RAS to output a column access activation signal /CE to $\phi_D$ and PAE generation circuit DPG.

$\phi_R$ generation circuit RG receives a row address strobe signal /RAS. $\phi_R$ generation circuit RG responds to row address strobe signal /RAS to output row address buffer control signal $\phi_R$ to row address buffer RB. Row address buffer RD responds to row address buffer control signal $\phi_R$ to latch and output a row address signal RAi according to an input address signal AD.

Row address strobe signal /RAS and column address strobe signal /CAS are applied to $\phi_C$ generation circuit CGP. $\phi_C$ generation circuit CGP responds to row and column address strobe signals /RAS and /CAS to output a column address buffer circuit signal $\phi_{CP}$ to column address buffer CB. Column address buffer CB responds to column address buffer control signal $\phi_{CP}$ to latch a column address signal CAi from an input address signal AD to provide column address signal CAi to $\phi_D$ and PAE generation circuit DPG and predecoder PD.

Column access activation signal /CE and column address signal CAi are applied to $\phi_D$ and PAE generation circuit CPG. $\phi_D$ and PAE generation circuit DPG responds to column access activation signal /CE and column address signal CAi to output differential amplifier activation signal PAE to differential amplifier DA, whereby a data select control signal $\phi_D$ is provided to selector SEP. An address change detection signal ATD is output.

Predecoder PD responds to an input column address signal CAi to output predecode signal Yi to selector SEP.

Differential amplifier DA amplifies data input via data input and output line IOi to output the same to selector SEP via readout data line RDi.

Selector SEP responds to data transfer control signal $\phi_D$ to latch input data, and responds to predecode signal Yi to provide predetermined data from a plurality of data to an output circuit DQP via a readout data bus RBUS.

Column address strobe signal /CAS is applied to $\phi_T$ generation circuit TGP. $\phi_T$ generation circuit TGP delays an input column address strobe signal /CAS to output a data transfer control signal $\phi_{TP}$ to an output data latch DLP. $\phi_E$ generation circuit EG provides an output buffer activation signal $\phi_E$ to output buffer OBP at a predetermined timing.

Output circuit DQP includes an output data latch DLP and an output buffer OBP. Output data latch DLP responds to data transfer control signal $\phi_{TP}$ to latch data input via readout data bus RBUS to provide the same to output buffer OBP as output signal OD. Output buffer OBP responds to $\phi_E$ to provide output data Dout according to an applied output signal OD.

According to the above-described structure, data input via data input and output line IOi is output via differential amplifier DA, selector SEP, and output circuit DQP at a predetermined timing.

The row address buffer of FIG. 26 will be described in detail with reference to the circuit diagram of FIG. 27.

Referring to FIG. 27, a row address buffer RB includes a transistor Q61 which is an N type MOSFET, and inverters G81–G83.

Row address buffer control signal $\phi_R$ is applied to the gate of transistor Q61. Transistor Q61 is connected to inverters G81 and G82, which in turn are connected to inverter G83. Inverter G83 outputs a row address signal RAi.

According to the above-described structure, when column address buffer control signal $\phi_R$ attains an H level, transistor Q61 is turned on, whereby address signal AD is latched by a latch circuit formed of inverters G81–G83 to be output as row address signal RAi.

The $\phi_R$ generation circuit of FIG. 26 will be described in detail with reference to the circuit diagram of FIG. 28.

Referring to FIG. 28, a $\phi_R$ generation circuit RG includes inverters G84–G86, an NOR gate G87, and delay capacitors C51 and C52.

Row address strobe signal /RAS is applied to inverter G84 and NOR gate G87. Inverter G84 is connected to capacitors C51 and C52, and inverter G85. Capacitor C51 has one end connected to power supply voltage $V_{cc}$, and capacitor C52 has one end connected to ground potential. Inverter G85 is connected to NOR gate G87. NOR gate G87 is connected to inverter G86. Inverter G86 outputs row address buffer control signal $\phi_R$.

According to the above-described structure, row address strobe signal /RAS is delayed by a delay circuit formed of inverters G84 and G85 and capacitors C51 and C52. The NOR of the delayed row address strobe signal and former row address strobe signal /RAS is inverted to be output as row address buffer control signal $\phi_R$.

The column access activation signal generation circuit of FIG. 26 will be described in detail with reference to the circuit diagram of FIG. 29.

Referring to FIG. 29, column access activation signal generation circuit CEG includes inverters G88–G90, an NOR gate G91, and delay capacitors C53 and C54.

Row address strobe signal /RAS is applied to inverter G88 and NOR gate G91. Inverter G88 is connected to inverter G89 and capacitors C53 and C54. Capacitor C53 has one end connected to power supply voltage $V_{cc}$, and capacitor C54 has one end connected to ground potential. Inverter G89 is connected to NOR gate G91 which is connected to inverter G90. Inverter G90 outputs column access activation signal /CE.

According to the above-described structure, row address strobe signal /RAS is delayed by a delay circuit formed of inverters G88 and G89 and capacitors C53 and C54. The NOR of the delayed row address strobe signal and former row address strobe signal /RAS is inverted to be output as column access activation signal /CE.

The column address buffer of FIG. 26 will be described in further details with reference to the circuit diagram of FIG. 30.

Referring to FIG. 30, column address buffer CB includes a transistor Q62 which is an N type MOSFET, and inverters G101–G103.

Column address buffer control signal $\phi_{CP}$ is applied to the gate of transistor Q62. Address signal AD is applied to transistor Q62. Transistor Q62 is connected to inverters G101 and G102. Inverters G101 and G102 are connected to inverter G103. Inverter G103 outputs a column address signal CAi.

According to the above-described structure, when column address buffer activation signal $\phi_{CP}$ attains an H level, transistor Q62 is turned on, whereby address signal AD is latched by a latch circuit formed of inverters G101–G103 to be output as column address signal CAi.

The $\phi_C$ generation circuit of FIG. 26 will be described in detail with reference to the circuit diagram of FIG. 31.

Referring to FIG. 31, $\phi_C$ generation circuit CGP includes inverters G104–G106, an AND gate G107, an NOR gate G108, and delay capacitors C55 and C56.

Column address strobe signal /CAS is supplied to inverter G104. Inverter G014 is connected to inverter G105 and AND gate G107. Inverter G105 is connected to capacitors C55 and C56, and inverter G106. Capacitor C55 has one end connected to power supply potential $V_{cc}$, and capacitor C56 has one end connected to ground potential. Inverter G106 is connected to AND gate G107. Row address strobe signal /RAS is applied to NOR gate G108. AND gate G107 is connected to NOR gate G108. Column address buffer control signal $\phi_{CP}$ is supplied to NOR gate G108.

According to the above-described structure, column address strobe signal /CAS is inverted by inverter G104. The inverted signal is delayed by a delay circuit formed of inverters G105 and G106, and capacitors C55 and C56. The logical product of the delayed signal and former inverted signal is taken by AND gate G107. The NOR of the output signal of AND gate G107 and row address strobe signal /RAS is output as column address buffer control signal $\phi_C$.

The $\phi_T$ generation circuit of FIG. 26 will be described in detail with reference to the circuit diagram of FIG. 32.

Referring to FIG. 32, $\phi_T$ generation circuit TGP includes inverters G109–G111, and delay capacitors C57 and G58.

Column address strobe signal /CAS is supplied to inverter G109. Inverter 109 is connected to capacitors C57 and C58, and inverter G110. Capacitor C57 has one end connected to power supply voltage $V_{cc}$. Capacitor C58 has one end connected to ground potential. Inverter G110 is connected to inverter G111. Inverter G111 outputs data transfer control signal $\phi_{TP}$.

According to the above-described structure, column address strobe signal /CAS is delayed by a delay circuit formed of inverters G109 and G110 and capacitor C57 and C57. The delayed signal is inverted by inverter G111 to be output as data transfer control signal $\phi_T$.

The $\phi_D$ and PAE generation circuit of FIG. 26 will be described in detail with reference to the circuit diagram of FIG. 33.

Referring to FIG. 33, $\phi_D$ and PAE generation circuit DPG includes column address change detection circuits (CAT) CAT0–CATn, inverters G112–G120, an AND gate G121, NAND gates G122, G123, NOR gate G123, delay capacitors C61–C66, and an S-R flipflop SRF.

Corresponding column address signals CA0–CAn are applied to column address change detection circuits CAT0–CATn. Column address change detection circuits CAT0–CATn detect the change of column address signal CA0–CAn to output column address signal change detection signals CAT0–CATn to NOR gate G124. Column access activation signal /CE is applied to NOR gate G124. NOR gate G124 is connected to inverter G112. NOR gate G124 provides to inverter G112 the NOR of column access activation signal /CE and column address signal change detection signals CAT0–CATn. Inverter G112 is connected to a set terminal S of S-R flipflop SRF and inverter G113. The output signal of inverter G112 is provided as address change detection signal ATD.

Inverter G113 is connected to AND gate G121. An output terminal Q of S-R flipflop SRF is connected to AND gate G121. AND gate G121 provides differential amplifier activation signal PAE.

Inverter G113 is connected to NAND gate 122. An output terminal Q of S-R flipflop SRF is connected to NAND gates G122 and G123. AND gate G122 is connected to capacitors C65 and C66, and inverter G118. Capacitor C65 has one end connected to power supply voltage $V_{cc}$, and capacitor C66 has one end connected to ground potential. Inverter G118 is connected to inverter G117 which is connected to capacitors C63 and C64, and inverter G116. Capacitor C63 has one end connected to power supply voltage $V_{cc}$, and capacitor C64 has one end connected to ground potential. Inverter G116 is connected to inverters G115 and G119. Inverter G115 is connected to capacitors C61 and C62, and inverter G114. Capacitor C61 has one end connected to power supply voltage $V_{cc}$, and capacitor C62 has one end connected to ground potential. Inverter G114 is connected to a reset terminal R of S-R flipflop SRF. Inverter G119 is connected to NAND gate G123. NAND gate G123 is connected to inverter G120. Inverter G120 outputs data select control signal $\phi_D$.

The operation of the above $\phi_D$ and PAE generation circuit will be described hereinafter. At the elapse of a predetermined time from row address strobe signal /RAS attaining an L level, column access activation signal /CE of an L level is output from column access activation signal generation circuit CEG. When at least one column address signal CAi changes after column access activation signal /CE attains an L level, a corresponding column address signal change detection signal CATi attains an H level for a predetermined time period. As a result, address change detection signal ATD is output at an H level for a predetermined time period.

When address change detection signal ATD attains an H level, output signal Q of S-R flipflop SRF is pulled up to an H level. Then, at the elapse of a predetermined time after address change detection signal ATD attains an L level, the output signal of inverter G114 attains an H level. Here, output signal Q of S-R flipflop SRF is reset to an L level. Therefore, differential amplifier activation signal PAE which is an AND signal of an inverted signal of address change detection signal ATD and output signal Q of S-R flipflop SRF attains an H level at the elapse of a predetermined time after address change detection signal ATD attains an L level.

Furthermore, row address buffer control signal $\phi_D$ attains an H level delayed by the delay time of NAND gate G123 and inverter G120 after address change detection signal ATD attains an H level. Therefore, data select control signal $\phi_D$ is pulled down to an L level earlier by a delay time of inverters G114 and G115 and capacitors C61 and C62 than differential amplifier activation signal PAE attaining an L level.

According to the above operation, $\phi_D$ and PAE generation circuit DPG responds to column access activation signal /CE and column address signals CA0–CAn to output address change detection signal ATD, differential amplifier activation signal PAE, and data select control signal $\phi_D$.

The column address change detection circuit of FIG. 33 will be described in further detail with reference to the circuit diagram of FIG. 34.

Referring to FIG. 34, column address change detection circuit CAT includes inverters G131–G134, NAND gates G135, G137, and an NOR gate G136. Column address signal CAi is applied to inverter G131 and NOR gate G136. Inverter G131 is connected to inverter G132, and to capacitors C67 and C68. Capacitor C67 has one end connected to power supply voltage $V_{cc}$, and capacitor C68 has one end connected to ground potential. Inverter G132 is connected to inverter G133. Inverter G133 is connected to NAND gate G135 and NOR gate G136. NAND gate G135 is connected to NAND gate G137. NOR gate G136 is connected to inverter G134 which is connected to NAND gate G137. NAND gate G137 outputs column address signal change detection signal CATi.

According to the above structure, column address change detection circuit CAT provides column address signal change detection signal CATi of an H level for a predetermined time period when column address signal CAi changes.

The selector SEP of FIG. 26 will be described in further detail with reference to the circuit diagram of FIG. 35.

Referring to FIG. 35, selector SEP includes transistors Q61–Q70 which are N type MOSFETs, and inverters G141–G148.

Predecode signal Y0 is supplied to the gates of transistors Q61 and Q62. Readout data line RD0 is connected to transistor Q69 via transistor Q61. Readout data line /RD0 complementary to readout data line RD0 is connected to transistor Q70 via transistor Q62. Similarly, readout data lines RD1–RD3, /RD1–RD3 are connected to transistors Q69 and Q70 via transistors Q63–Q68, respectively. Data select control signal $\phi_D$ is applied to the gates of transistors Q69 and Q70. Transistor Q69 is connected to inverters G141 and G142. Inverters G141 and G142 are connected to inverter G143. Inverter G143 is connected to inverter G144. Inverter G144 provides an output signal to readout data bus RBUS. Inverters G145–G148 are connected in a similar manner, and inverter G148 provides an output signal to readout data bus /RBUS complementary to readout data bus RBUS.

According to the above-described structure, a signal output from differential amplifier DA via readout data lines RD0–RD3, /RD0–/RD3 is selected by predecode signals Y0–Y3. The selected signal is entered into a latch circuit formed of inverters G141 and G142 and inverters G145 and G146 while data select control signal $\phi_T$ attains an H level. The entered signal is inverted to be output to readout data buses RBUS, /RBUS via inverters G143 and G144, and inverters G147 and G148.

The output data latch and output buffer shown in FIG. 26 will be described in further detail with reference to the circuit diagram of FIG. 36.

Referring to FIG. 36, output data latch DLP includes transistors Q71–Q74 which are N type MOSFETs and inverters G151–G156.

Data transfer control signal $\phi_{TP}$ is supplied to the gates of transistors Q71 and Q72. Inverters G151 and G152 is connected to readout data bus RBUS via transistor Q71. Inverters G151 and G152 are connected to transistor Q73. Transistor Q73 has one end connected to ground potential. A predetermined reset signal $\phi_{RE}$ is supplied to the gate of transistor Q73. Inverters G151 and G152 are connected to inverter G153. Inverter G153 provides an output signal OD to output buffer OBP. Transistors Q72, Q74 and inverters G154–G156 are connected in a similar manner, whereby an output signal /OD complementary to output signal OD is provided to output buffer OBP.

According to the above-described structure, data of readout data buses RBUS, /RBUS are transferred to latch circuits formed of inverters G151–G153, inverters G154–G156 while data transfer control signal $\phi_{TP}$ attains an H level to be provided to output buffer OBP as output signals OD, /OD.

The output buffer OBP will be described hereinafter. Referring to FIG. 36, output buffer OBP includes transistors Q75–Q78 which are N type MOSFETs, a transistor Q79 which is a P type MOSFET, a capacitor C71, inverters G159, G160, and NAND gates G157 and G158.

Output buffer activation signal $\phi_E$ is applied to NAND gates G157 and G158. Output signal OD is applied to NAND gate G157. NAND gate G157 is connected to inverter G159 and the gates of transistors Q79 and Q76. Inverter G159 is connected to capacitor C71. Capacitor C71 is connected to transistor Q75 and transistor Q79. Transistor Q75 has one end connected to power supply voltage $V_{cc}$, and transistor Q75 has its gate connected to power supply voltage $V_{cc}$. Transistor Q79 is connected to transistor Q76, and to the gate of transistor Q77. Transistor Q76 has one end connected to ground potential. Transistor Q77 is connected to power supply voltage $V_{cc}$ and transistor Q78.

Output signal /OD is supplied to NAND gate G158. NAND gate G158 is connected to inverter G160. Inverter G160 is connected to the gate of transistor Q78. Transistor Q78 has one end connected to ground potential. Output data Dout is provided from a node of transistors Q77 and Q78.

According to the above-described structure, output signals OD, /OD provided from output data latch DLP are output as output data Dout to an output pin while output buffer activation signal $\phi_E$ attains an H level.

The operation of the above-structured semiconductor memory device will be described hereinafter with reference to the first timing chart of FIG. 37.

Referring to FIG. 37, when row address strobe signal /RAS attains an L level at time t1, row address signal R1 of address signal AD is ascertained. Then, when column address strobe signal /CAS attains an L level at time t2, column address signal C2 of address signal AD is ascertained. In response to the ascertained row and column address signals, predetermined data is read out from a memory cell, whereby output data D1 is provided at time t4. The subsequent CAS cycle operates in a similar manner.

Another operation of the semiconductor memory device of FIG. 23 will be described with reference to the second timing chart of FIG. 38.

Referring to FIG. 38, when row address strobe signal /RAS attains an L level at time t1, row address signal R1 of address signal AD is ascertained. Then, when column address signal C1 of address signal AD is ascertained at time t2, output data D1 is provided at time t4 which is an elapse of an access time $t_{AA}$ from time t2 when column address signal C1 was ascertained. Then, when column address strobe signal /CAS attains an H level at time t5, column address signal C2 is ascertained, and output data D2 is provided at time t7 which is an elapse of an access time $t_{CPA}$ from time t5. The subsequent CAS cycle operates in a similar manner.

A conventional semiconductor memory device of the above-described structure had the following problems when the data readout operation is speeded.

First, when the cycle time period of a readout operation is reduced, the time period of column address signal /CAS attaining an L level becomes shorter, resulting in problems set forth in the following. The case where data of an H level is read out will be described first. FIG. 39 is a first timing chart for describing the problems of the semiconductor memory device shown in FIG. 23.

Referring to FIG. 39, at time t1, when column address strobe signal /CAS attains an L level, address signal AD is ascertained. Then, at time t2, column address signal CAi is ascertained. At time t3, predecode signal Yi is ascertained. Then, at time t4, address change detection signal ATD attains an H level. When address change detection signal ATD attains an L level at time t6, differential amplifier activation signal PAE is pulled up to an H level. This causes differential amplifier DA selected by predecode signal Yi to output a signal of an L level to readout data line RDI at time t8.

At time t6, a signal of an L level is transmitted to readout data bus RBS since data select control signal $\phi_D$ of selector SEP attains an H level. However, since column address strobe signal /CAS attains an H level at time t6, column address buffer control signal $\phi_{CP}$ is pulled up to an H level at time t7. As a result, transistor Q62 of column address buffer CB of FIG. 30 is turned on, and column address signal CAi changes at time t8. This change of column address signal CAi causes change of predecode signal Yi at time t9. Therefore, at time t9 prior to time t10 where data select control signal $\phi_D$ of selector SEP attains an L level, differential amplifier activation signal PAE of differential amplifier DA previously selected by predecode signal Yi attains an L level. As a result, the data in the latch circuit (inverters G141 and G142, and inverters G145 and G146) of selector SEP is lost, whereby the signal of readout data bus RBUS is pulled down to an L level. Therefore, output buffer OBP attains a high impedance state since both output signals OD and /OD of output data latch OBP attain an L level.

It is necessary to set the period of column address strobe signal /CAS attaining an H level shorter than the same attaining an L level since the time period of column address strobe signal /CAS attaining an L level cannot be made shorter. Furthermore, if the cycle time period of column address strobe signal /CAS is reduced to comply with an increase of speed of the semiconductor memory device, the time period of column address strobe signal /CAS attaining an H level is extremely short. In order to propagate a short pulse waveform on a printed circuit board, it is necessary to reduce the capacitive coupling of the wiring. An expensive multilayer substrate had to be used to reduce the length of the wiring.

After time t6 when column address strobe signal /CAS attains an H level, if the delay time starting from column address buffer control signal $\phi_C$ attaining an H level until an address signal AD is entered at time t7 is too long, address signal AD will not be entered even when column address strobe signal /CAS attains an H level. Therefore, as shown in the timing chart of FIG. 38, there was the problem that the access time $t_{CPA}$ subsequent to column address strobe signal /CAS attaining an H level is delayed even when address signal AD is applied at a constant cycle.

It was also difficult to improve the access time when data of an H level is read out continuously in a conventional semiconductor memory device due to the following problem. This second problem is described with reference to a timing chart of FIG. 40.

Referring to FIG. 40, at time t1, when an address signal AD is entered, differential amplifier activation signal PAE attains an H level at time t7 as in the above-described case. Then, at time t8, data of readout data lines RDi and /RDi are transferred to output data latch DLP via selector SEP and readout data bus RBUS, whereby output signal OD of output data latch DLP attains an H level. Here, in output buffer OBP, the potential of capacitor C71 precharged to the level of $V_{cc} - V_{th}$ ($V_{th}$ is the transistor threshold voltage) by transistor Q75 is further boosted by an output signal of inverter G159 to attain the level of $2V_{cc} - V_{th}$. Simultaneously, transistor Q79 is rendered conductive, whereby the gate potential of transistor Q77 attains the level of $2V_{cc} - V_{th}$. Therefore, output data Dout of output buffer OBP speedily attains the level of $V_{cc}$, whereby data of an H level is output. When data of an H level is to be read out also at the next cycle, following entry of an address signal AD at time t12, differential amplifier activation signal PAE attains an H level at time t17. At time t18, data of readout data lines RDi, /RDi are transferred to output data latch TLP via selector SEP and readout data bus RBUS.

The level of a standby state of differential amplifier DA is transmitted to output data latch DLP since data transfer control signal $\phi_{TP}$ attains an H level at time t17. As a result, the output signal of NAND gate G157 attains an H level since output signals OD and /OD of output data latch DLP attains an L level. Therefore, transistor Q76 conducts, whereby the ground potential of transistor Q77 temporarily attains a ground potential. In order to output data of an H level again at time t18, it is necessary to boost the gate potential of transistor Q77 to the level of $2V_{cc} - V_{th}$ again. Capacitor C71 must be rapidly charged to the level of $V_{cc} - V_{th}$ during the short time period from time t17 to time t18. However, capacitor C71 cannot be rapidly charged in such a short time period from time t17 to t18. The gate potential of transistor Q77 could not be boosted sufficiently, resulting in the problem of reduction in the output level of output buffer OBP. Therefore, it is therefore necessary to pull data transfer control signal $\phi_T$ to a level of H at time t19 after output signal RDi of differential amplifier DA attains an L level at time t18. Thus, the time for an output signal RDi of differential amplifier DA arriving at output data latch DLP via selector SEP and readout data bus RBUS is retarded, resulting in a problem that the access time is delayed.

In order to achieve high speed operation in a conventional semiconductor memory device, the column address change detection circuit of FIG. 34 is operated at high speed. Noise in an input address signal AD, even a short noise, will be propagated to address change detection signal ATD. This third problem will be described hereinafter in the case of reading out data of an H level according to a third timing chart of FIG. 41.

Referring to FIG. 41, when address signal AD is applied at time t1, address change detection signal ATD and data select control signal $\phi_T$ attain an H level at time t2. When address change detection signal ATD attains an L level at time t3, differential amplifier activation signal PAE attains an H level. At time t4 when readout data RD attains an L level, data of readout data line RD is transferred to readout data bus RBUS since data select control signal $\phi_D$ attains an H level.

At time t7 when noise is included in address signal AD, the noise is transmitted to address change detection signal ATD at time t8. Noise is generated also in data select control signal $\phi_D$. S-R flipflop SRF of the $\phi_D$ and PAE generation circuit RPG shown in FIG. 32 is not completely inverted. Therefore, when there is no noise at time t9, the output signal of S-R flipflop SRF attains an L level. Therefore, differential amplifier activation signal PAE is left at an L level. At time t8 when noise is included in data select control signal $\phi_D$ and an output signal of differential amplifier DA is transmitted to readout data line RD at an inactivated state, differential amplifier DA will not attain an activation state thereafter. Therefore, data of readout data bus RBUS will remain lost. When column address strobe signal /CAS attains an L level at time t10, output buffer activation signal $\phi_E$ attains an H level at time t11. Even when data transfer control signal $\phi_T$ attains an H level at time t12, readout data buses RBUS and /RBUS attain an L level, so that output data Dout is held at a high impedance state. Thus, there was the problem that high speed operation cannot be realized.

SUMMARY OF THE INVENTION

An object of the present invention is to provide a semiconductor memory device that can have the data readout operation speed increased.

Another object of the present invention is to prevent erroneous operation without delay in access time when an address is ascertained during an address signal being applied at a predetermined cycle and a column address strobe signal /CAS attaining an H level, and without an increase in the time period of a column address strobe signal /CAS attaining an L level when an address is ascertained during the column address strobe signal /CAS attaining an L level.

A further object of the present invention is to allow reading out data of an H level continuously without decrease in the level of an output signal and without delay in the access time.

Still another object of the present invention is to operate an address change detection circuit at high speed without erroneous operation.

A semiconductor memory device according to an aspect of the present invention provides data of a predetermined memory cell out of a plurality of memory cells. The semiconductor memory device includes a column address buffer responsive to a control signal for latching a column address signal, an amplifier for amplifying data of a predetermined memory cell out of the plurality of memory cells according to a column address signal latched by the column address buffer, and a control signal generation circuit for generating a control signal at a latch instructed state where the column address buffer is instructed to maintain a latch operation.

According to the above structure, the column address buffer latches a column address signal during an operation of the amplifier. Therefore, the column address signal does not change during the operation of the amplifier, so that the amplifier will not operate erroneously even when data is read out at high speed. Thus, high speed data readout is possible.

A semiconductor memory device according to another aspect of the present invention provides data of a predetermined memory cell from a plurality of memory cells, including an amplifier operating in response to a change of a column address signal for amplifying data of a predetermined memory cell out of the plurality of memory cells, an output data latch circuit for latching data output from the amplifier according to a control signal, and a control signal generation circuit for providing the control signal at an active state when a column address strobe signal is rendered active and at an elapse of a predetermined time period from a change of a column address signal, and maintaining the active state of the control signal until a first state where the operation of the amplifier ends or a second state where the column address strobe signal is rendered inactive.

According to the above structure, the output data latch circuit is rendered active when the column address strobe signal attains an active state and at an elapse of a predetermined time period from a change of the column address signal. This active state of the output data latch circuit is maintained until either a first state where the operation of the amplifier ends or a second state where the column address strobe signal attains an inactive state is entered. Therefore, the output data latch circuit will not operate erroneously even when data is read out at high speed. Thus, high speed data readout is possible.

A semiconductor memory device according to a further aspect of the present invention provides data of a predetermined memory cell out of a plurality of memory cells, including a plurality of amplifiers operating in response to a change of a column address signal for amplifying data of a predetermined memory cell out of the plurality of memory cells, a predecoder for providing a predecode signal in response to the column address signal, a selector responsive to a predecode signal for selecting a predetermined amplifier from the plurality of amplifiers to output data from the selected amplifier, and an output data latch for latching data output from the selector. The selector includes a holding circuit for holding a predecode signal until the output data latch circuit latches data output from the selector. The selector selects a predetermined amplifier from the plurality of amplifiers according to a predecode signal held by the holding circuit.

According to the above structure, a predecode signal is held until the output data latch circuit latches data output from a selector, whereby a predetermined amplifier is selected from the plurality of amplifiers in response to the held predecode signal. Since the selector outputs data provided from the selected amplifier, there is no possibility of erroneous operation of the output data latch circuit. Thus, data can be read out at high speed.

A semiconductor memory device according to still another aspect of the present invention provides data of a predetermined memory cell from a plurality of memory cells, including an amplifier for amplifying data of a predetermined memory cell out of a plurality of memory cells to output first and second output signals complementary to each other, and an amplify data latch circuit responsive to a control signal for latching first and second output signals. The amplifier provides the first and second output signals at a first potential during an inactive state, and provides one of the first and second output signals at a second potential according to data of the predetermined memory cell during an active state. The amplify data latch circuit maintains a holding operation when the first and second output signals attain the first potential, changes the held data when one of the first and second output signals attains an second potential, and is rendered inactive when the first and second output signal attain the first potential and the control signal attains an active state.

According to the above structure, the amplify data latch circuit continues a holding operation when the first and second output signals attain the first potential, changes the holding data when one of the first and second output signals attains the second potential, and is rendered inactive when the first and second output signals attain the first potential and the control signal attains an active state. Therefore, there is no possibility of erroneous operation of the amplify data latch circuit. Thus, data can be read out at high speed.

A semiconductor memory device according to a further aspect of the present invention provides data of a predetermined memory cell out of a plurality of memory cells, including an amplifier for amplifying data of a predetermined cell out of the plurality of memory cells to output first and second output signals complementary to each other, and an output data latch circuit responsive to a control signal for latching first and second output signals. The amplifier outputs first and second output signals at a first potential when in an inactive state, and provides one of the first and second output signals at a second potential according to the data in the memory cell at an active state. The output data latch circuit latches first and second output signals when the control signal attains an active state and one of the first and second output signals attains the second potential.

According to the above structure, the output data latch circuit latches first and second output signals only when the control signal attains an active state and one of the first and second output signals attains the second potential. Therefore, the output data latch circuit will not operate erroneously, and data can be read out at high speed.

A semiconductor memory device according to yet a further aspect of the present invention provides data of a predetermined memory cell from a plurality of memory cells, including an output buffer providing an output signal corresponding to the data of the predetermined memory cell. The output buffer includes a driver transistor formed of an N type MOSFET, a first P type MOSFET having one end connected to a gate of a driver transistor, a first capacitor connected to the other end of the first P type MOSFET, a second P type MOSFET having one end connected to the other end of the first P type MOSFET and the other end receiving a power supply voltage, a diode having one end connected to the back gate of the second P type MOSFET and the other end connected to an internal voltage which is a boosted version of the power supply voltage, and a second capacitor having one end connected to one end of the diode and to the back gate of the second P type MOSFET. The first capacitor is precharged by the power supply voltage via the second P type MOSFET. The second capacitor is precharged by the internal high voltage via the diode.

According to the above structure, the gate potential of the driver transistor is boosted to a high level, so that the conductivity of the driver transistor is increased. Therefore, the driver transistor can be operated at high speed. As a result, the output buffer operates speedily, and data can be read out at high speed.

A semiconductor memory device according to yet another aspect of the present invention provides data of a predetermined memory cell out of a plurality of memory cells, including an output buffer receiving an input signal corresponding to the data of a memory cell for providing an output signal corresponding to the input signal according to the control signal. The output buffer includes a driver transistor formed of an N type MOSFET, a switching transistor formed of a P type MOSFET having one end connected to the gate of the driver transistor, a capacitor connected to the other end of the switching transistor, a precharge transistor formed of an N type MOSFET having one end connected to the other end of the switching transistor and the other end receiving a power supply voltage, and a level conversion circuit for converting a signal of the power supply voltage level to a signal of an internal high voltage level having the power supply voltage boosted when at least one of the control signal and the input signal is rendered inactive, and providing the signal of the internal high voltage level to the gate of the precharge transistor. The capacitor is precharged by the power supply voltage via the precharge transistor.

According to the above structure, the gate potential of the driver transistor is boosted to a high potential, so that the conductivity of the driver transistor is increased. Therefore, the driver transistor can operate at high speed. Thus, the output buffer operates at high speed, and data can be read out speedily.

A semiconductor memory device according to yet a still further aspect of the present invention provides data of a predetermined memory cell out of a plurality of memory cells, including a plurality of amplifiers for amplifying data of a predetermined memory cell out of the plurality memory cells, a selector for selecting data output from a plurality of amplifiers in response to a predecode signal, an output data latch circuit for latching data selected by the selector, and an output buffer for providing data output from the output data latch circuit.

According to the above structure, the output data latch circuit is provided succeeding the selector. Therefore, even when the predecode signal changes after data is latched in the output data latch, the latched data will not change, and the output data latch circuit will not operate erroneously. Thus, data can be read out at high speed.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 30 is a circuit diagram showing a structure of the column address buffer of FIG. 26.

FIG. 31 is a circuit diagram showing a structure of the $\phi_C$ generation circuit of FIG. 26.

FIG. 32 is a circuit diagram showing a structure of the $\phi_T$ generation circuit of FIG. 26.

DESCRIPTION OF THE PREFERRED EMBODIMENTS

Figure 1:
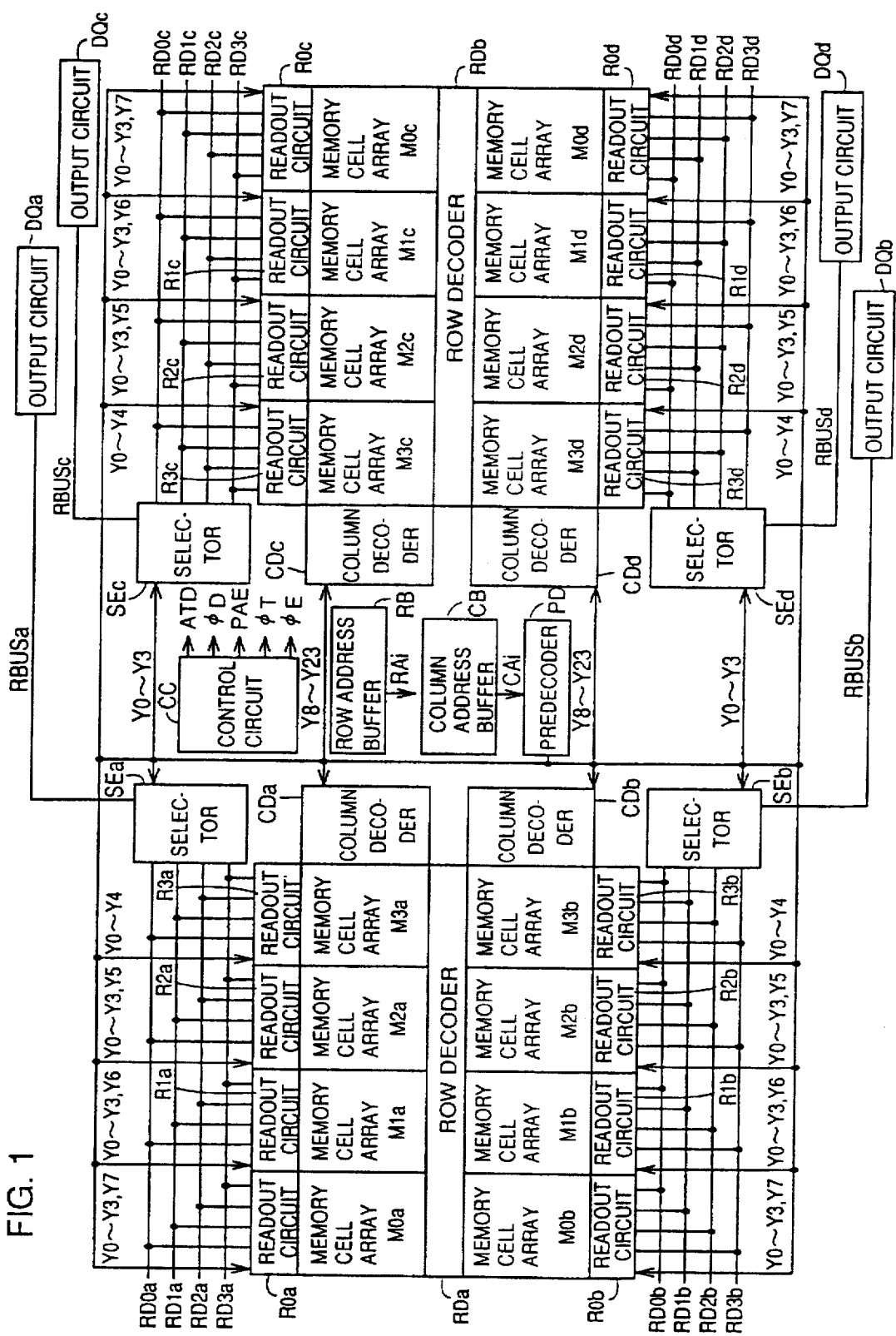
FIG. 1 is a block diagram showing a structure of a semiconductor memory device according to an embodiment of the present invention.
Figure 23:
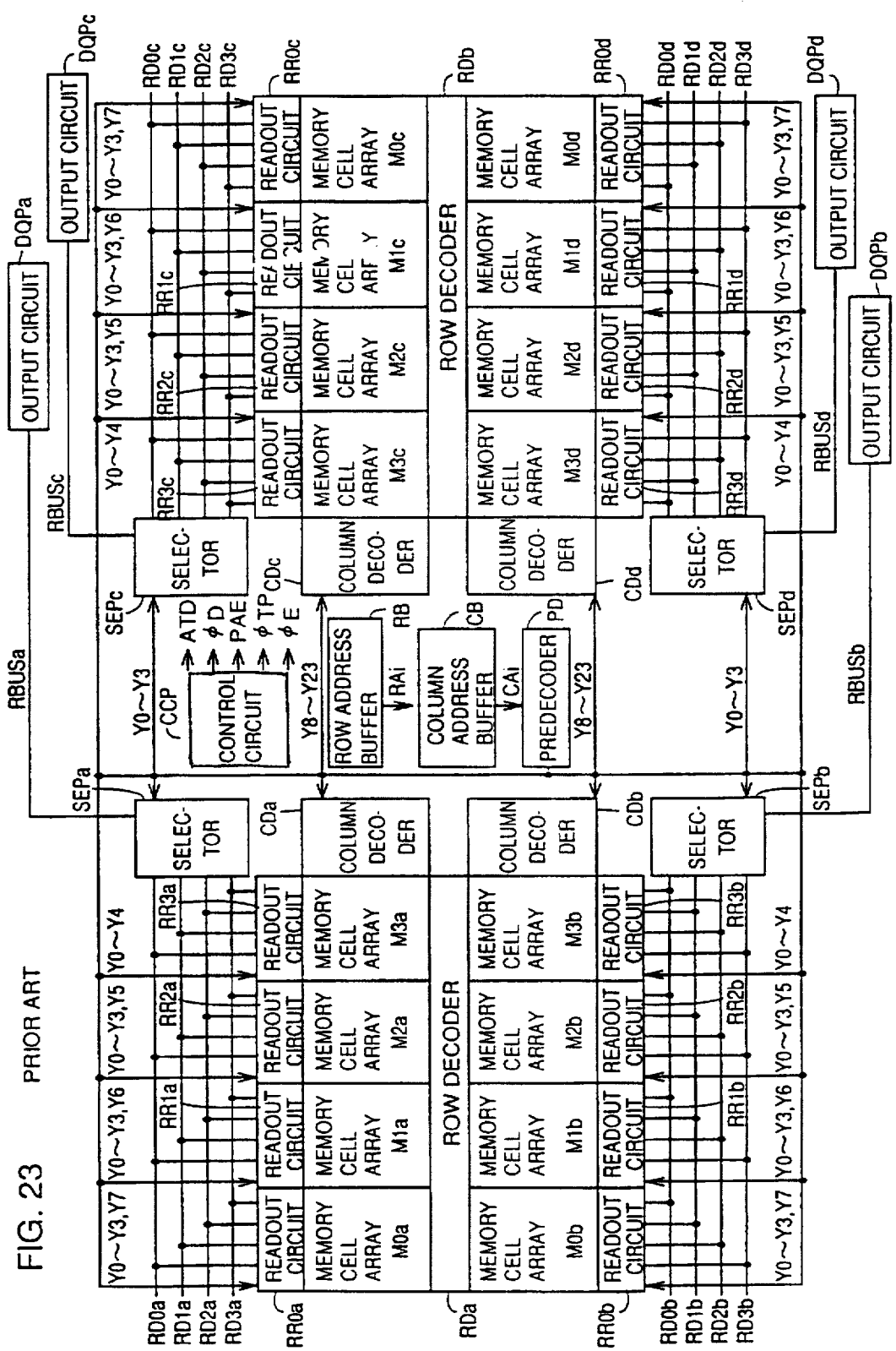
FIG. 23 is a block diagram showing a structure of a conventional semiconductor memory device.

An embodiment of the present invention will be described hereinafter with reference to the drawings of a DRAM. FIG. 1 is a block diagram showing a structure of a semiconductor memory device according to an embodiment of the present invention. The semiconductor memory device shown in FIG. 1 differs from the semiconductor memory device shown in FIG. 23 in a control circuit CC, selectors SEa–SEd, and output circuits DQa–DQd. The remaining components are similar to those of the semiconductor memory device of FIG. 23, and corresponding components have the same reference characters denoted. The description of the similar components will not be repeated.

Figure 2:
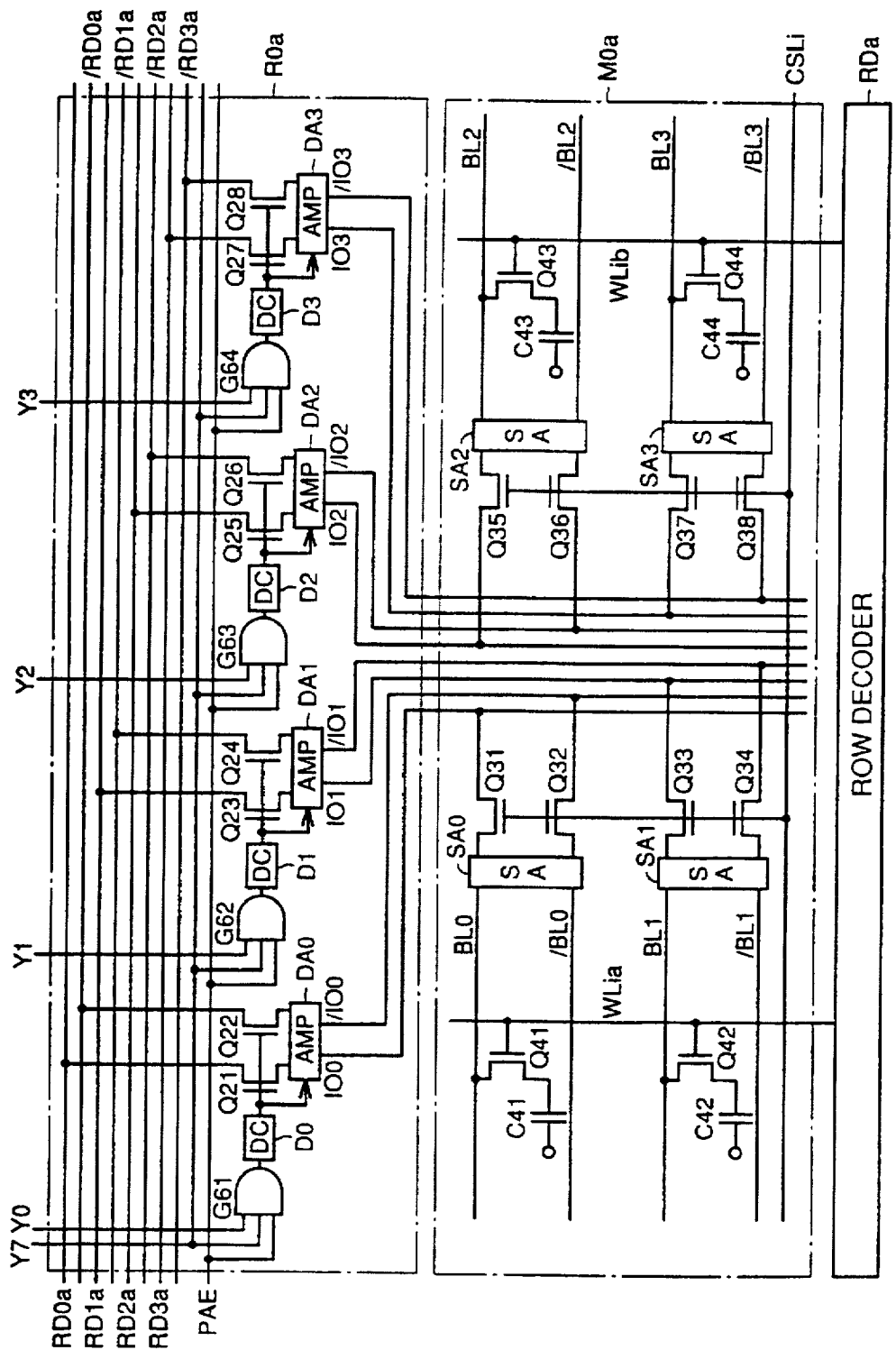
FIG. 2 shows a structure of a readout circuit and a memory cell array shown in FIG. 1.
Figure 24:
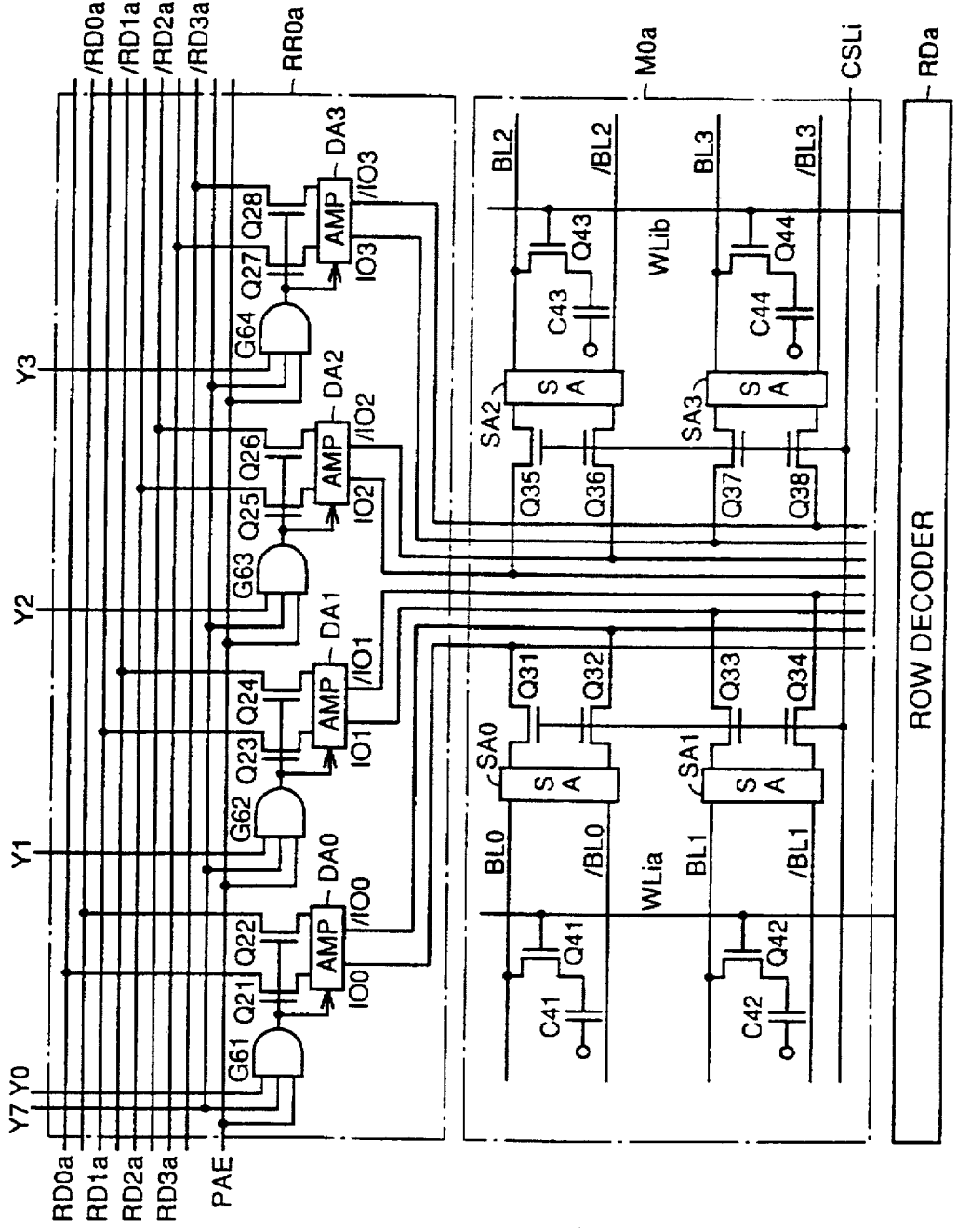
FIG. 24 is a diagram showing a structure of the readout circuit and the memory cell array of FIG. 23.
Figure 25:
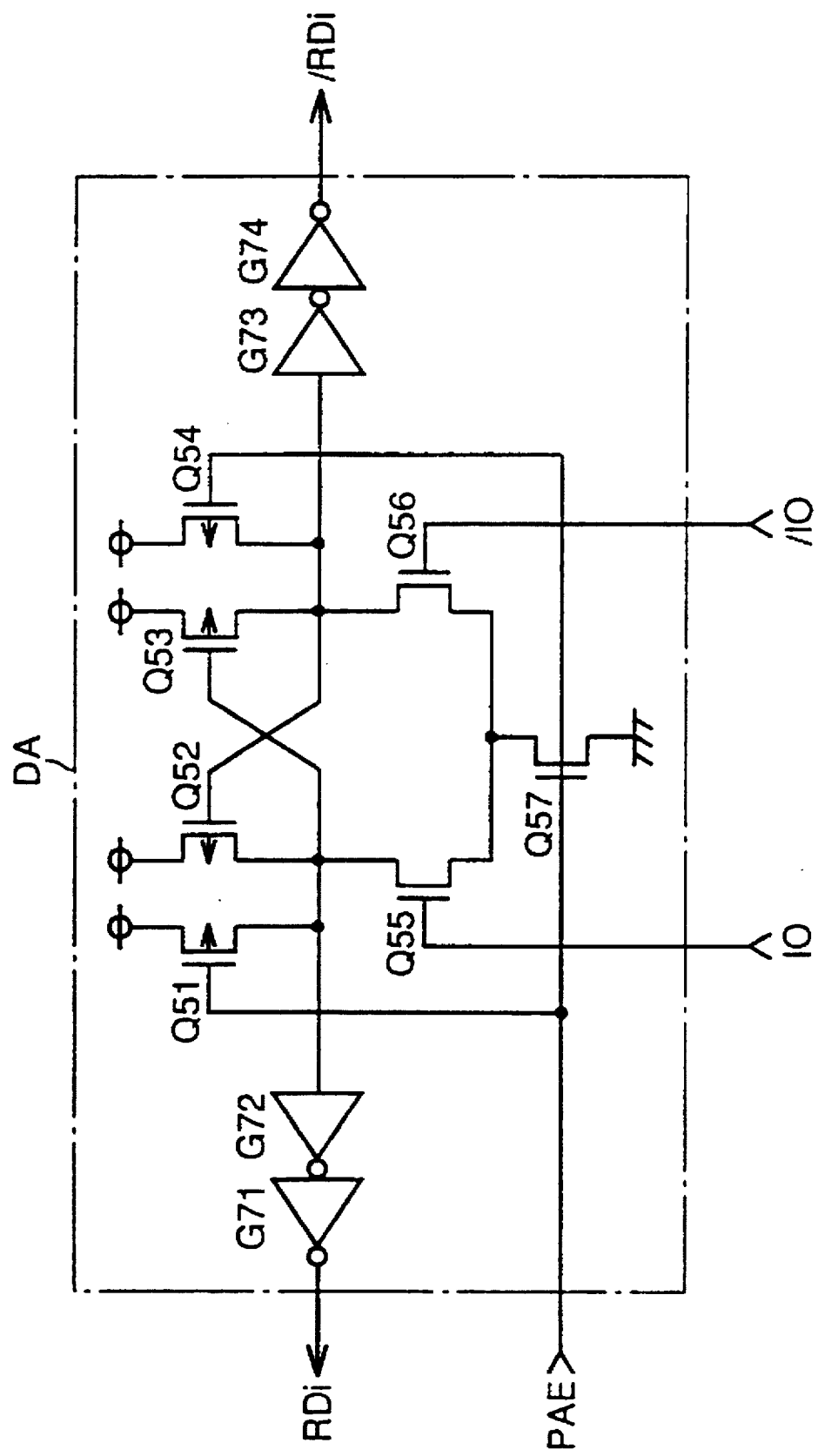
FIG. 25 is a circuit diagram showing a structure of the differential amplifier of FIG. 24.

The readout circuit and the memory cell array shown in FIG. 1 will be described with reference to FIG. 2. The readout circuit and the memory cell array of FIG. 2 differ from those shown in FIG. 24 in that delay circuits (DC) D0–D3 are added for delaying output signals of AND gates G61–G64 in readout circuit R0a. The remaining components are similar, and have the same reference characters denoted. Readout circuit R0a of FIG. 2 is prevented from operating erroneously by having output signals of AND gates G61–G64 delayed by a predetermined time period by delay circuits D0–D3.

Control circuit CC, selectors SEa–SEd, and output circuits DQa–DQd will be described in detail hereinafter.

First, control circuit CC will be described with reference to the block diagram of FIG. 3.

Figure 3:
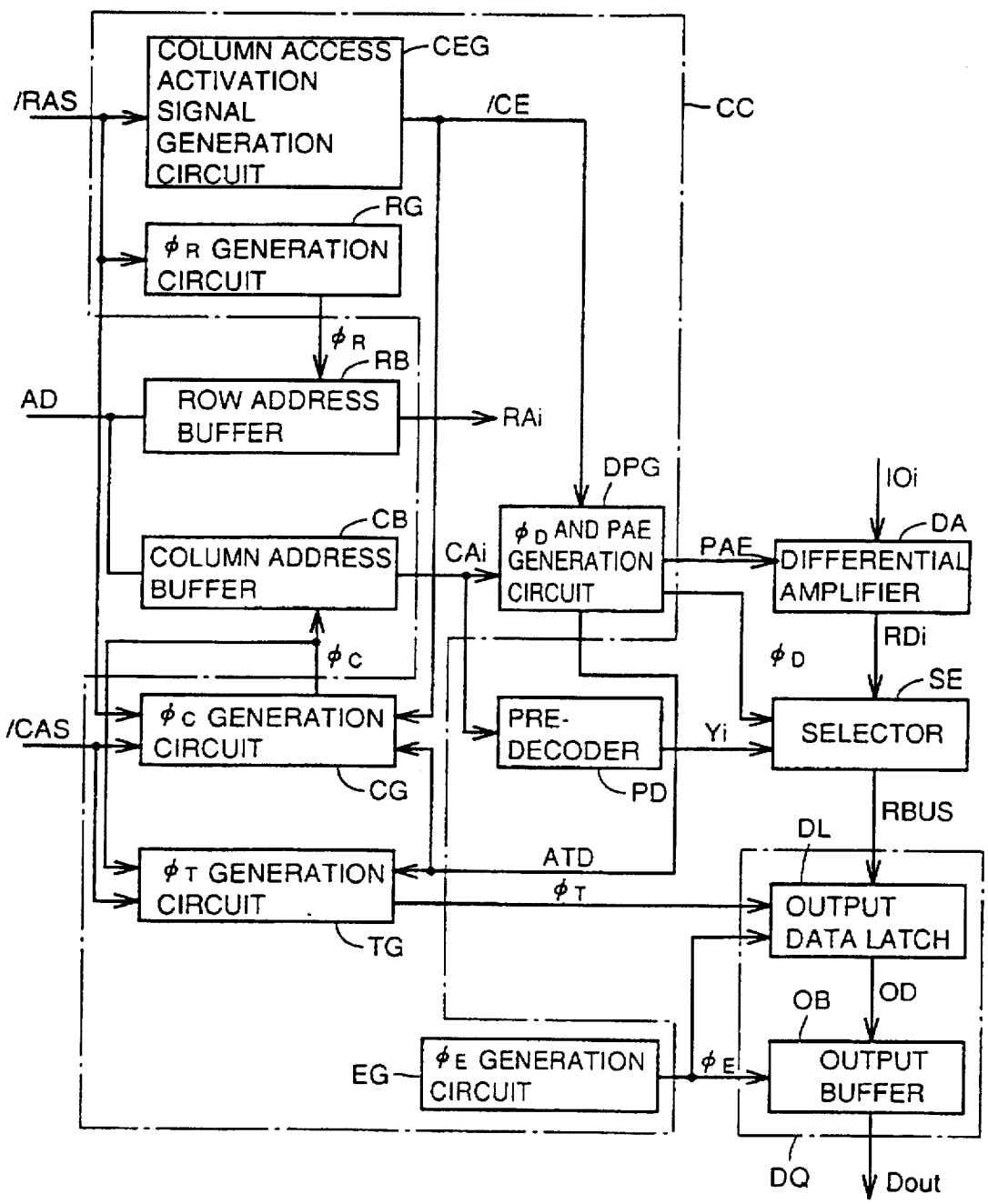
FIG. 3 is a block diagram showing a structure of the control circuit of FIG. 1.
Figure 26:
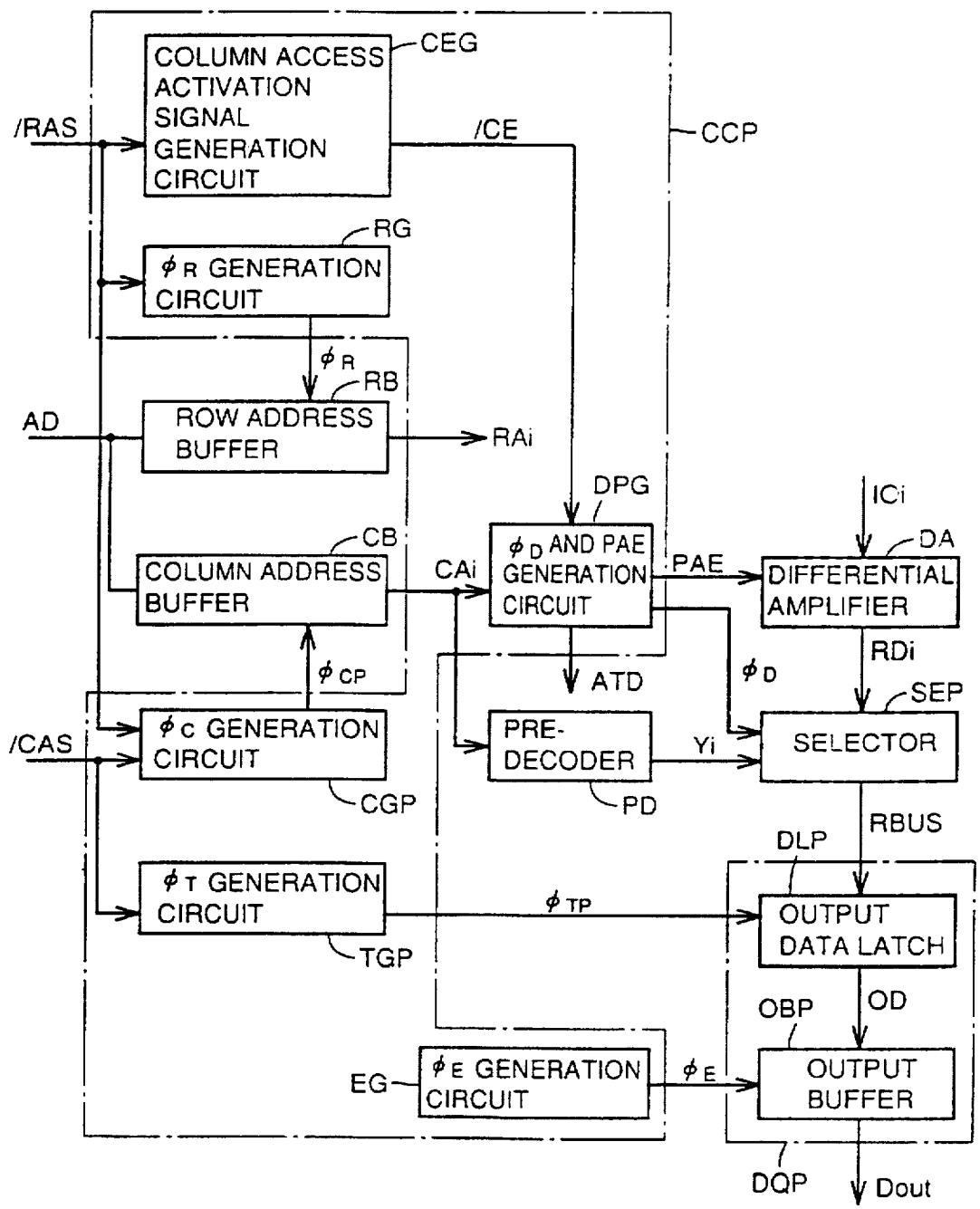
FIG. 26 is a block diagram showing a structure of the control circuit of FIG. 23.
Figure 27:
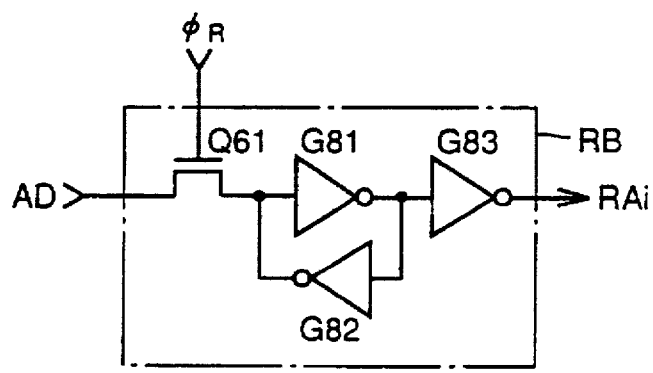
FIG. 27 is a circuit diagram showing a structure of the row address buffer of FIG. 26.
Figure 28:
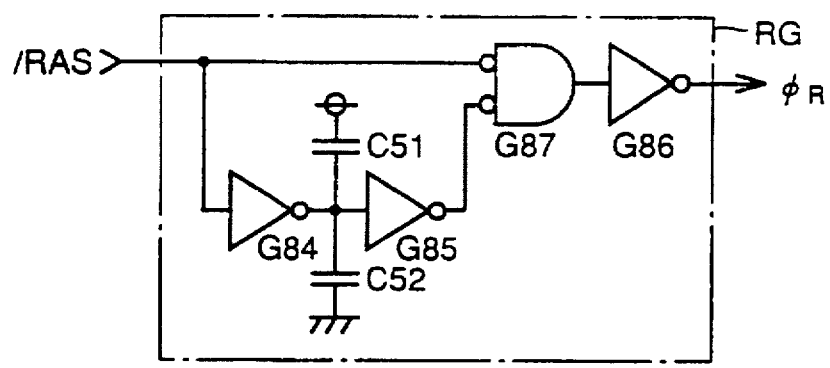
FIG. 28 is a circuit diagram showing a structure of the $\phi_R$ generation circuit of FIG. 26.
Figure 29:
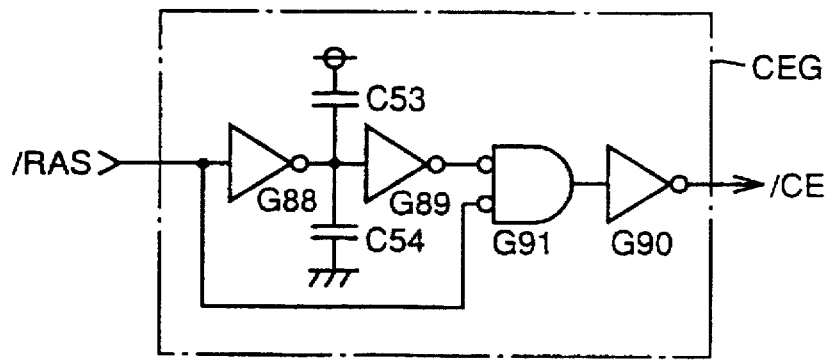
FIG. 29 is a circuit diagram showing a structure of the column access activation signal generation circuit of FIG. 26.

Referring to FIG. 3, control circuit CC includes a column access activation signal generation circuit CEG, a $\phi_R$ generation circuit RG, a $\phi_D$ and PAE generation circuit DPG, a $\phi_C$ generation circuit CG, a $\phi_T$ generation circuit TG, and a $\phi_E$ generation circuit EG. Column access activation signal generation circuit CEG, $\phi_R$ generation circuit RG, $\phi_D$ and PAE generation circuit DPG, and $\phi_E$ generation circuit EG shown in FIG. 3 have similar structures of those shown in FIG. 26, and operate in a similar manner. Therefore, their description will not be repeated.

$\phi_C$ generation circuit CG and $\phi_D$ generation circuit TG shown in FIG. 3 will be described hereinafter. Externally applied row address strobe signal /RAS, column address strobe signal /CAS, column access activation signal /CE output from a column access activation signal generation circuit, and address change detection ATD output from $\phi_D$ and PAE generation circuit DQG are applied to $\phi_C$ generation circuit CG. $\phi_C$ generation circuit CG responds to each input signal to provide a column address buffer control signal $\phi_C$ to column address buffer CB and $\phi_T$ generation circuit TG. Column address buffer CB responds to column address buffer control signal $\phi_C$ to latch an input address signal AD, whereby a column address signal CAi is provided to $\phi_D$ and PAE generation circuit DPG and predecoder PD.

Externally applied column address strobe signal /CAS, column address buffer control signal $\phi_C$ output from $\phi_C$ generation circuit CG, and address change detection signal ATD generated from $\phi_D$ and PAE generation circuit DPG are applied to $\phi_T$ generation circuit TG. $\phi_T$ generation circuit TG responds to each input signal to provide data transfer control signal $\phi_T$ to output circuit DQ.

Data select control signal $\phi_D$ from $\phi_D$ and PAE generation circuit DPG and predecode signal Yi from predecoder PD are applied to selector SE. Selector SE responds to data select control signal $\phi_D$ and predecode signal Yi to select data applied from differential amplifier DA via a readout data line RDi to provide the same to output circuit DQ.

Output circuit DQ includes an output data latch DL and an output buffer OB. Data transfer control signal $\phi_T$ from $\phi_T$ generation circuit TG and output buffer activation signal $\phi_E$ from $\phi_E$ generation circuit EG are applied to output data latch DL. In response, output data latch DL latches data input via readout data bus RBUS from selector SE to output the same to output buffer OB.

Output buffer activation signal $\phi_E$ from $\phi_E$ generation circuit EG is applied to output buffer OB. In response, output buffer OB receives an output signal OD from output data latch DL to provide an output data Dout corresponding to output signal OD.

The $\phi_C$ generation circuit of FIG. 3 will be described in detail with reference to FIG. 4.

Figure 4:
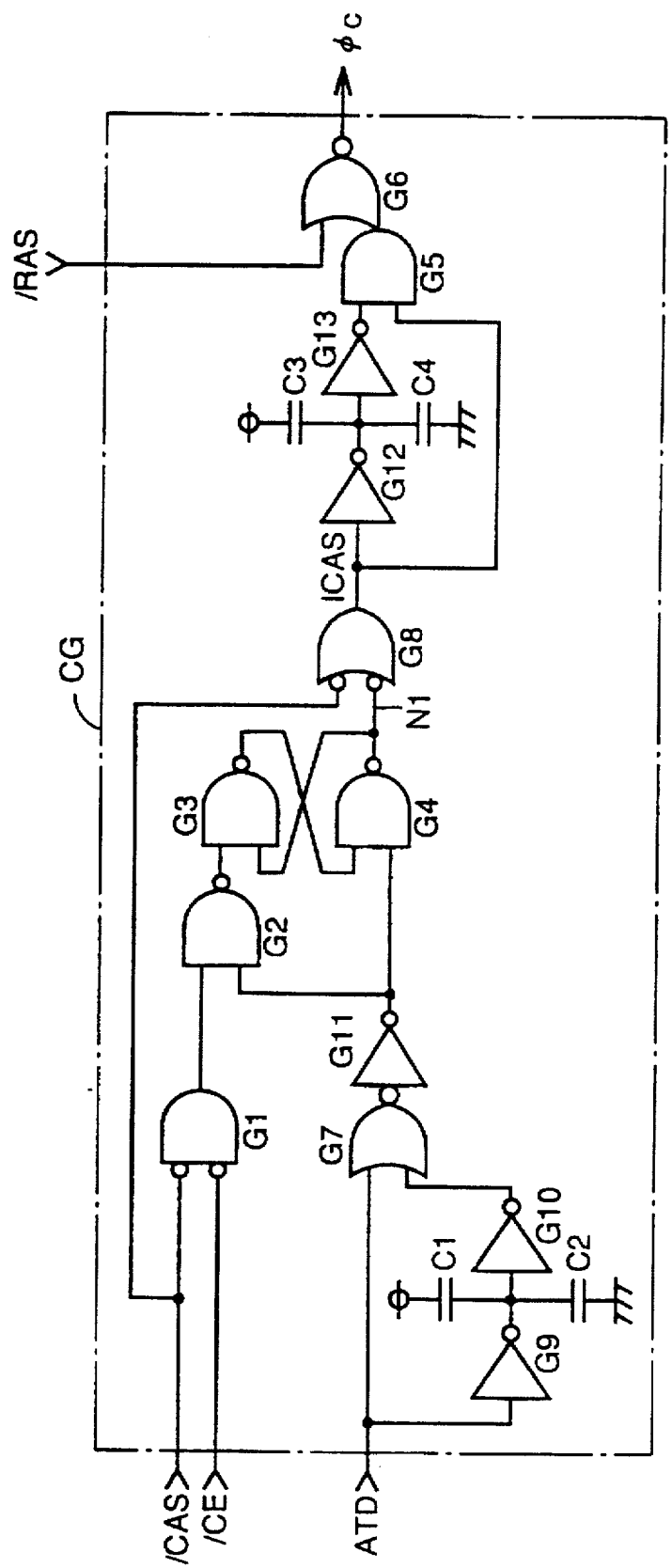
FIG. 4 is a circuit diagram showing a structure of the $\phi_C$ generation circuit of FIG. 3.

Referring to FIG. 4, $\phi_C$ generation circuit CG includes NOR gates G1, G6, G7, NAND gates G2–G4, G8, an AND gate G5, inverters G9–G13, and delay capacitors C1–C4.

Externally applied column address strobe signal /CAS and column access activation signal /CE from column access activation signal generation circuit CEG are applied to NOR gate G1. NOR gate G1 is connected to NAND gate G2. NOR gate G7 and inverter G9 receive address change detection signal ATD provided from $\phi_D$ and PAE generation circuit DPG. Inverter G9 is connected to capacitors C1 and C2 and inverter G10. Capacitor C1 has one end connected to a power supply voltage $V_{cc}$. Capacitor C2 has one end connected to a ground potential. Inverter G10 is connected to NOR gate G7. NOR gate G7 is connected to inverter G11. Inverter G11 is connected to NAND gates G2 and G4. NAND gate G2 is connected to NAND gate G3. NAND gates G3 and G4 have their input side and output side connected in a cross-manner to form a flipflop circuit. NAND gate G4 is connected to NAND gate G8. Externally applied column address strobe signal /CAS is applied to NAND gate G8. NAND gate G8 takes the NOR of a signal of node N1 and a column address strobe signal to provide internal column address strobe signal ICAS.

NAND gate G8 is connected to inverter G12 and AND gate G5. Inverter G12 is connected to capacitors C3 and C4, and inverter G13. Capacitor C3 has one end connected to power supply voltage $V_{cc}$. Capacitor C4 has one end connected to ground potential. Inverter G13 is connected to AND gate G5. AND gate G5 is connected to NOR gate G6. Externally applied row address strobe signal /RAS is applied to NOR gate G6. NOR gate G6 takes the NOR of an output signal of AND gate G5 and row address strobe signal /RAS to output a column address buffer control signal $\phi_C$.

The $\phi_T$ generation circuit of FIG. 3 will be described in detail with reference to FIG. 5.

Figure 5:
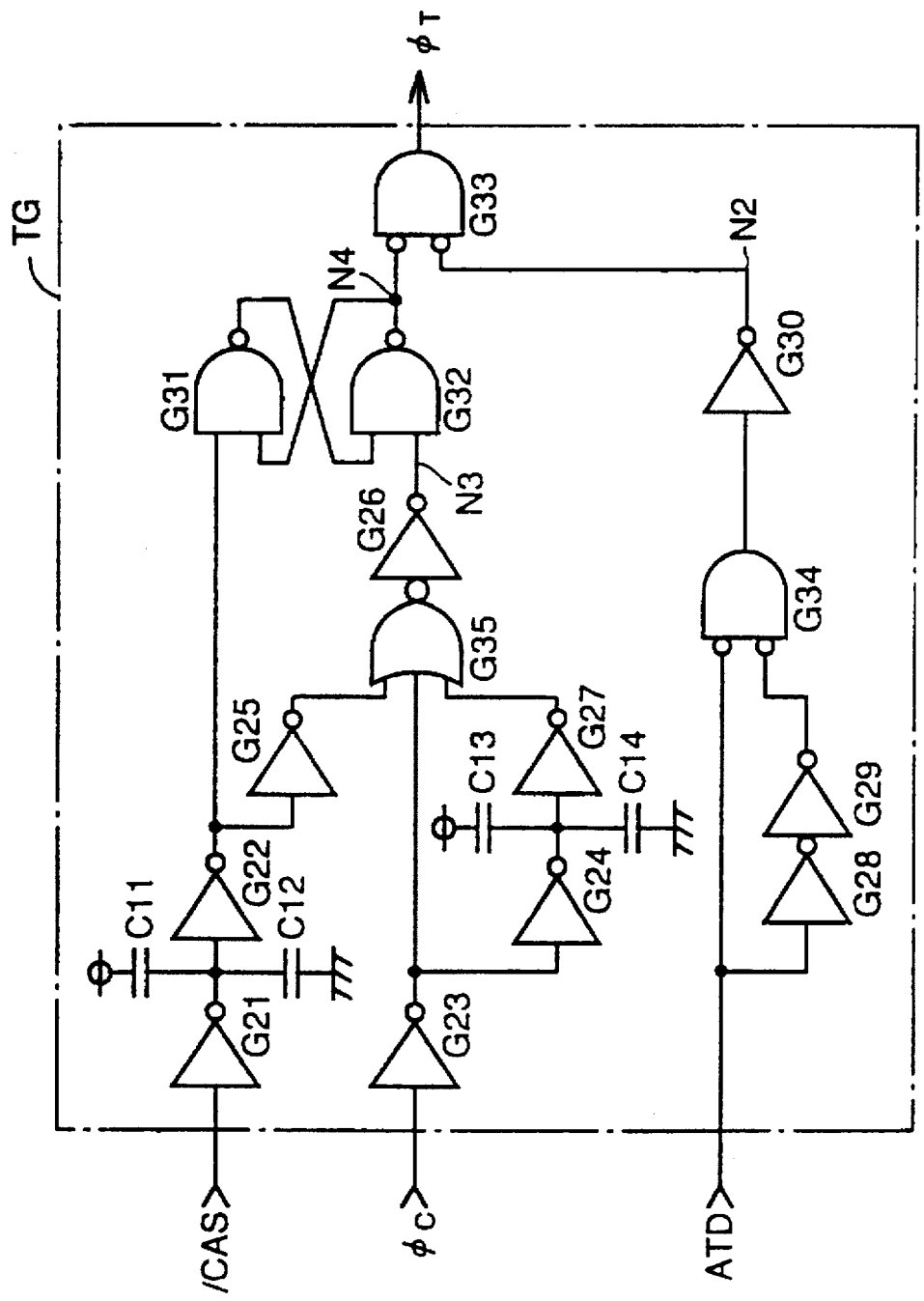
FIG. 5 is a circuit diagram showing a structure of a $\phi_T$ generation circuit of FIG. 3.

Referring to FIG. 5, $\phi_T$ generation circuit TG includes inverters G21–G30, NAND gates G31 and G32, NOR gates G33–G35, and delay capacitors C11–C14.

Column address strobe signal /CAS is applied to inverter G21. Inverter G21 is connected to capacitors C11 and C12, and inverter G22. Capacitor C11 has one end connected to power supply voltage $V_{cc}$. Capacitor C12 has one end connected to ground potential. Inverter G22 is connected to inverter G25 and NAND gate G31. Inverter G25 is connected to NOR gate G35.

A column address buffer control signal $\phi_C$ from $\phi_C$ generation circuit CG is applied to inverter G23. Inverter G23 is connected to NOR gate G35 and inverter G24. Inverter G24 is connected to capacitors C11 and C14, and to inverter G27. Capacitor C13 has one end connected to power supply voltage $V_{cc}$. Capacitor C14 has one end connected to ground potential. Inverter G27 is connected to NOR gate G35. NOR gate G35 is connected to inverter G26. Inverter G26 is connected to NAND gate G32. NAND gates G31 and G32 have their input side and output side cross-connected to form a flipflop circuit. NAND gate G32 is connected to NOR gate G33.

Address change detection signal ATD from $\phi_D$ and PAE generation circuit DPG is applied to NOR gate G34 and inverter G28. Inverter G28 is connected to inverter G29. Inverter G29 is connected to NOR gate G34. NOR gate G34 is connected to inverter G30. Inverter G30 is connected to NOR gate G33. NOR gate G33 takes an NOR of a signal of node N4 and a signal of node N2 to output a data transfer control signal $\phi_T$.

The operation of the above $\phi_C$ generation circuit and the $\phi_T$ generation circuit will be described. First, the operation in the case where address signal AD changes simultaneous to a rise of column address strobe signal /CAS will first be described with reference to the first timing chart of FIG. 6.

Figure 6:
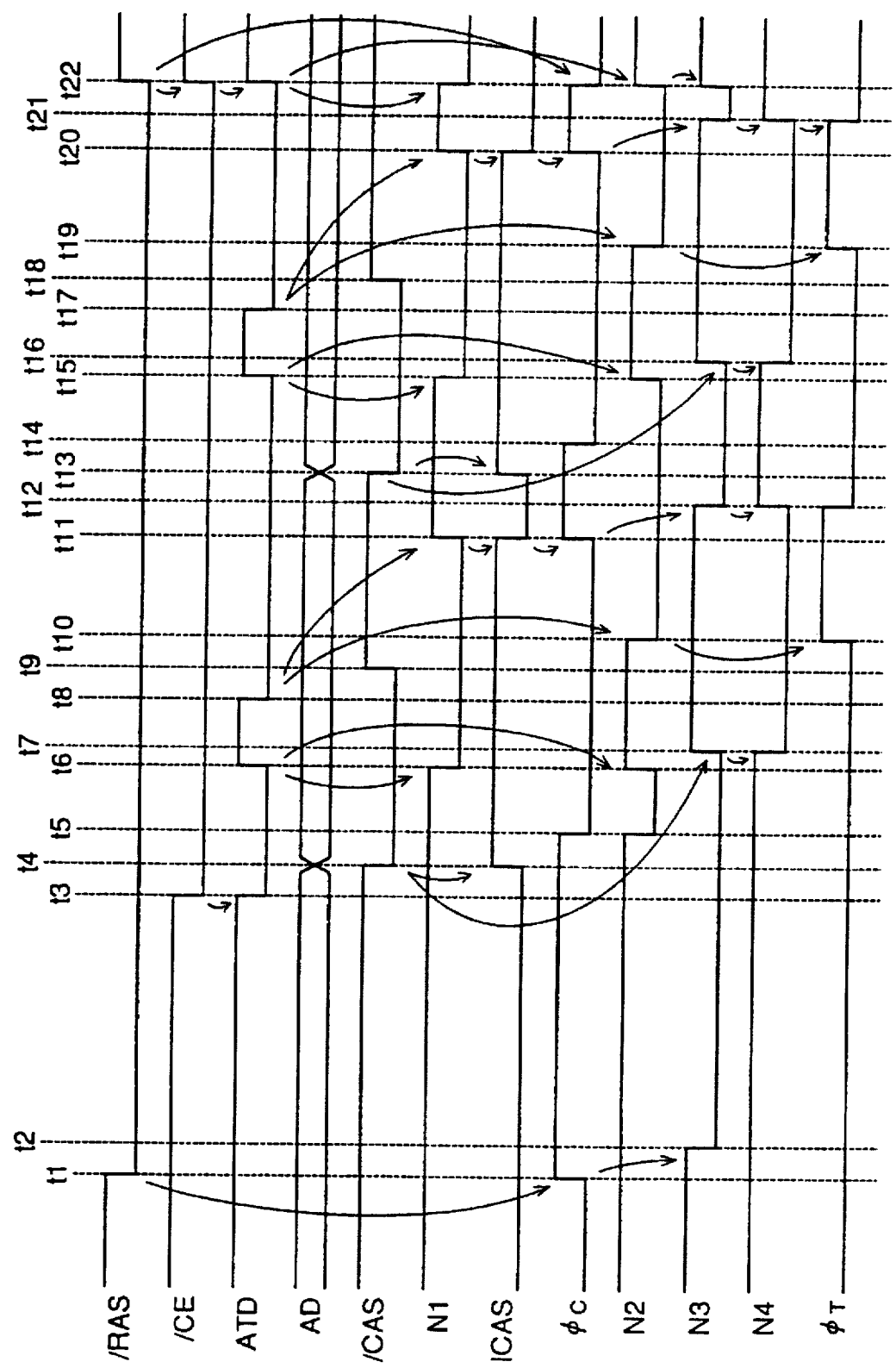
FIG. 6 is a first timing chart for describing the operation of the $\phi_C$ generation circuit and the $\phi_T$ generation circuit.

Referring to FIG. 6, when row address strobe signal /RAS attains an L level at time t1, column address buffer control signal $\phi_C$ attains an H level. At time t2, node N3 attains an L level by a delay operation of a delay circuit formed of inverters G24 and G26, and capacitors C13 and C14 shown in FIG. 5.

When column access activation signal /CE attains an L level at time t3, address change detection signal ATD is pulled down to an L level. When column address strobe signal /CAS attains an L level at time t4, address signal AD changes. Then, at time t5, column address buffer control signal $\phi_C$ attains an L level, whereby address signal AD is latched by column address buffer CB.

Corresponding to a change of address signal AD at time t4, address change detection signal ATD attains an H level at time t6. Here, node N1 of the $\phi_C$ generation circuit is pulled down to an L level. After address change detection signal ATD attains an L level at time t8, node N1 maintains an L level until time t11 when the delay time of the delay circuit formed of inverters G9 and G10 and capacitors C1 and C2 of $\phi_C$ generation circuit elapses. Therefore, internal column address strobe signal ICAS attains an L level until time t11. As a result, column address buffer control signal $\phi_C$ attains an L level until time t11 even when column address strobe signal /CAS is pulled up to an H level at time t9. Therefore, the address signal AD of time t5 will be continuously held.

Following column address strobe signal /CAS attaining an L level at time t4, at time t7 when the delay time of the delay circuit formed of inverters G21 and G22 and capacitors C11 and C12 of $\phi_T$ generation circuit elapses, node N3 attains an H level and node N4 attains an L level. After address change detection signal ATD attains an L level at time t8, node N2 attains an L level at time t10 when the delay time by inverters G28 and G29 of the $\phi_T$ generation circuit elapses. As a result, data transfer control signal $\phi_T$ attains an H level. After column address buffer control signal $\phi_C$ attains an H level at time t11, node N3 is pulled down to an L level and node N4 is pulled up to an H level at time t12. As a result, data transfer control signal $\phi_T$ attains an L level.

Since column address buffer control signal $\phi_C$ attains an H level at time t11, column address buffer CB initiates reception of address signal AD. Then, when address signal AD changes at time t13, an operation is carried out during time t13 to time t22 similar to the operation carried out during time t4 to time t13. Therefore, address signal AD in control circuit CC does not change until the data of readout data line RDi from readout data differential amplifier DA is transferred to output data latch DL via selector SE and output data bus RBUS. Therefore, erroneous operation of the semiconductor memory device can be prevented. It is possible to readout data as high speed.

The operation where address signal AD is ascertained when column address strobe signal /CAS falls down will be described with reference to the second timing chart of FIG. 7.

Figure 7:
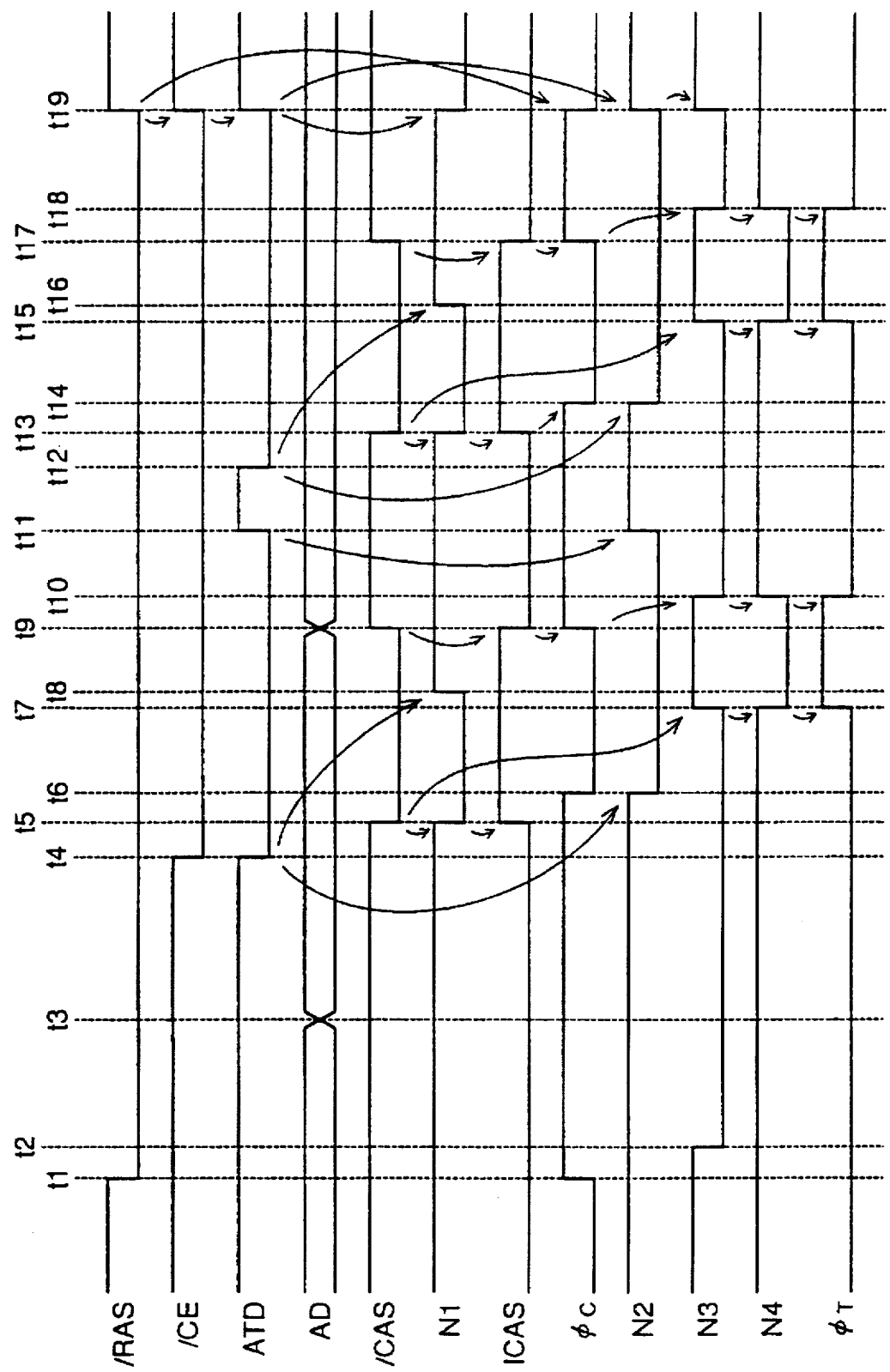
FIG. 7 is a second timing chart for describing the operation of the $\phi_C$ generation circuit and $\phi_T$ generation circuit.

Referring to FIG. 7, when row address strobe signal /RAS attains an L level at time t1, column address buffer control signal $\phi_C$ is pulled up to an H level. In response, node N3 attains a l level at time t2 at the elapse of a predetermined delay time of the delay circuit formed of inverters G24 and G26 and capacitors C13 and C14 of $\phi_T$ generation circuit TG. Then, at time t3, address signal AD is ascertained, and at time t4, column access activation signal /CE attains an L level, whereby address change detection signal ATD is pulled down to an L level. Then, when column address strobe signal /CAS attains an L level at time t5, node N1 is pulled down to an L level and internal column address strobe signal ICAS is pulled up to an H level. Here, column address buffer Control signal $\phi_C$ attains an L level, whereby column address buffer CB latches address signal AD. Since address signal AD is ascertained prior to column address strobe signal /CAS attaining an L level, column address strobe signal /CAS attains an L level even when node N1 is pulled to an H level at time t8 at the elapse of a delay time of the delay circuit formed of inverters G9 and G10 and capacitors C1 and C2 of the $\phi_C$ generation circuit after address signal detection signal ATD attains an L level at time t4. Then, at time t9, node N1 attains an H level even when column address strobe signal /CAS attains an H level, so that internal column address strobe signal ICAS attains an L level, and column address buffer control signal $\phi_C$ attains an H level. Therefore, at time t10, column address buffer CB can receive a change of address signal AD with no delay.

After address change detection signal ATD attains an L level at time t4, node N2 is pulled up to an H level at time t6 at an elapse of a delay time by inverters G28 and G29 of the $\phi_T$ generation circuit. Therefore, node N3 and node N4 attain an H level and an L level, respectively, at time t7 when the delay time of the delay circuit formed of inverters G21 and G22 and capacitors C11 and C12 of the $\phi_T$ generation circuit elapses after column address strobe signal /CAS attains an L level at time t5. As a result, data transfer control signal $\phi_T$ attains an H level from time t7. Then, in response to a change of address signal AD at time t9, address change detection signal ATD attains an H level at time t11, whereby node N2 attains an H level. The operation from time t13 to time t18 is similar to that from time t5 to time t10.

According to the above operation, column address buffer CB can receive a change of address signal AD with no delay even when address signal AD is applied when column address strobe signal /CAS is pulled to an H level. Therefore, the semiconductor memory device can realize high speed data readout operation without delay in the access time.

The selector of FIG. 3 will be described in detail with reference to FIG. 8.

Figure 8:
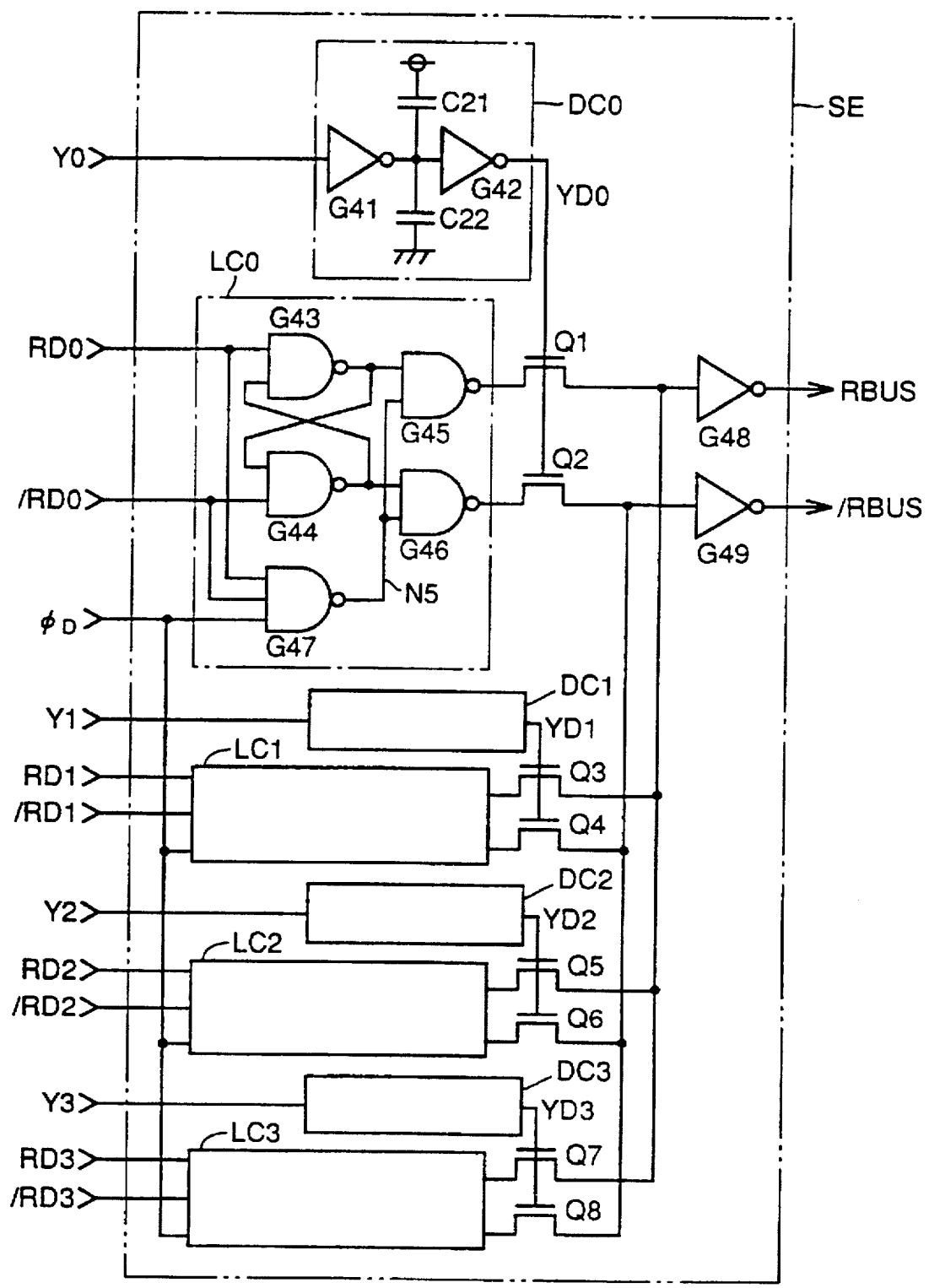
FIG. 8 shows a structure of the selector of FIG. 3.

Referring to FIG. 8, selector SE includes delay circuits DC0–DC3, latch circuits LC0–LC3, transistors Q1–Q8 which are N type MOSFETs, and inverters G48, G49. In FIG. 8, latch circuit LC0 and other latch circuits LC1–LC3 have a similar structure. Therefore, the internal illustration of latch circuits LC1–LC3 is omitted. Furthermore, delay circuit DC0 has a structure similar to those of other delay circuit DC1–DC3, so that internal illustration of delay circuits DC1–DC3 is omitted.

Delay circuit DC0 includes inverters G41, G42, and delay capacitors C21 and C22. Predecode signal Y0 is applied to inverter G41. Inverter G41 is connected to capacitors C21 and C22, and inverter G42. Capacitor C21 has one end connected to power supply voltage $V_{cc}$. Capacitor C22 has one end connected to ground potential. Inverter G42 is connected to the gates of transistors Q1 and Q2. Delay circuit DC0 provides a delayed predecode signal YD0 which is an input predecode signal Y0 delayed for a predetermined time period to the gates of transistors Q1 and Q2.

Latch circuit LC0 includes NAND gates G43–G46. Data of readout data line RD0 is applied to NAND gate G43. Data of readout data line /RD0 complementary to readout data line RD0 is applied to NAND gate G44. NAND gates G43 and G44 have their output side and input side cross-connected to form a flipflop circuit. NAND gate G43 is connected to NAND gate G45. NAND gate G44 is connected to NAND gate G46. Data of readout data lines RD0 and /RD0 and data select control signal $\phi_D$ are applied to NAND gate G47. NAND gate G47 is connected to NAND gates G45 and G46. NAND gate G45 is connected to inverter G48 via transistor Q1. Inverter G48 provides data to readout data bus RBUS. NAND gate G46 is connected to inverter G49 via transistor Q2. Inverter G49 provides data to readout data bus /RBUS. The other delay circuits RD1–RD3 and other latch circuits LC1–LC3 have similar structures.

According to the above structure, selector SE responds to data select control signal $\phi_D$ to have data of readout data lines RD0–RD3, /RD0–/RD3 latched by latch circuits LC0–lC3, whereby data is selected according to delayed predecode signals YD0–YD3 which are predecode signals Y0–Y3 delayed by delay circuits DC–DC3. The selected data is output to readout data buses RBUS and /RBUS via inverters G48 and G49, respectively. T he output data latch and the output buffer of FIG. 3 will be described in detail with reference to FIG. 9.

Figure 9:
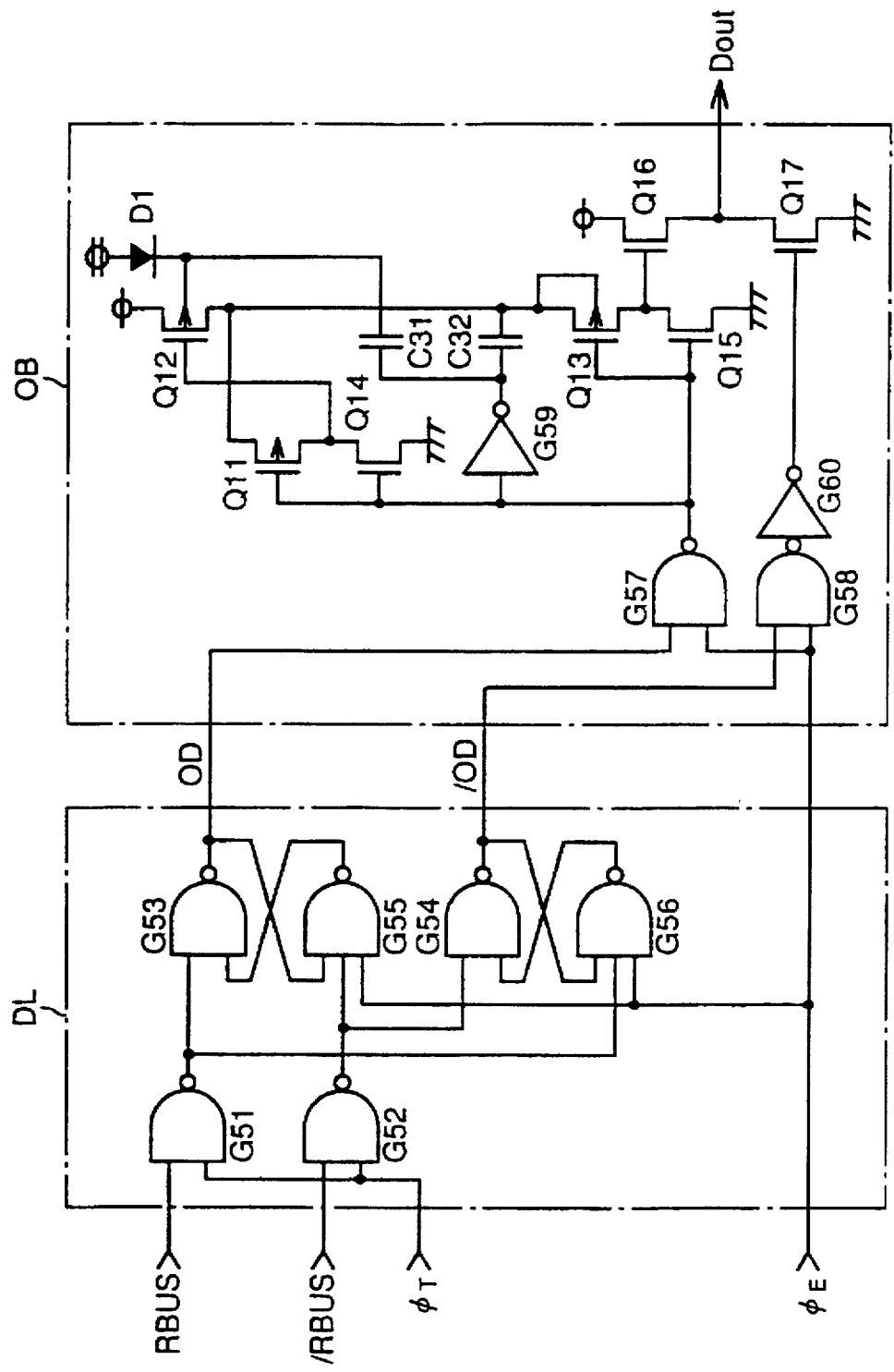
FIG. 9 is a circuit diagram showing a structure of the output data latch and the output buffer of FIG. 3.

Referring to FIG. 9, output data latch DL includes NAND gates G51–G56. Data of readout data bus RBUS and data transfer control signal $\phi_T$ is applied to NAND gate G51. NAND gate G51 is connected to NAND gates G53 and G56. The data of readout data bus /RBUS complementary to readout data bus RBUS and data transfer control signal $\phi_T$ are applied to NAND gate G52. NAND gate G52 is connected to NAND gates G55 and G54. Output buffer activation signal $\phi_E$ is supplied to NAND gates G55 and G56. NAND gates G53 and G55 have their input side and output side cross-connected to form a flipflop circuit. NAND gate G53 provides output signal OD to output buffer OB. Similarly, NAND gates G54 and G56 form a flipflop circuit. NAND gate G54 provides an output signal /OD complementary to output signal OD to output buffer OB.

Next, output buffer OB will be described. Referring to FIG. 9, output buffer OB includes NAND gates G57, G58, inverters G59, G60, transistors Q11–Q13 which are P type MOSFETs, transistors Q14–Q17 which are N type MOSFETs, capacitors C31, C32, and a diode D1.

Output signal OD and output buffer activation signal $\phi_E$ are applied to NAND gate G57. NAND gate G57 is connected to each gate of transistors Q11, Q13–Q15, and to inverter G60. Transistor Q11 is connected to the gate and drain of transistor Q12, and to transistor Q14. Transistor Q14 is connected to a ground potential. Transistor Q12 has its source connected to power supply voltage $V_{cc}$, and its drain connected to capacitor C32 and transistor Q13. Inverter G59 is connected to capacitors C32 and C31. Diode D1 is connected to an internal high voltage $V_{pp}$ having power supply voltage $V_{cc}$ boosted by a charge pump circuit (not shown) of FIG. 2 in Japanese Patent Laying-Open No. 3-86995 ($V_{pp}=V_{cc}+V_{th}+\alpha$, where $V_{th}$ is the transistor threshold voltage, $\alpha$ a predetermined voltage, for example, $V_{pp}=$ 4.8 V, $V_{cc}=3.3$ V, and $V_{th}=0.8$ V), the back gate of transistor Q12, and capacitor C31. Transistor Q13 is connected to the gate of transistor Q16 and to transistor Q16. The back gate of transistor Q13 is connected to capacitor C32. Transistor Q15 is connected to a ground potential.

Output signal /OD and output buffer activation signal $\phi_E$ is applied to NAND gate G58. NAND gate G58 is connected to inverter G59. Inverter G59 is connected to the gate of transistor Q17. Transistor Q17 is connected to transistor Q16 and a ground potential. Transistor Q16 is connected to a power supply voltage $V_{cc}$. The gate of transistor Q16 is connected to the node of transistors Q13 and Q15. Output data Dout is provided from the node of transistors Q16 and Q17.

The operation of the above output buffer will be described hereinafter. When output signal OD attains an L level, P type MOSFET Q12 formed within an N well on a P type semiconductor substrate is rendered conductive, whereby capacitor C32 is charged to the level of power supply voltage $V_{CC}$. Also, capacitor C31 is connected to internal high voltage $V_{pp}$ generated by a charge pump circuit shown in FIG. 2 of Japanese Patent Laying-Open No. 3-86995, for example, via diode D1, so as to be charged to the level of $V_{pp}-V_{be}$ ($V_{be}$ is the diode threshold voltage, for example, $V_{be}=0.8$ V). As a result, when output signal OD attains an H level, the gate potential of transistor Q16 is boosted to the level of $2V_{cc}$, and the back gate potential of transistor Q12 is boosted to the level of $V_{pp}-V_{be}+V_{cc}$. More specifically, the back gate potential of transistor Q12 attains the level of $2V_{cc}$ provided that $V_{th}=V_{be}$. As a result, the gate potential of transistor Q16 attains the level of $2V_{cc}$ which is higher than the boost level of $2V_{cc}-V_{th}$ of a conventional output buffer. Accordingly, the conductivity of transistor Q16 is increased, so that transistor Q16 operates speedily. Therefore, output buffer OB operates at high speed, and high speed data readout operation can be carried out.

The drain potential of transistor Q12 changes from the level of $V_{cc}$ to $2V_{cc}$, and the back gate potential changes between the level of $V_{pp}-V_{be}$ and $V_{pp}-V_{be}+V_{cc}$. Since the drain potential of transistor Q12 will not become higher than the back gate potential, consumption of wasteful current from a power supply terminal $V_{cc}$ to the substrate caused by a PNP transistor rendered conductive formed of a P type diffusion layer of the drain electrode of transistor Q12, an N well serving as back gate of transistor Q12, and a P type substrate is prevented. Therefore, reduction in the power consumption of a semiconductor memory device can be realized.

Another specific example of an output buffer will be described with reference to the circuit diagram of FIG. 10.

Figure 10:
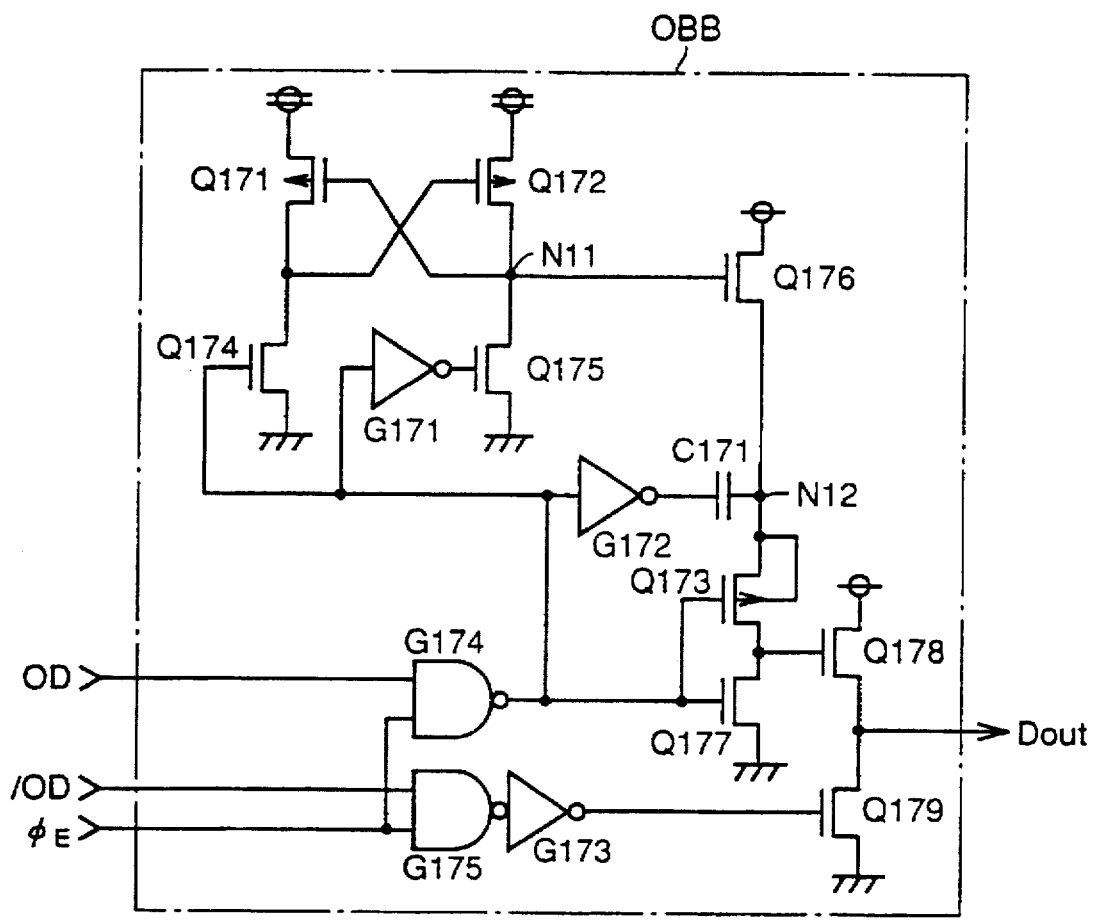
FIG. 10 is a circuit diagram showing a structure of a specific example of the output buffer of FIG. 3.

Referring to FIG. 10, an output buffer OBB includes transistors Q171–Q173 which are P type MOSFETs, transistors Q174–Q179 which are N type MOSFETs, inverters G171–G173, NAND gates G174, G175, and a capacitor C171.

Transistors Q171, Q172, Q174, Q715 and inverter G171 form a level conversion circuit. The level conversion circuit responds to an output signal of NAND gate G174 to provide a signal of an internal high voltage $V_{pp}$ level from a node N11, which is provided to the gate of transistor Q176. Transistor Q176 is connected to power supply voltage $V_{cc}$, capacitor C171, and transistor Q173. Transistor Q176 is rendered conductive when its gate receives a signal of an internal high voltage $V_{pp}$ level to precharge capacitor C171 to the level of power supply voltage $V_{cc}$. NAND gates G174, G175, inverters G172, G173, and transistors Q173, Q177–Q179 are connected in a manner similar to that of the output buffer OB of FIG. 9. The operation is also similar.

The operation of output buffer OBB of the above structure will be described hereinafter. When output signal OD attains an L level, NAND gate G174 provides an output signal of an H level. Therefore, transistor Q174 is rendered conductive, and the gate potential of transistor Q172 is pulled down to an L level. Therefore, transistor Q172 conducts. This causes the potential of node N11 to attain a level of internal high voltage $V_{pp}$. Since internal high voltage $V_{pp}$ is set to $V_{cc}+V_{th}+\alpha$, node N2 is charged to the level of power supply voltage $V_{cc}$.

When output signal OD attains an H level and output buffer activation signal $\phi_E$ attains an H level, output signal of NAND gate G174 is pulled down to an L level. Therefore, transistor Q175 conducts, whereby the potential of node N11 is pulled down to an L level. As a result, transistor Q176 is rendered non-conductive, whereby node N12 is boosted by capacitor C171 to the level of $2V_{cc}$. According to the above-described operation, the gate voltage of transistor Q178 attains a high level, so that output buffer OBB of FIG. 10 can operate at high speed similar to output buffer OB of FIG. 9. Therefore, output buffer OBB operates at high speed, so that high speed data readout operation is possible.

The operation of a semiconductor memory device of the above structure will be described hereinafter with reference to a first timing chart of FIG. 11.

Figure 11:
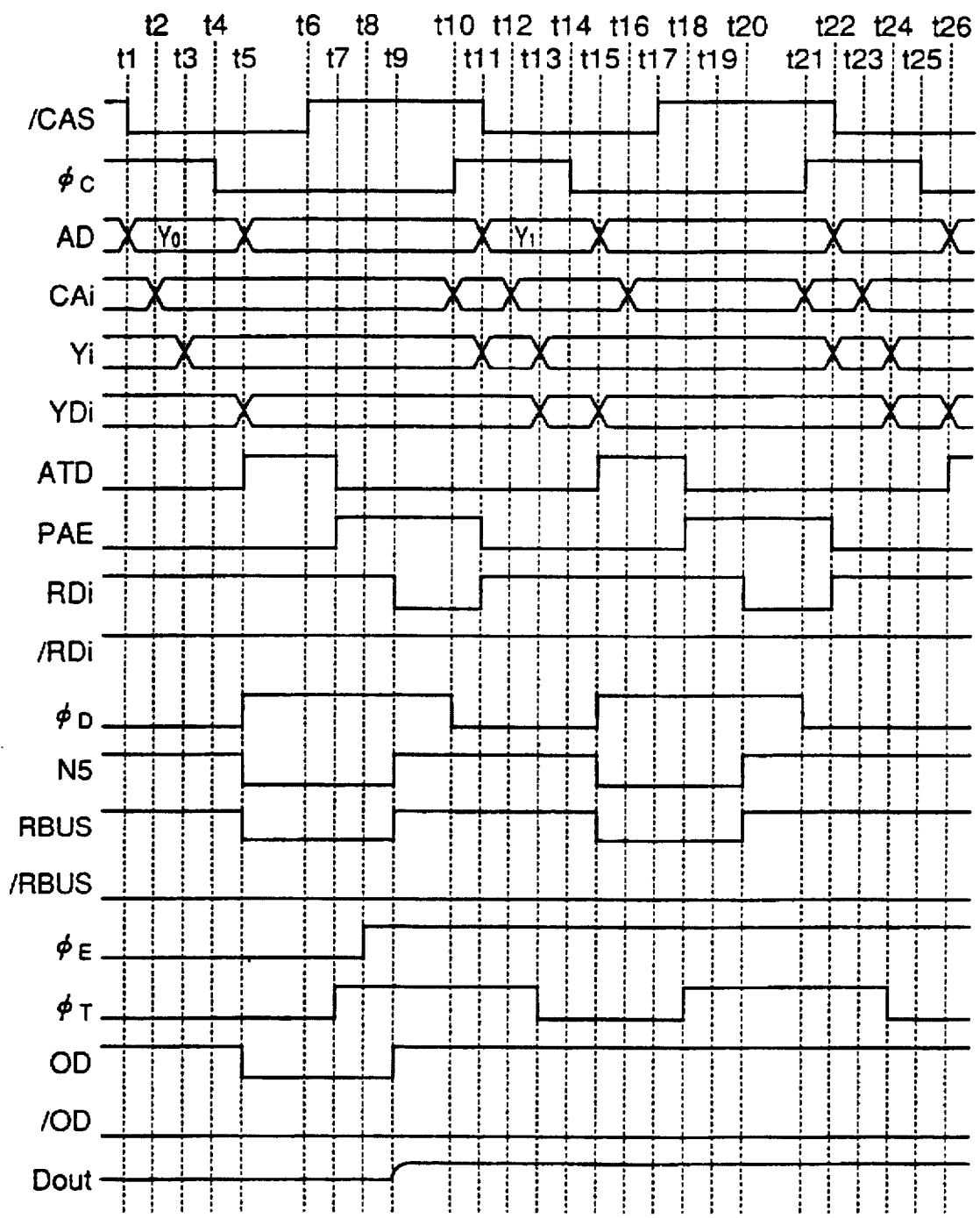
FIGS. 11 and 12 are first and second timing charts for describing the operation of the semiconductor memory device of FIG. 1.

Referring to FIG. 11, after address signal AD changes at time t1, column address signal CAi changes at time t2. At time t3, predecode signal Yi changes. At time t4, column address buffer control signal $\phi_C$ attains an L level, whereby column address buffer CB latches address signal AD. At time t5, data select control signal $\phi_D$ attains an H level, and node N5 of latch circuit LC0 of FIG. 8 attains an L level. This causes the output signal of latch circuit LC0 to be pulled up to an H level, whereby data of readout data buses RBUS, /RBUS attain an L level. When address change detection signal ATD attain an L level at time t7, differential amplifier activation signal PAE attains an H level. At time t9, data of an L level is provided from differential amplifier DA to output data line RDi. Here, data of readout data bus RBUS attains an H level when data of an H level is read out.

After time t7 where address change detection signal ATD attains an L level, column address buffer control signal $\phi_C$ maintains an L level until an elapse of a predetermined time period at time t10. Therefore, address signal AD is latched in column address buffer CB even when column address strobe signal /CAS attains an H level at time t6. At time t10, column address buffer control signal $\phi_C$ attains an H level, whereby a change of address signal AD is received. However, since delayed predecode signal YDi controlling selector SE of FIG. 8 has the change delayed by the delay time of delay circuits DC0–DC3, data transfer control signal $\phi_T$ attains an L level at time t13. As a result, delayed predecode signal YDi does not change until output data latch DL latches data. Therefore, the data transferred from selector SE to readout data buses RBUS, /RBUS does not change. No erroneous operation occurs even when the time period of column address strobe signal /CAS attaining an L level is shortened. Thus, high speed data readout operation can be realized.

At time t5, data of readout data buses RBUS, /RBUS attain an L level. Therefore, output signals OD, /OD of output data latch DL attain an L level when output buffer activation signal $\phi_E$ attains an L level. In contrast, since data transfer control signal $\phi_T$ is already pulled up to an H level at time t7, output signal OD of output data latch DL attains an H level when the data of readout data bus RBUS is pulled up to an H level. Therefore, output buffer OB provides output data Dout at an H level.

When the next address signal Y1 is applied at time t11 and data of an H level is to be read out, an operation similar to that starting from time t1 is carried out. Eventually, the data of readout data bus RBUS attains an L level at time t15. Here, output signals of NAND gates G51 and G52 of output data latch DL attain an H level, and output buffer activation signal $\phi_E$ attains an H level. Therefore, output signal OD of output data latch DL remains at an H level, and output signal /OD remains at an L level. Therefore, output signals OD, /OD of output data latch DL do not attain an L level even when data transfer control signal $\phi_T$ is pulled up to an H level at time t7 prior to time t9 where data read out to read out data bus RBUS is transferred. As a result, the output level of output buffer OB is not reduced in outputting data of an H level continuously, and the access time is not delayed. Thus, high speed data readout operation can be carried out.

The operation of a semiconductor memory device in which a short noise is introduced in address signal AD will be described with reference to a second timing chart of FIG. 12.

Figure 12:
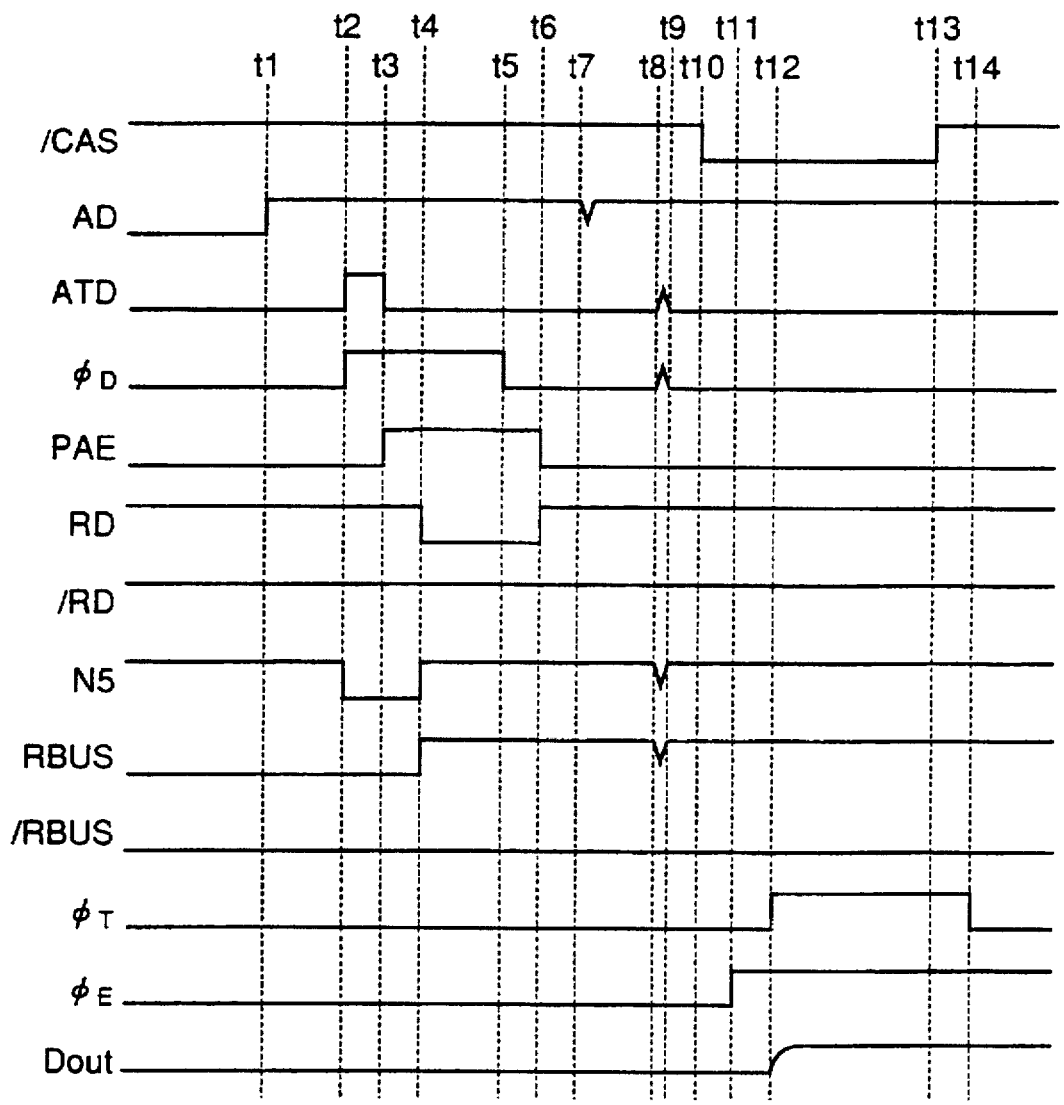

Referring to FIG. 12, after address signal AD is applied at time t1, address change detection signal ATD attains an H level and data select control signal $\phi_D$ attains an H level at time t2. When address change detection signal ATD attains an L level at time t3, differential amplifier activation signal PAE is pulled up to an H level. Then, at time t4, the data of readout data line RD is pulled up to an L level. However, since data select control signal $\phi_D$ attains an H level, the data read out to readout data bus RBUS is transferred.

Figure 33:
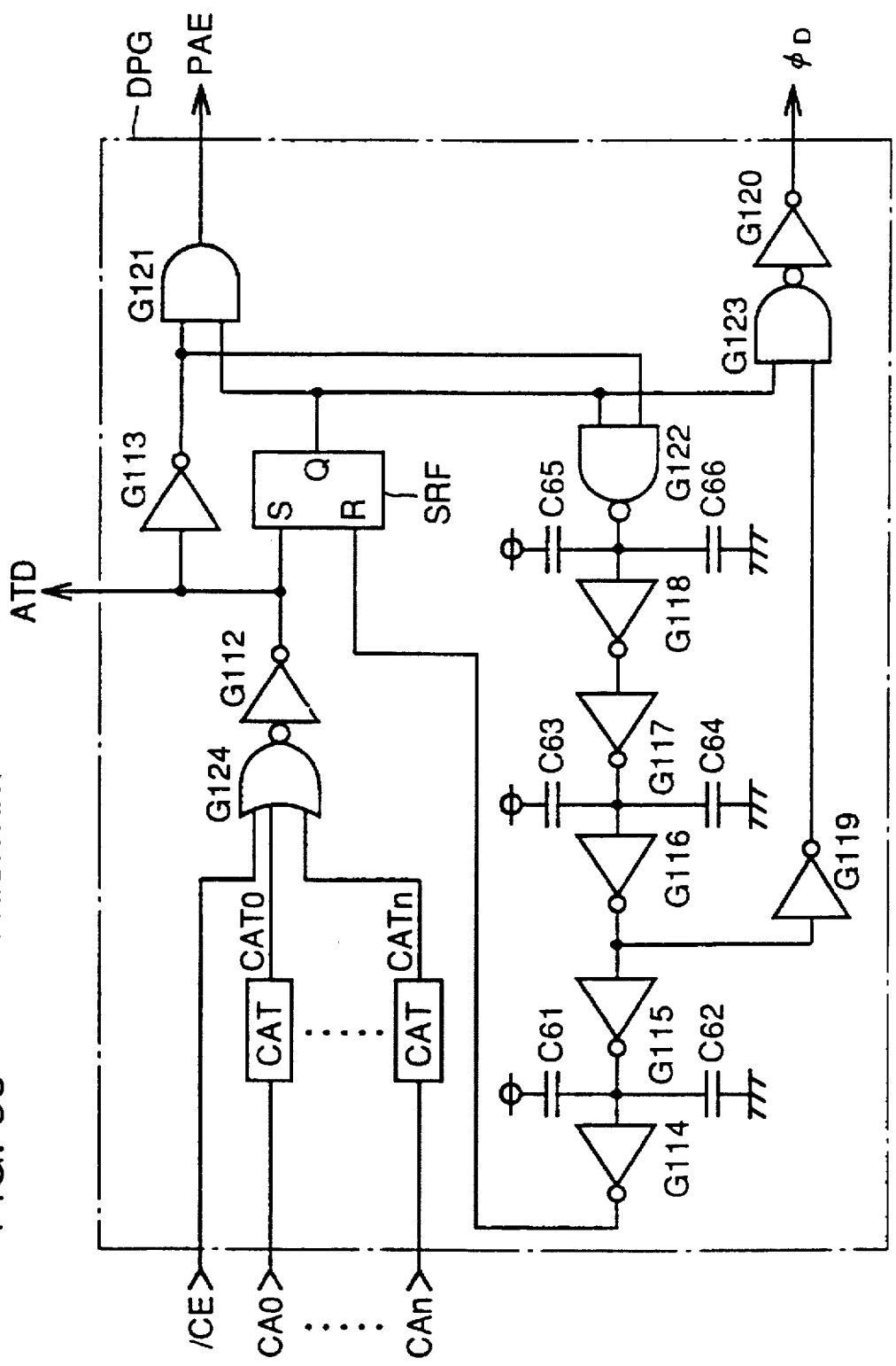
FIG. 33 is a circuit diagram showing a structure of the $\phi_D$ and PAE generation circuit of FIG. 26.
Figure 34:
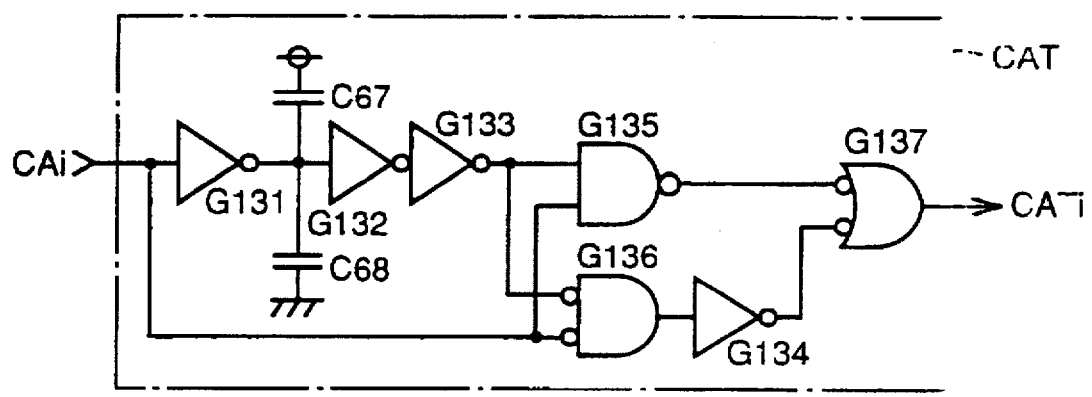
FIG. 34 is a circuit diagram showing a structure of the column address change detection circuit of FIG. 33.
Figure 35:
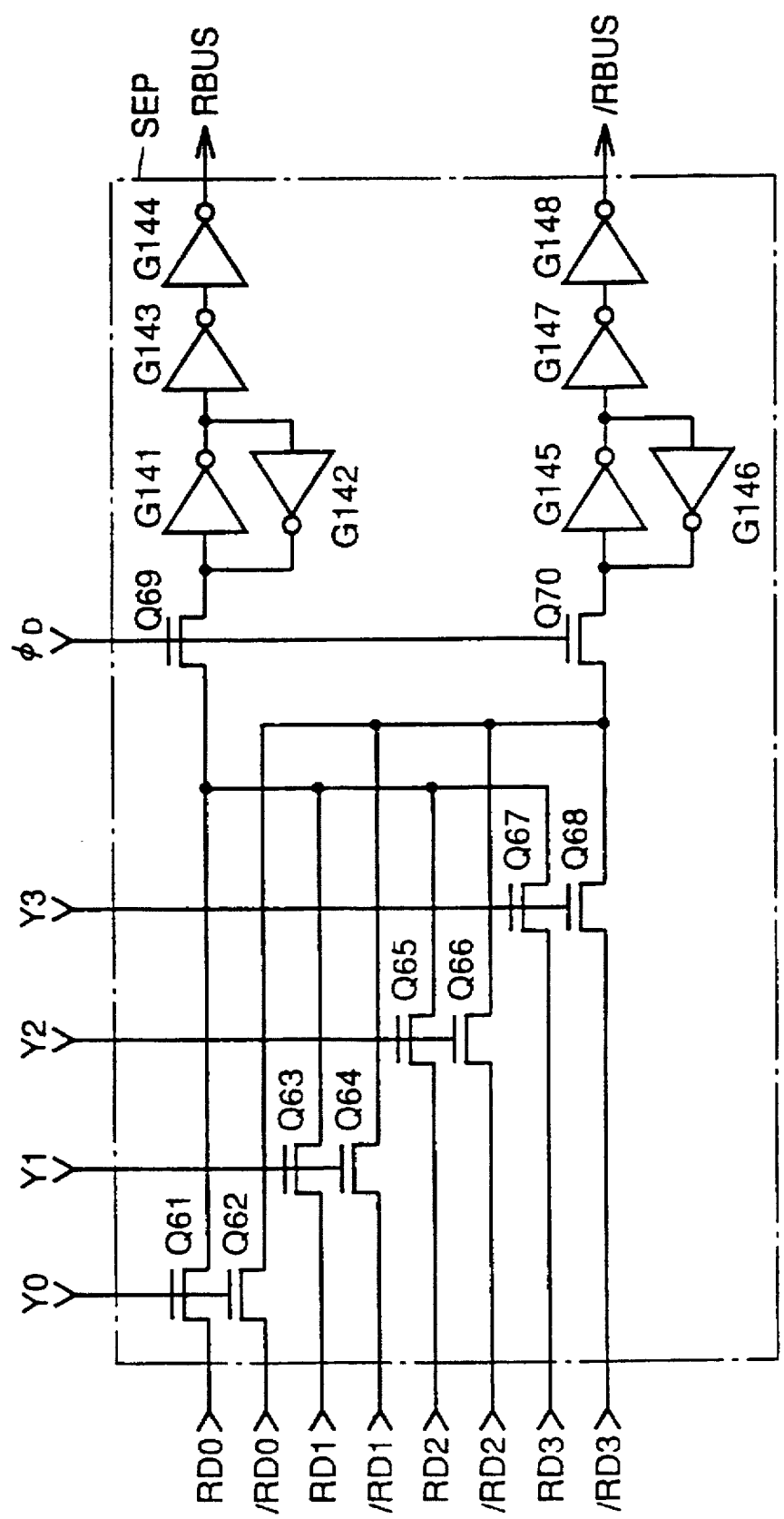
FIG. 35 is a circuit diagram showing a structure of the selector of FIG. 26.
Figure 36:
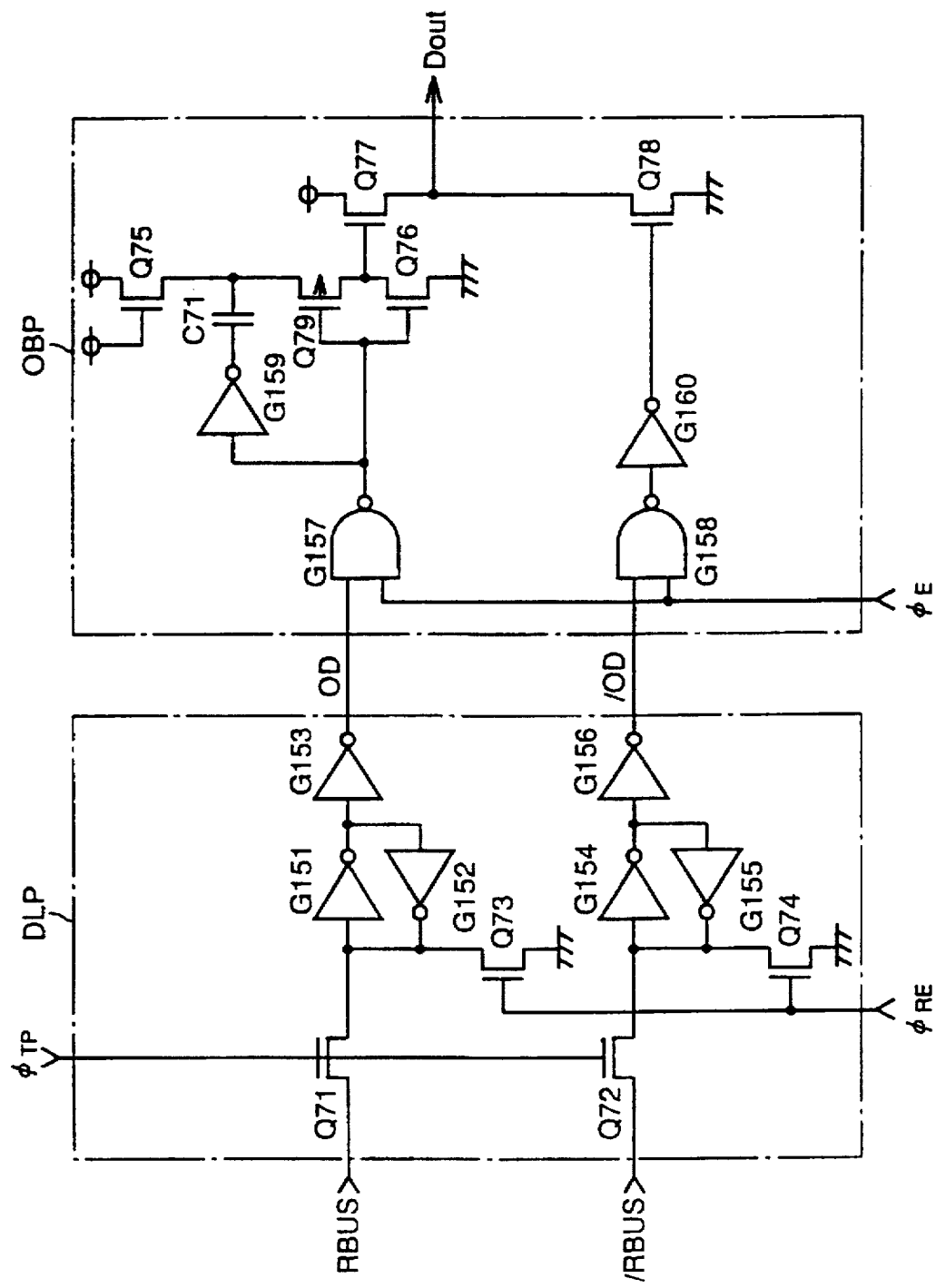
FIG. 36 is a circuit diagram showing a structure of the output data latch and the output buffer of FIG. 26.
Figure 37:
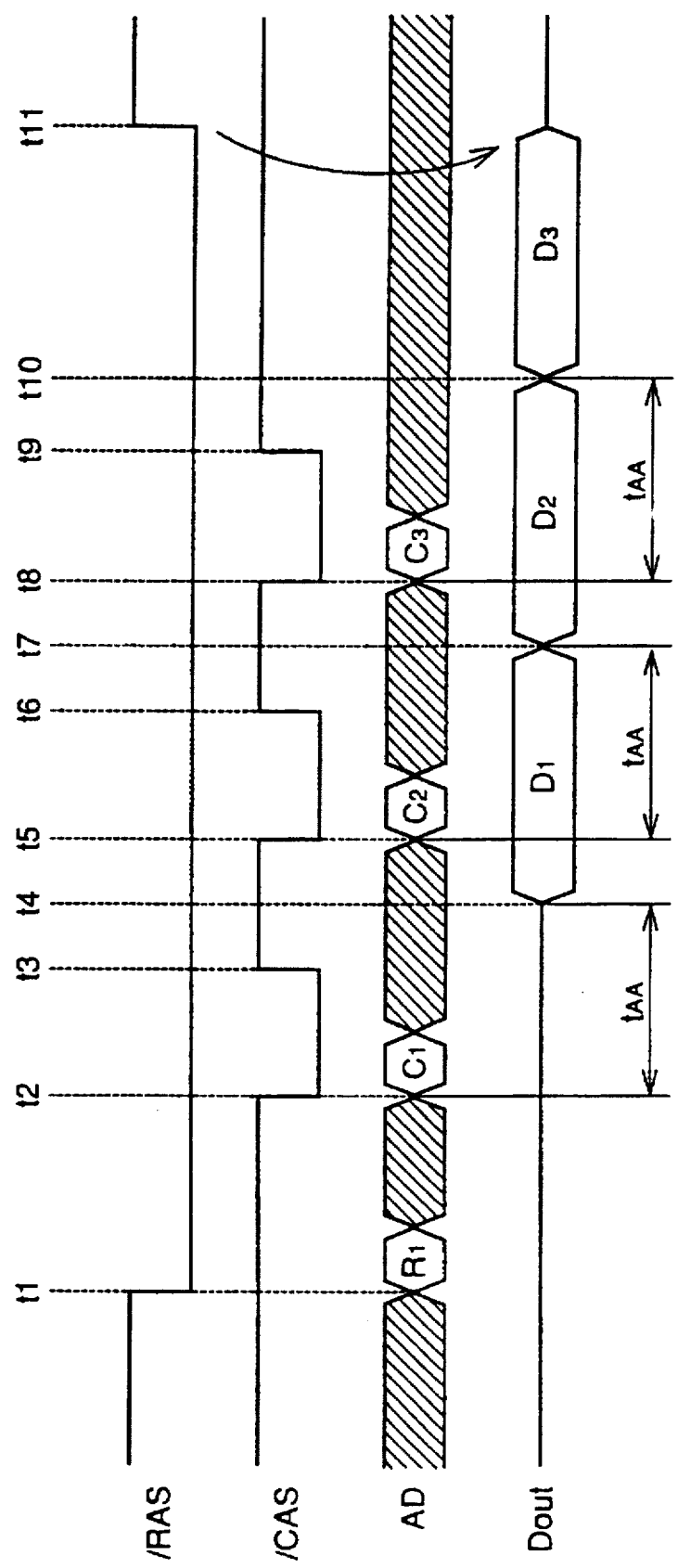
FIGS. 37 and 38 are first and second timing charts for describing the operation of the semiconductor memory device of FIG. 23, respectively.
Figure 38:
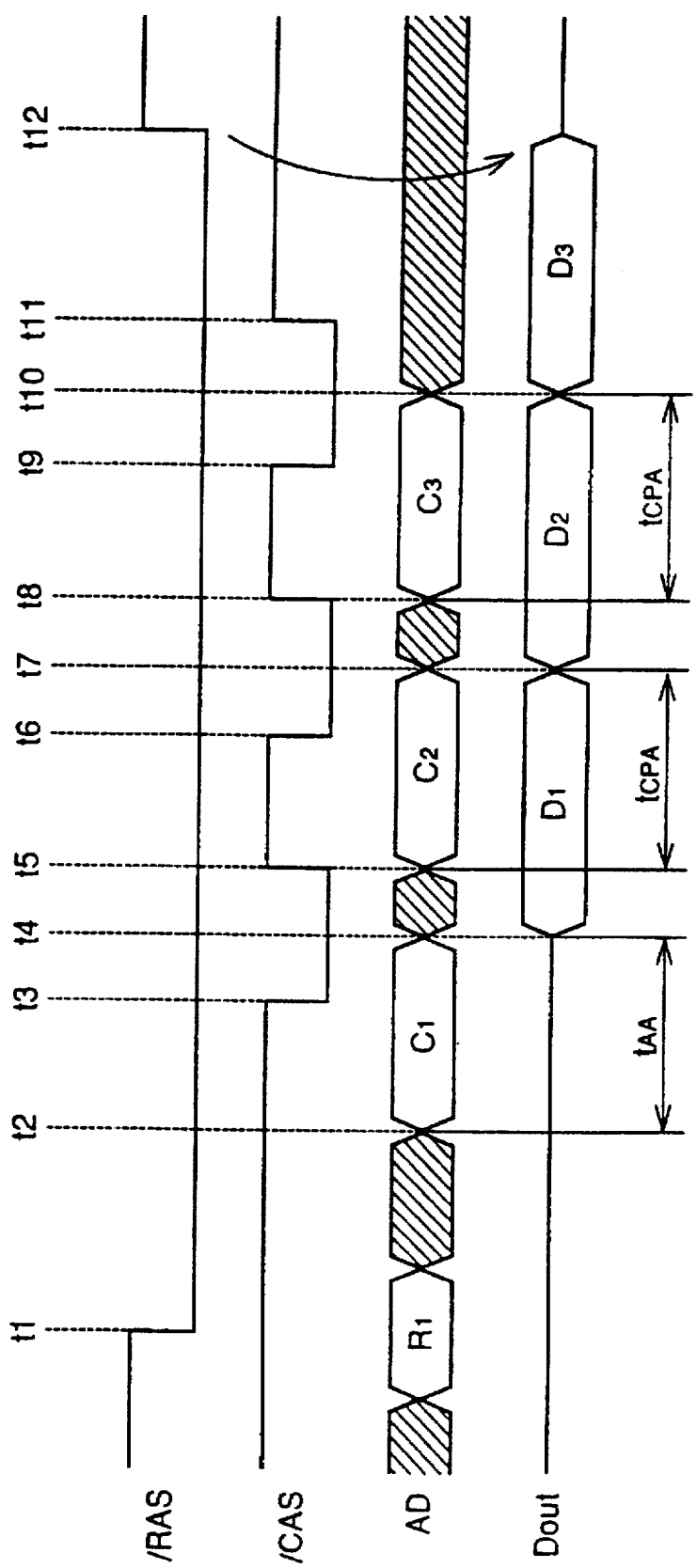
Figure 39:
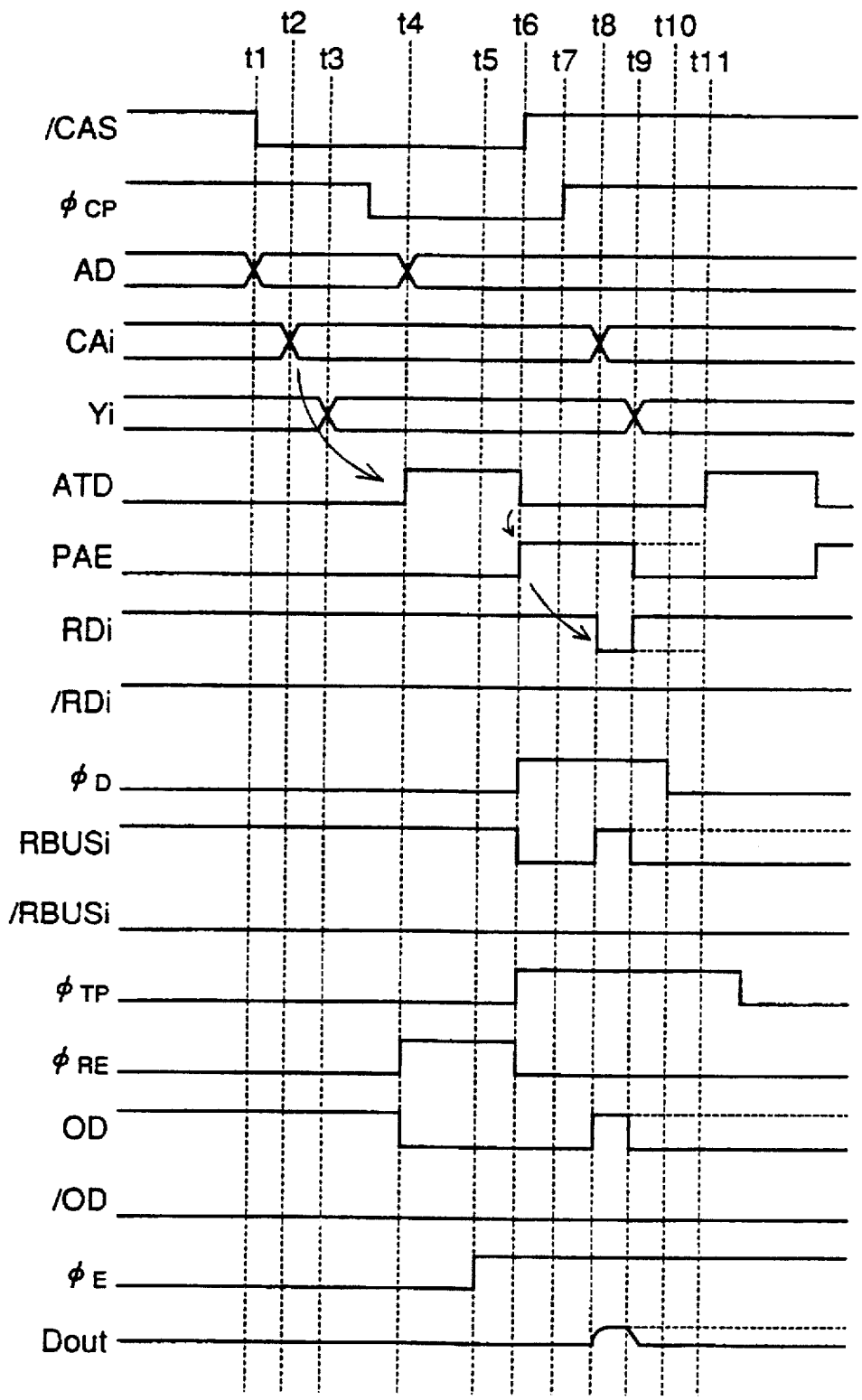
FIGS. 39–41 are first, second, and third timing charts for describing the problems of the semiconductor memory device of FIG. 23, respectively.
Figure 40:
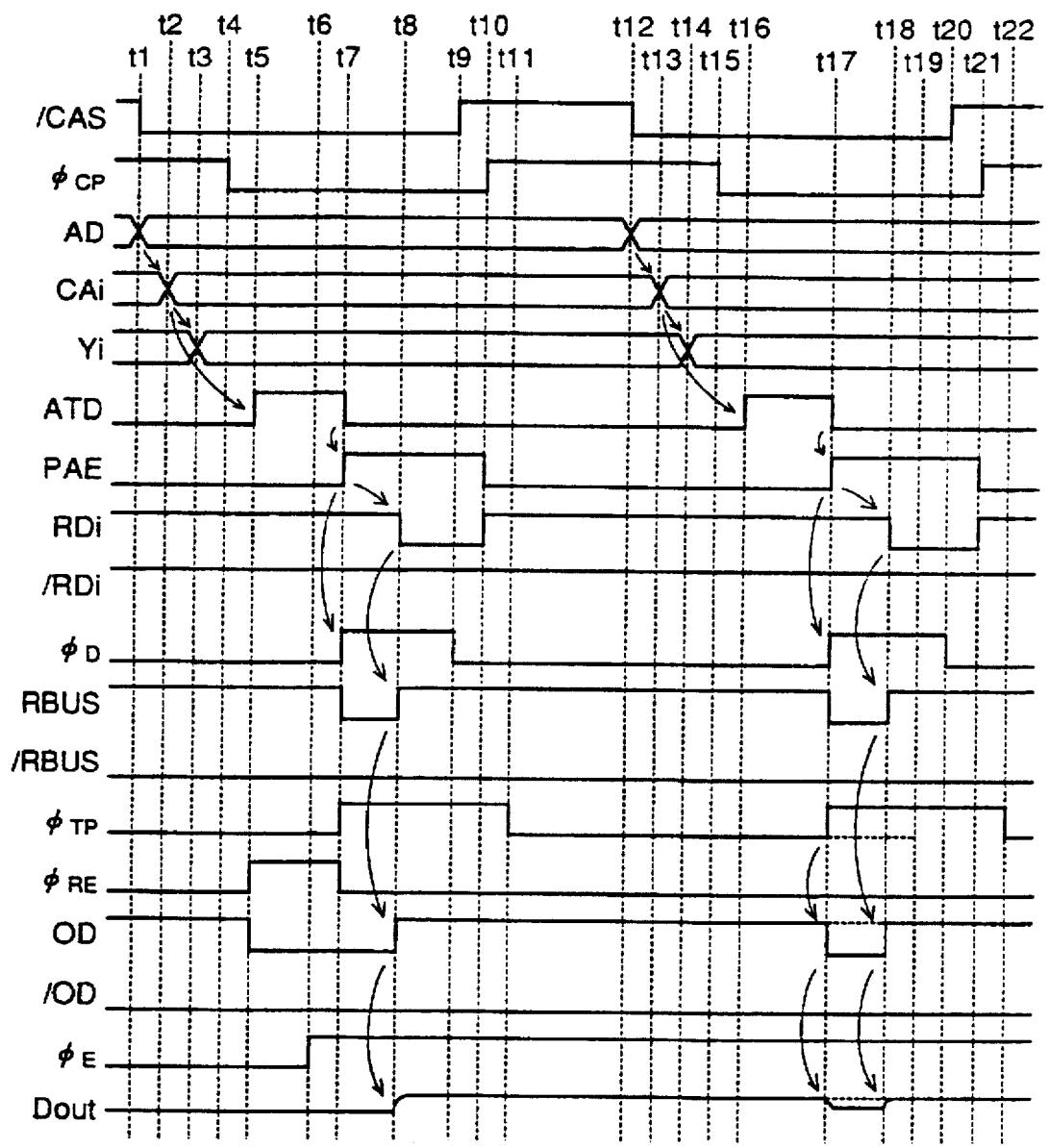
Figure 41:
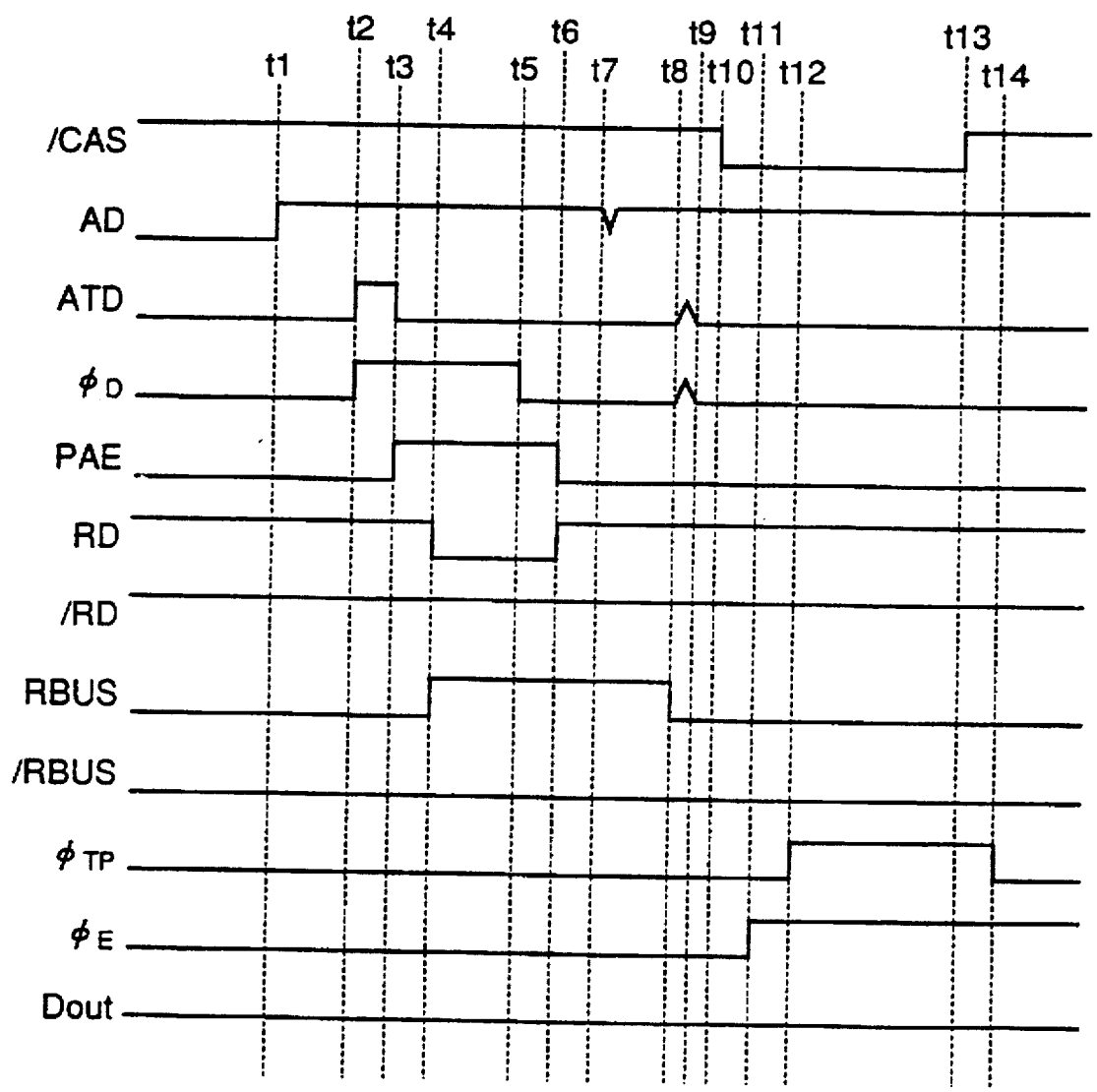

When an address detection change circuit is operated at high speed for speeding the operation of a semiconductor memory device, and a short noise is entered in address signal AD at time t7, noise is transmitted to address change detection signal ATD at time t8, and a noise is generated in data select control signal $\phi_D$. Here, S-R flipflop SRF shown in FIG. 33 is not completely inverted, so that the output signal of S-R flipflop SRF also attains an L level when the noise is eliminated at time t9. Therefore, differential amplifier activation signal PAE remains at an L level. When noise is entered in data select control signal $\phi_D$ at time t8, and node N5 of selector SE shown in FIG. 8 is pulled down to an L level, data of readout data bus RBUS attains an L level temporarily.

However, the output signal of the flipflop circuit formed of NAND gates G43 and G44 of latch circuit LC0 does not change. Therefore, when data select control signal $\phi_D$ returns to an L level at time t9, the data of readout data bus RBUS also returns to an H level. As a result, even when noise is introduced into address signal AD to result in generation of noise in only data select control signal $\phi_D$ and not in differential amplifier activation signal PAE, control address strobe signal /CAS attains an L level at time t10, and output buffer activation signal $\phi_E$ attains an H level at time t11. When data transfer control signal $\phi_T$ attains an H level at time t12, output buffer OD provides data of an H level to operate properly. Thus, the address change detection circuit can be operated at high speed, allowing a high speed data readout operation to be realized.

Figure 13:
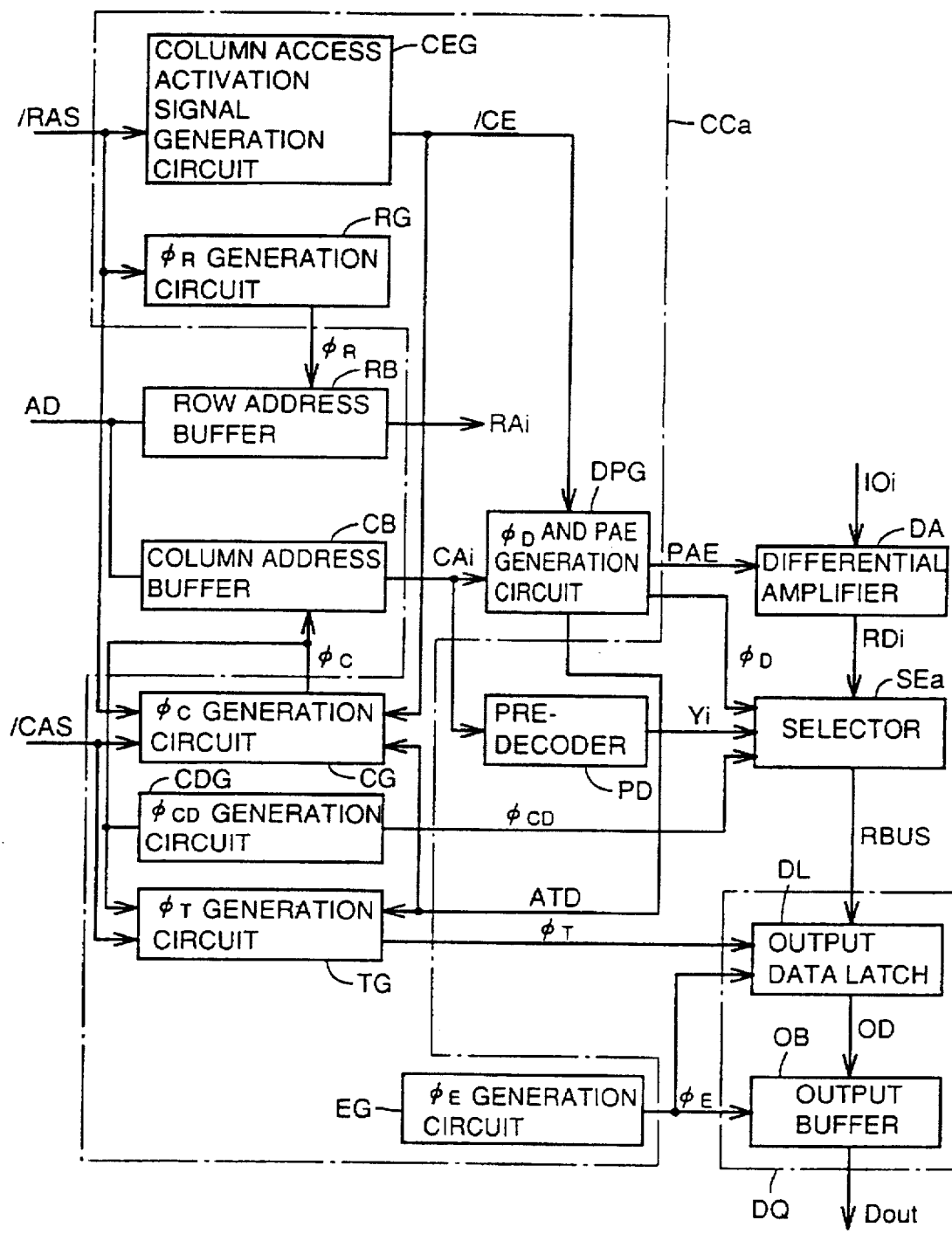
FIG. 13 is a block diagram showing another specific structure of the control circuit of FIG. 1.

Another specific example of the control circuit of FIG. 1 will be described hereinafter with reference to a block diagram of FIG. 13. The control circuit of FIG. 13 differs from the control circuit of FIG. 3 in that a $\phi_{CD}$ generation circuit CDG is added, and a delay column address buffer control signal $\phi_{CD}$ is provided to a selector SEa. The remaining structure and the remaining components are similar to those of the control circuit of FIG. 3, and have the same reference characters denoted. Description of the likewise component will not be repeated. The $\phi_{CD}$ generation circuit CD receives a column address buffer control signal $\phi_C$ from $\phi_C$ generation circuit CG to provide a delayed column address buffer control signal $\phi_{CD}$ which is delayed for a predetermined time period to selector SEa. Selector SEa responds to delayed column address buffer control signal $\phi_{CD}$ and predecode signal Yi to select data output signal $\phi_{CD}$ from differential amplifier DA. The delay time by $\phi_{CD}$ generation circuit CDG is set to be identical to those of delay circuits DC0–DC1 shown in FIG. 8.

The selector of FIG. 13 will be described in further detail with reference to the circuit diagram of FIG. 14. The selector shown in FIG. 14 differs from the selector shown in FIG. 8 in that delay circuits DCa0–DCa3 are modified. The remaining components are similar to those of the selector of FIG. 8, and have the same reference characters denoted. Therefore, their description will not be repeated.

Figure 14:
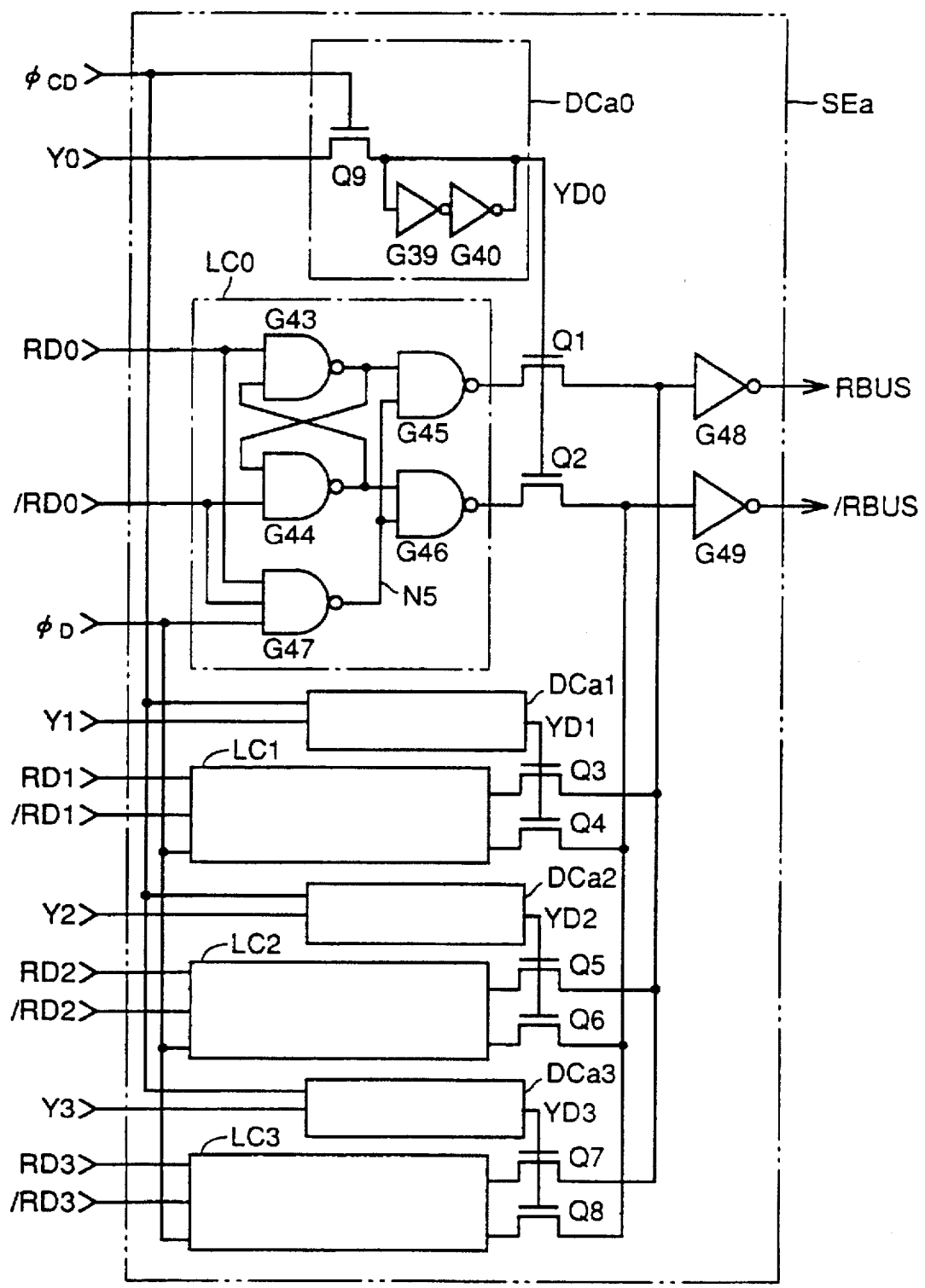
FIG. 14 is a circuit diagram showing a structure of the selector of FIG. 13.

Referring to FIG. 14, a delay circuit DCa0 includes a transistor Q9 which is an N type MOSFET, and inverters G39 and G40. Delayed column address buffer control signal $\phi_{CD}$ is applied to the gate of transistor Q9. Transistor Q9 receives a predecode signal Y0. Transistor Q9 is connected to inverter G39. Inverter G39 is connected to inverter G40, which in turn is connected to transistor Q9.

According to the above structure, delay circuit DCa0 responds to delayed column address buffer control signal $\phi_{CD}$ to latch predecode signal Y0, whereby a delayed predecode signal YD0 which is a delayed version of predecode signal Y0 is output. The timing of delayed predecode signal YD0 is similar to delayed predecode signal YD0 output from delay circuit DC0 of selector SE shown in FIG. 8. The other delay circuits DCa1–DCa3 are formed in a similar manner, and the operation is likewise. Therefore, selector SEa of FIG. 14 operates in the manner similar to that of selector SE of FIG. 8 and similar effects can be obtained.

Figure 15:
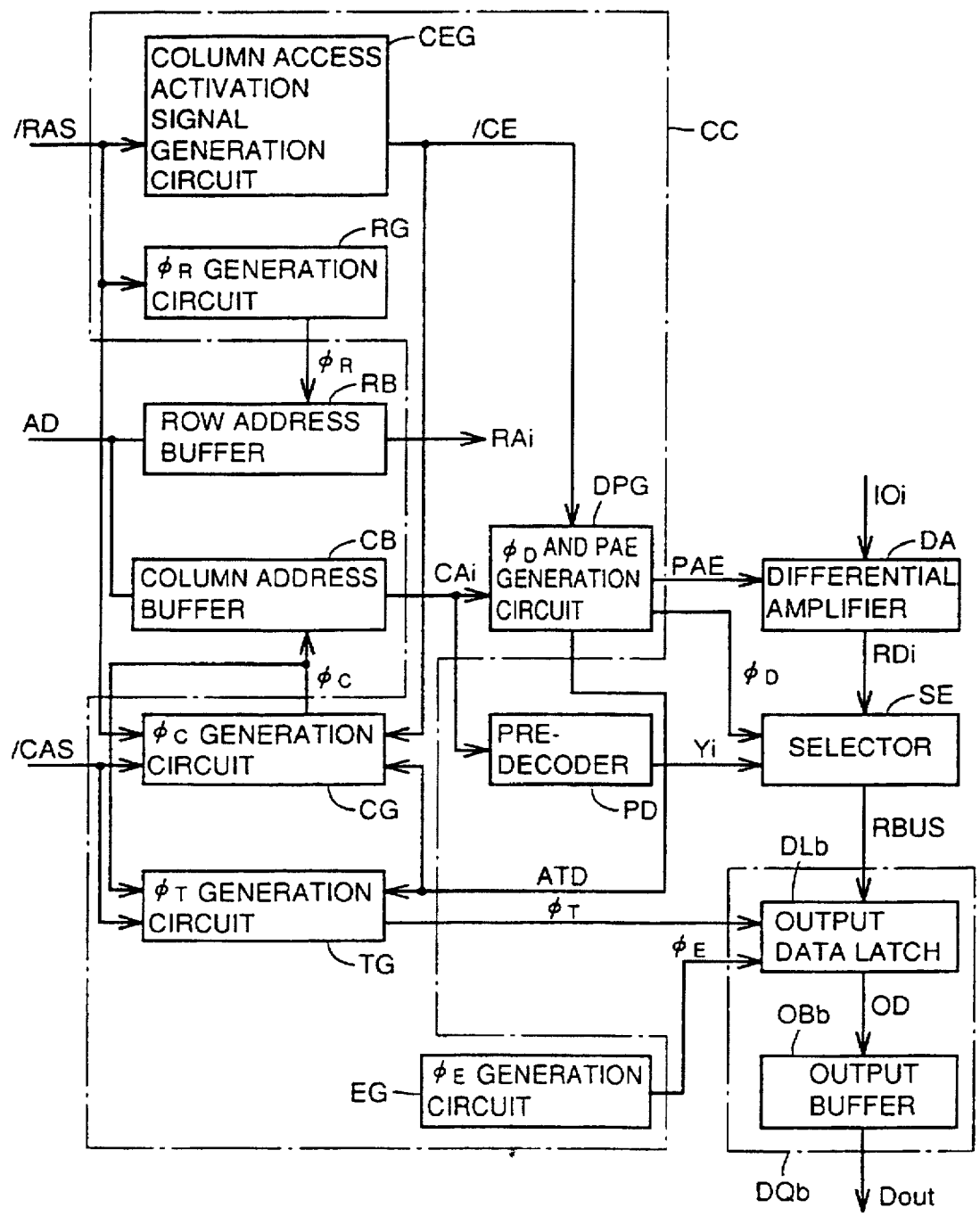
FIG. 15 is a block diagram showing another specific structure of the output circuit of FIG. 1.

Another specific example of the output circuit of FIG. 1 will be described with reference to a block diagram of FIG. 15. The output circuit of FIG. 15 differs from the output circuit of FIG. 3 in that output buffer activation signal $\phi_E$ is applied to only output data latch DLb. The remaining components are similar to those of the output circuit of FIG. 3, and have the same reference characters denoted. Therefore, their description will not be repeated. Output data latch DLb responds to output buffer activation signal $\phi_E$ to latch an input data. The latched data is provided to output buffer OBb.

Figure 16:
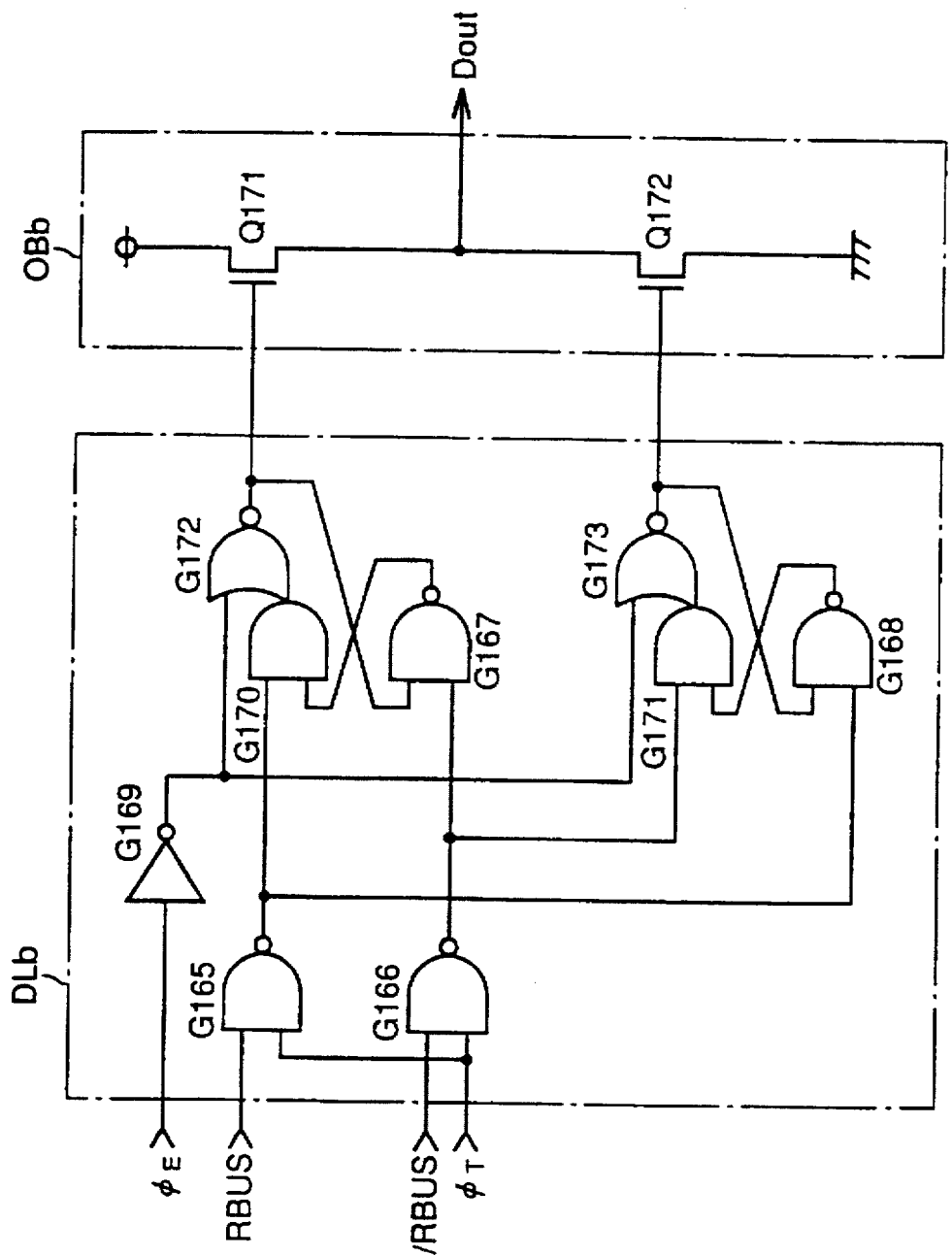
FIGS. 16–18 are circuit diagrams showing first, second, and third specific structures of the output circuit of FIG. 15, respectively.

The output circuit of FIG. 15 will be described in detail with reference to the circuit diagram of FIG. 16. Referring to FIG. 16, output data latch DLb includes NAND gates G165–G168, inverter G169, AND gates G170, G171, and NOR gates G172, G173.

Data of readout data bus RBUS and data transfer control signal $\phi_T$ are applied to NAND gate G165. NAND gate G165 is connected to AND gate G170 and NAND gate G168. Data of readout data bus /RBUS and data transfer control signal $\phi_T$ are applied to NAND gate G166. NAND gate G166, is connected to NAND gate G167 and AND gate G171. Output buffer activation signal $\phi_E$ is applied to inverter G169. Inverter G169 is connected to NOR gates G172 and G173. AND gate G178 has its input side connected to the output side of NAND gate G167. AND gate G170 has its output side connected to NOR gate G172. NOR gate G172 has its output side connected to the input side of NAND gate 167. An output signal of NOR gate G172 is applied to output buffer OBb. According to the above structure, a latch circuit is formed, whereby data is latched in response to an output buffer activation signal $\phi_E$. The latched data is provided to output buffer OBb. AND gate G171, NAND gate G168, and NOR gate G173 are also connected in a similar manner, so that an output signal is provided to output buffer OBb similarly.

Output buffer OBb includes transistors Q171 and Q172 which are N type MOSFETs. Output signals of output data latch DLb is applied to respective gates of transistors Q171 and Q172. Transistor Q171 is connected to power supply voltage $V_{CC}$ and transistor Q172. Transistor Q172 is connected to ground potential. Output data Dour is provided from a node of transistors Q171 and Q172. Although output buffer OBb is shown in the most simplified structure, a circuit for increasing the gate voltage of transistor Q171 as shown in FIGS. 9 and 10 may be added.

According to the above structure, output data latch DLb and output buffer OBb operate in a manner similar to those of output data latch DL and output buffer OB of FIG. 9 to obtain similar effects. In output data latch DLb and output buffer OBb of FIG. 16, the number of stages of gates is reduced, so that the circuit complexity can be reduced. It is therefore possible to achieve further integration density.

A second specific example of the output circuit of FIG. 15 will be described with reference to the circuit diagram of FIG. 17.

Figure 17:
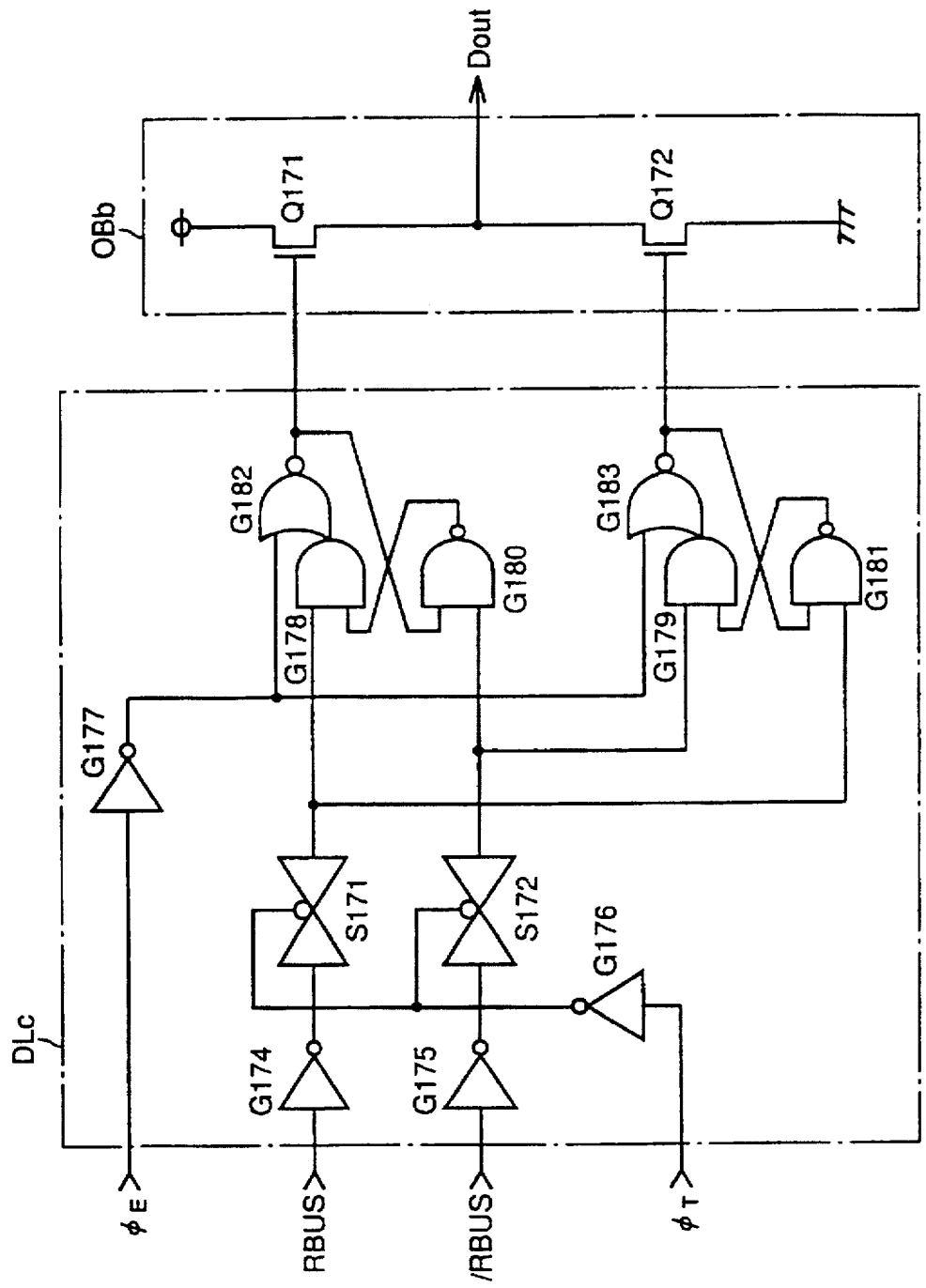

Referring to FIG. 17, output data latch DLc includes inverters G174–G177, switches S171, S172, AND gates G178, G179, NAND gates G180, G181, and NOR gates G182, G183.

Data of readout data bus RBUS is supplied to switch S171 via inverter G174. Data of readout data bus /RBUS is supplied to switch S172 via inverter G175. Data transfer control signal $\phi_T$ is applied to switches S171 and S172 via inverter G176. Therefore, switches S171 and S172 provide input data in response to data transfer control signal $\phi_T$. The remaining components have a structure similar to those of output data latch DLb of FIG. 16, and operate in a similar manner. According to the above structure, output data latch DLc shown in FIG. 17 operates in a manner similar to output data latch DLb of FIG. 16, and similar effects can be achieved.

A third specific example of the output circuit of FIG. 15 will be described with reference to the circuit diagram of FIG. 18.

Figure 18:
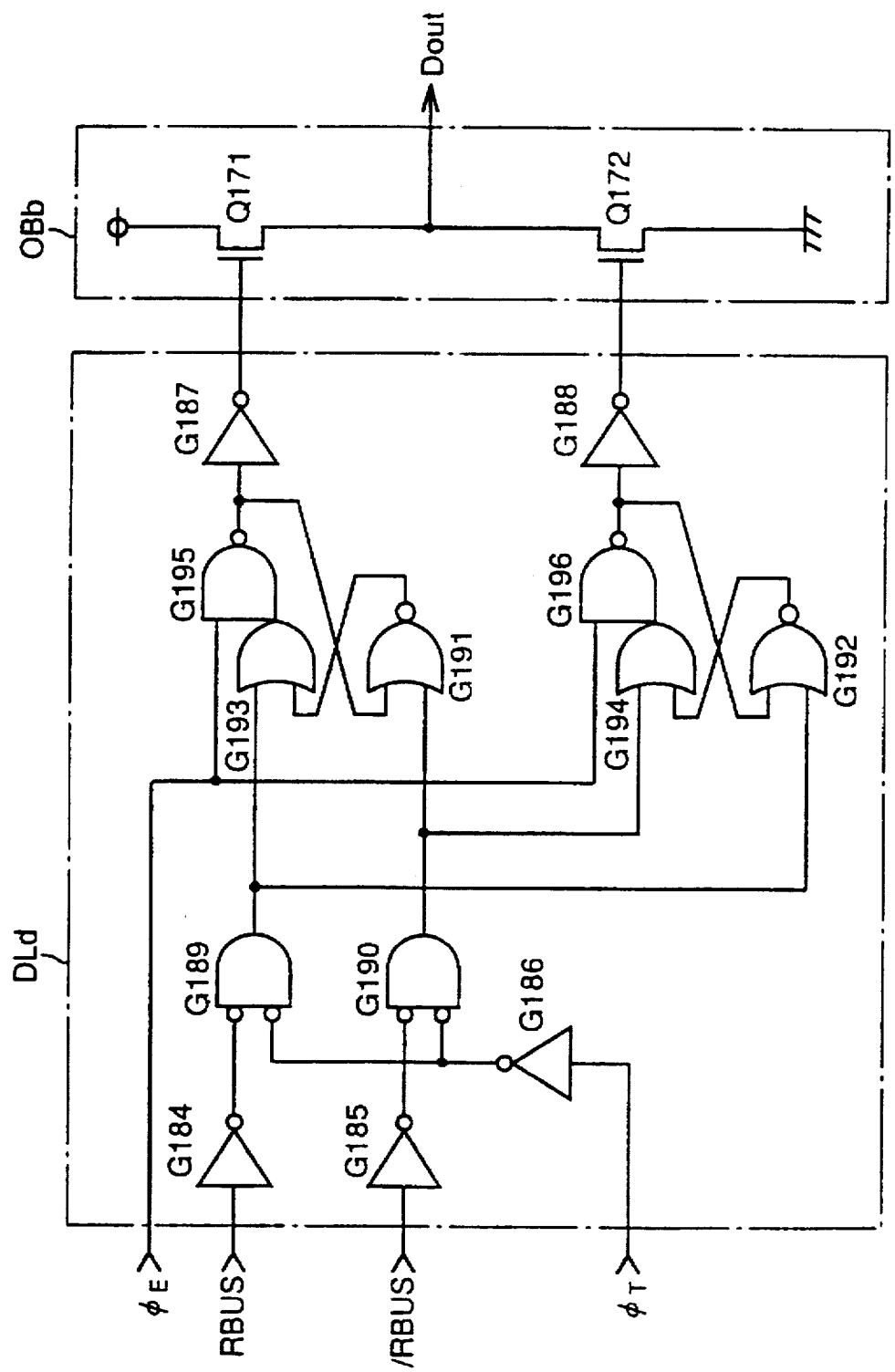

Referring to FIG. 18, an output data latch DLd includes inverters G184–G188, NOR gates G89–G192, OR gates G193, G194, and NAND gates G195, G196.

NOR gate G189 receives data of readout data bus RBUS via inverter G184 and data transfer control signal $\phi_T$ via inverter G186. NOR gate G189 is connected to OR gate G193 and NOR gate G192. NOR gate G190 is connected similar to NOR gate G189. OR gate G193 has its input side connected to the output side of NOR gate G191, and its output side connected to NAND gate G195. Output buffer activation signal $\phi_E$ is applied to NAND gates G195 and G196. NAND gate G195 has its output side connected to the input side of NOR gate G191. NAND gate G195 is connected to inverter G187. The output signal of inverter G187 is provided to output buffer OBb. OR gate G194, NOR gate G192, NAND gate G196, and inverter G188 are connected in a similar manner, whereby an output signal of inverter G188 provided to output buffer OBb.

According to the above structure, output data latch DLd of FIG. 18 operates in a manner similar to the output data latch DLb of FIG. 16, and similar effects can be achieved.

A DRAM according to another embodiment of the present invention will be described with reference to the block diagram of FIG. 19. The semiconductor memory device of FIG. 19 differs from the semiconductor memory device of FIG. 1 in selectors SEEa–SEEd, and output buffers OBa–OBd. The remaining components are similar to those of the semiconductor memory device of FIG. 1, and likewise components are denoted with likewise reference characters. Therefore, their description will not be repeated.

Selectors SEEa–SECd and output buffers OBa–OBd will be described in detail hereinafter.

Figure 19:
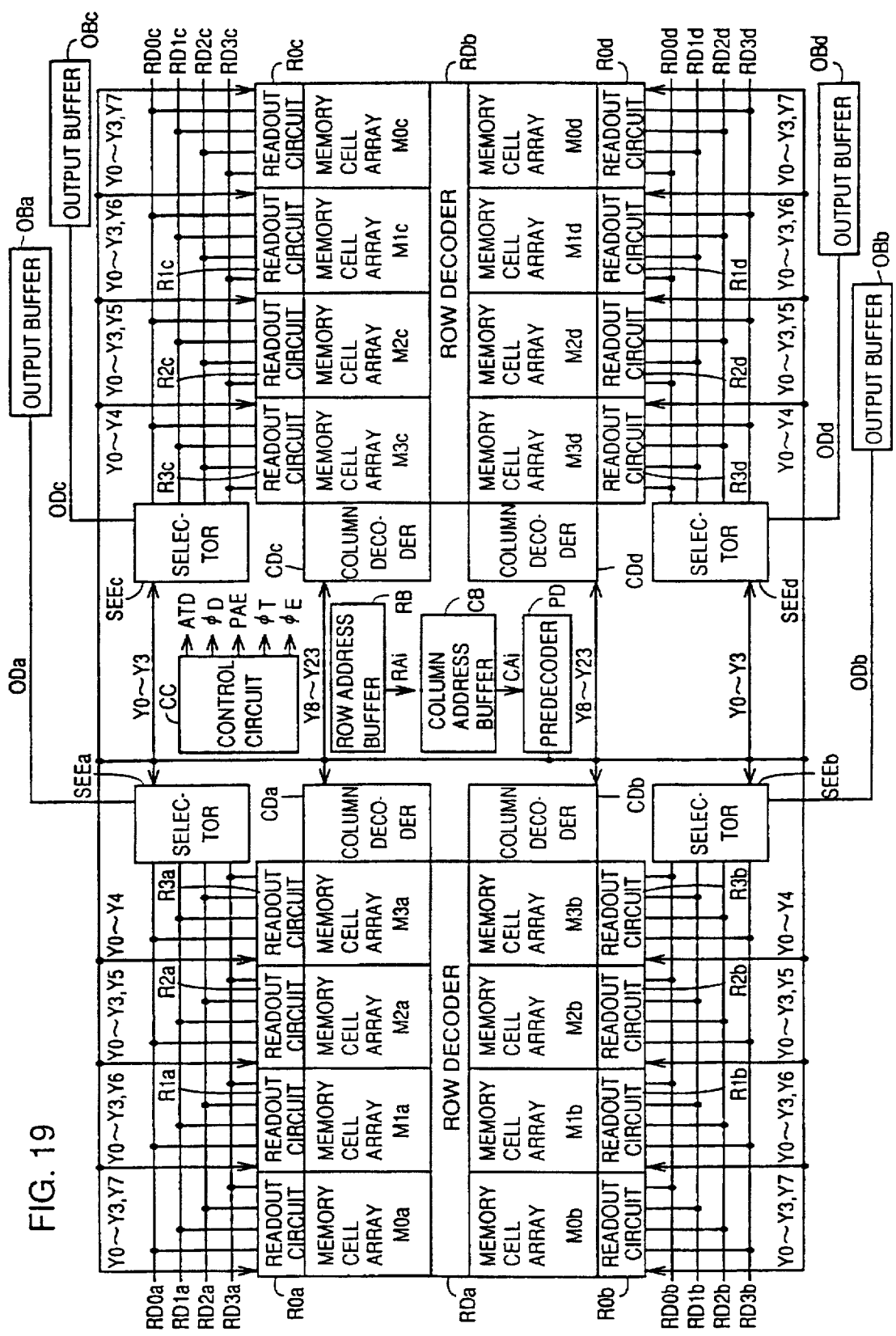
FIG. 19 is a block diagram showing a structure of a semiconductor memory device according to another embodiment of the present invention.
Figure 20:
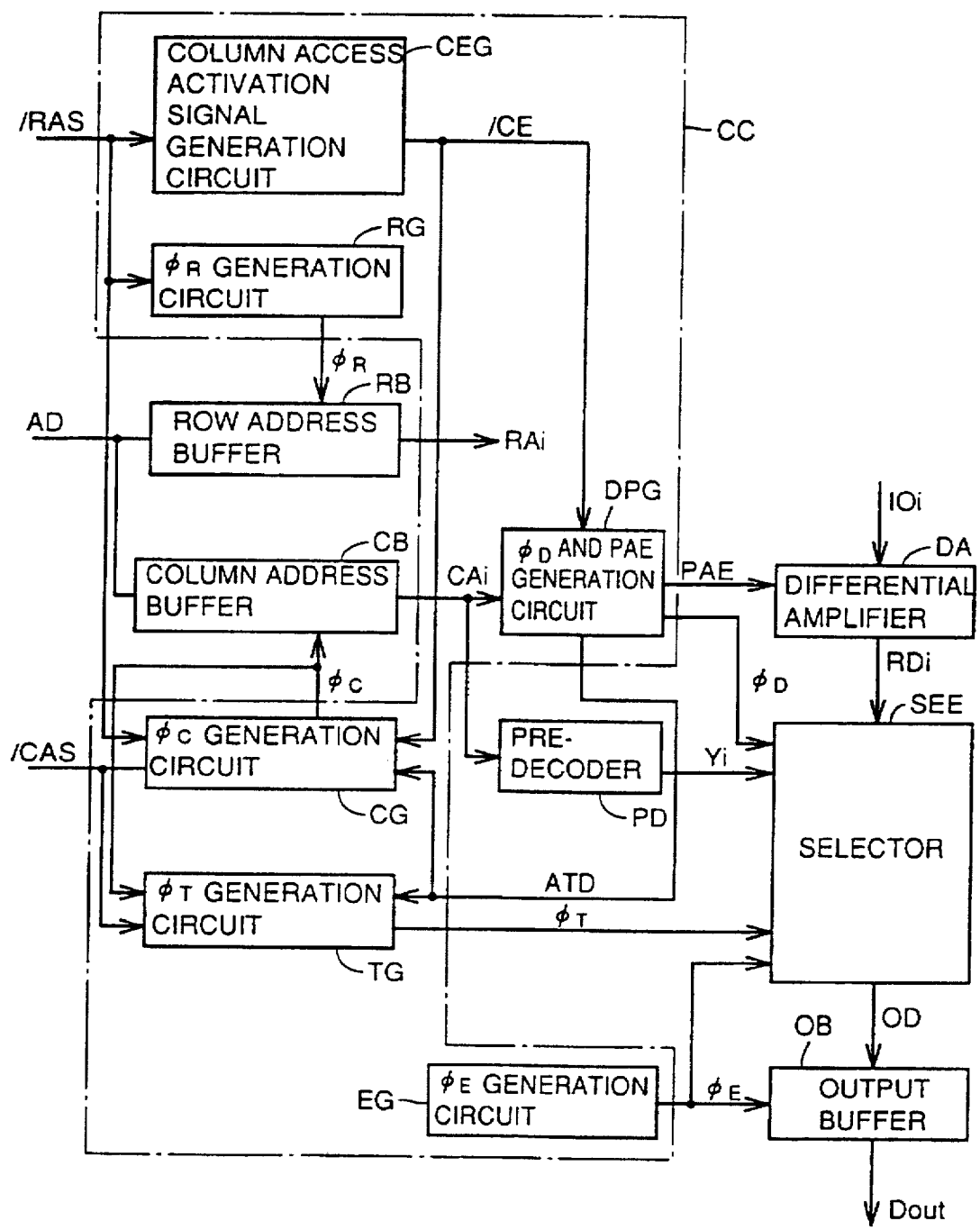
FIG. 20 is a block diagram showing a structure of the control circuit and the selector of FIG. 19.

FIG. 20 is a block diagram showing a structure of the control circuit, the selector, and the output buffer of FIG. 19. In FIG. 20, control circuit CC has a structure similar to that of FIG. 3, with likewise operation. Furthermore, row address buffer RB, column address buffer CB, predecoder PB, differential amplifier DA, and output buffer OB have a structure similar to the respective circuits shown in FIG. 3, and operate in a similar manner. Therefore, corresponding components have the same reference characters denoted, and their description will not be repeated.

Data select control signal $\phi_D$ from $\phi_D$ and PAE generation circuit DPG, predecode signal Yi from predecoder PB, data transfer control signal $\phi_T$ from $\phi_T$ generation circuit TG, and output buffer activation signal $\phi_E$ from $\phi_E$ generation circuit EG is applied to selector SEE. Selector SEE responds to each input control signal to select predetermined data from a plurality of data provided from differential amplifier DA via readout data line RDi. The selected data is latched and provided to output buffer OB via output signal bus OD.

Selector SEE will be described in further detail with reference to a circuit diagram of FIG. 21.

Figure 21:
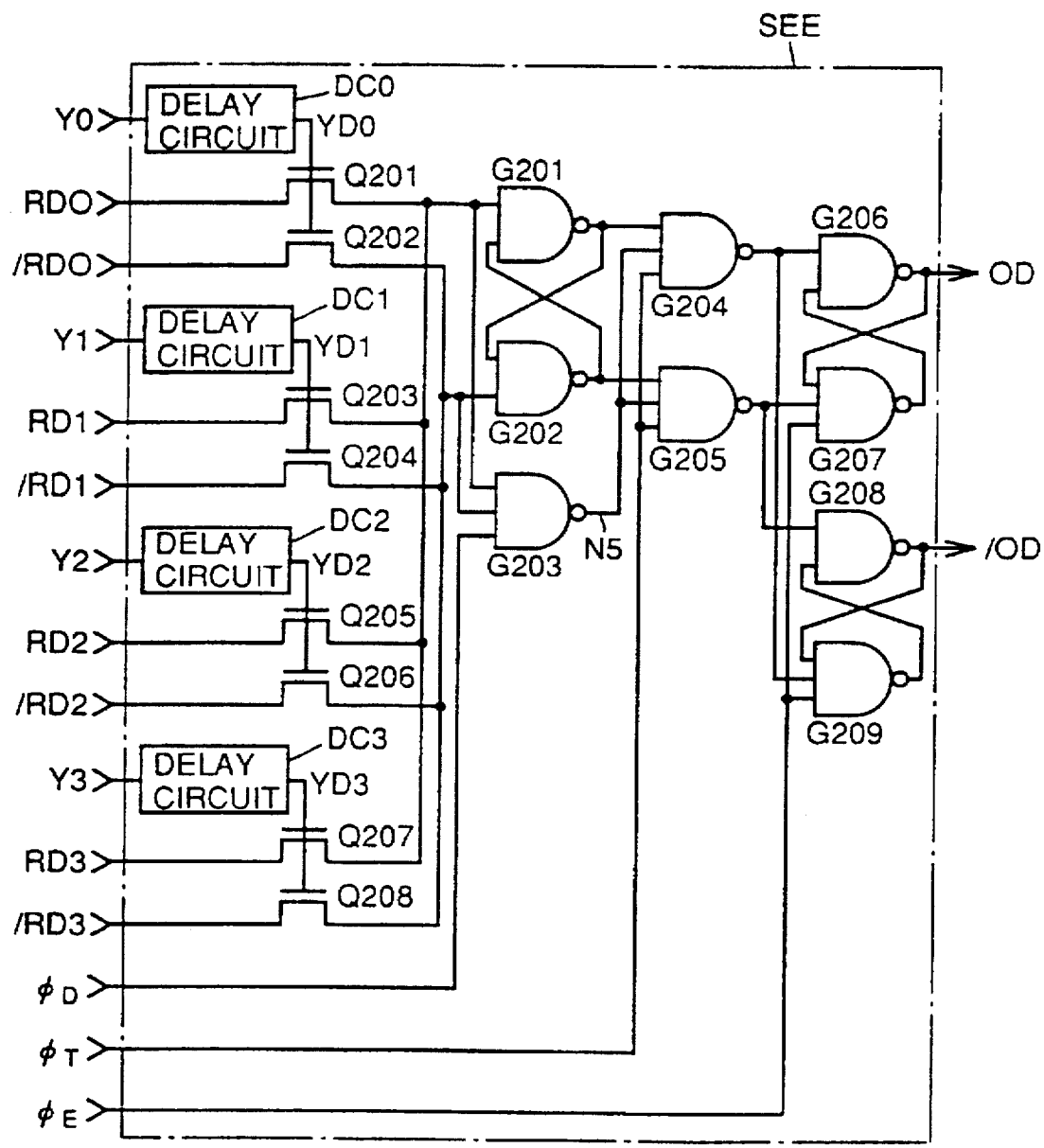
FIG. 21 is a circuit diagram showing a structure of the selector of FIG. 20.

Referring to FIG. 21, selector SEE includes delay circuits DC0–DC3, transistors Q201–Q208 which are N type MOSFETs, and NAND gates G201–G209. Delay circuits DC0–DC3 of FIG. 21 have a structure similar to those of delay circuits DC0–DC3 shown in FIG. 8, and operate in a similar manner.

Predecode signal Y0 is applied to delay circuit DC0. Delay circuit DC0 is connected to the gates of transistors Q201 and Q202. Delay circuit DC0 delays predecode signal Y0 to provide delayed predecode signal YD0 to the gates of transistors Q201 and Q202. Data of readout data line RD0 is applied to NAND gates G201 and G203 via transistor Q201. Data of readout data line /RD0 is applied to NAND gates G202 and G203 via transistor Q202. The other delay circuits DC0–DC3 and transistors Q203–Q208 are connected in a similar manner to operate likewise.

NAND gates G201 and G202 have their output side and their input side cross-connected to form a flipflop circuit.

NAND gate G201 is connected to NAND gate G204. NAND gate G202 is connected to NAND gate G205. Data select control signal $\phi_D$ from $\phi_D$ and PAE generation circuit DPG is supplied to NAND gate G203. NAND gate G203 is connected to NAND gates G204 and G205. As described above, a latch circuit similar to latch circuit LC0 shown in FIG. 8 is formed of NAND gates G201–G205 to carry out a similar operation.

Data transfer control signal $\phi_T$ from $\phi_T$ generation circuit TD is applied to NAND gates G204 and G205. NAND gate G204 is connected to NAND gates G206 and G209. NAND gate G205 is connected to NAND gates G207 and G208. Output buffer activation signal $\phi_E$ from $\phi_E$ generation circuit EG is applied to NAND gates G207 and G209. NAND gates G206 and G207 have their input side and their output side cross-connected to form a flipflop circuit. NAND gate G206 provides the latched data to output signal bus OD. Similarly, NAND gates G208 and G209 form a flipflop circuit, and NAND gate G208 provides the latched data to output signal bus /OD complementary to output signal bus OD. NAND gates G204–G209 have a structure similar to that of output data latch DL of FIG. 9, and operate in a similar manner.

As described above, selector SEE is formed of a data select portion provided at a preceding stage, and latch circuits G201–G209 which are latch circuit LC0 shown in FIG. 8 merged with output data latch DL shown in FIG. 9. According to the above structure, selector SEE includes three stages from readout data lines RD0–RD3, /RD0–/RD3 to output signal buses OB, /OB. Therefore, in comparison with selector SE of FIG. 8 and output data latch DL of FIG. 9 where the number of stages from readout data lines RD0–RD3, /RD0–/RD3 to output signal OD is 5, the number of stages is 3 in selector SEE of FIG. 21. Therefore, data can be read out at a higher speed. Also, the circuit complexity is improved, so that the chip area of the semiconductor memory device can be reduced.

Figure 22:
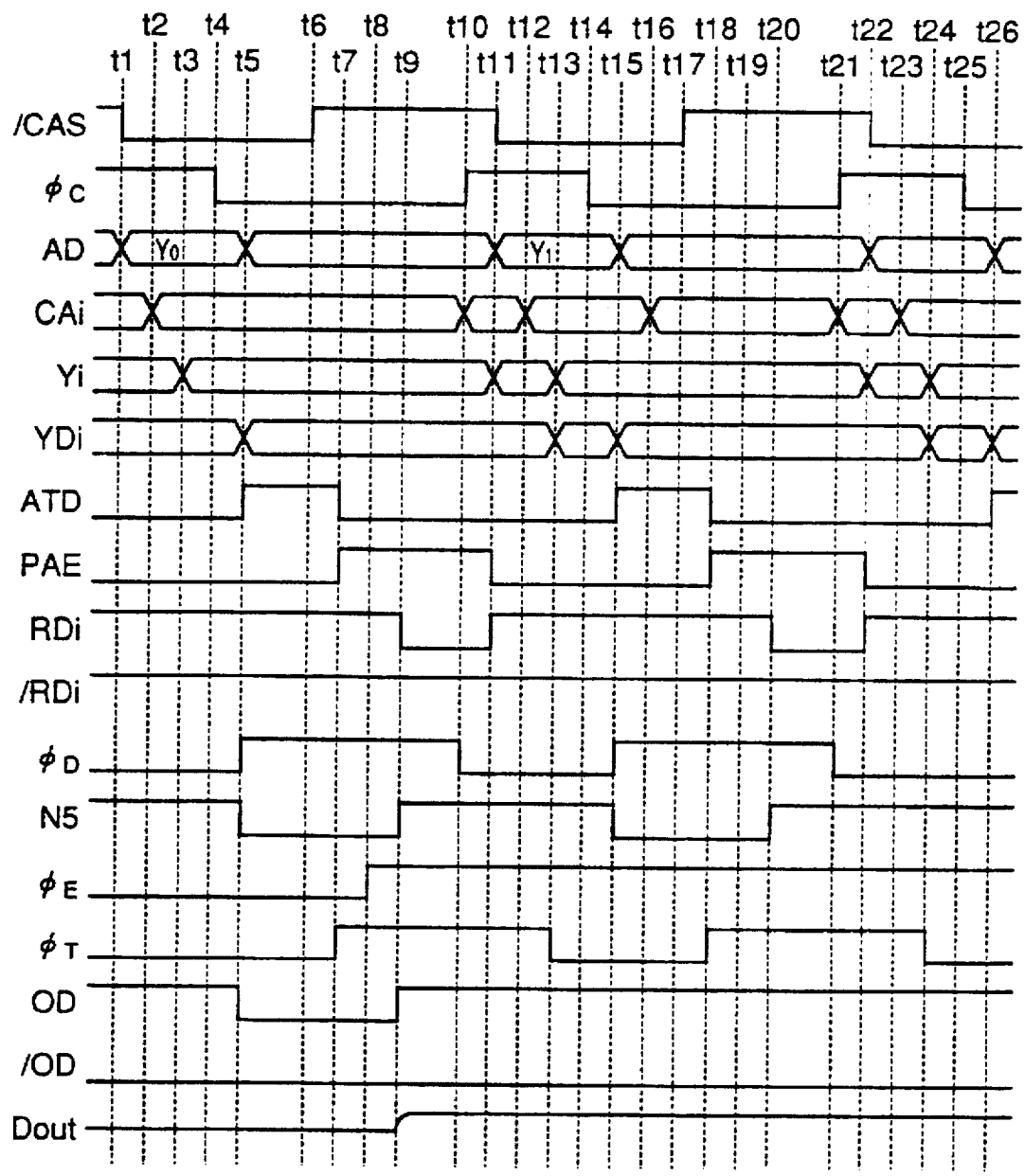
FIG. 22 is a timing chart for describing the operation of the semiconductor memory device of FIG. 19.

The operation of the above semiconductor memory device will be described hereinafter with reference to a timing chart of FIG. 22.

Since selector SEE is a circuit in which selector SE and output data latch DL of the semiconductor memory device of FIG. 3 are merged, the operation thereof is similar. Therefore, the present semiconductor memory device operates as shown in FIG. 22 which is similar to the timing chart of FIG. 11. Thus, the semiconductor memory device of FIG. 19 can achieve effects similar to those of the semiconductor memory device of FIG. 1.

Although the data bus transmitting the signal output from selector SEE is described as output signal buses OD, /OD in FIGS. 19–22, this data bus is similar to readout data buses RBUS, /RBUS shown in FIG. 1. The label is changed only because the transmitting signals differ. More specifically, an output signal of selector SEE (identical to output signals OD, /OD of output data latch DL shown in FIG. 9) are transmitted to output signal buses OD, /OD, and an output signal of selector SE is transmitted to readout data buses RBUS, /RBUS. The structure and arrangement are substantially similar.

Although a DRAM was described as a semiconductor memory device in the above embodiments, the present invention is applicable to other semiconductor memory devices.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device including a plurality of memory cells, comprising:

a plurality of data buses each for transmitting data from a selected one of said plurality memory cells;

an address circuit for sampling an external address signal and decoding the external address signal into a decoded address signal for provision, said decoded address signal making a transition in response to a first control signal and to said external address signal, said address circuit latching said external address signal in response to an address strobe signal attaining a first level, said decoded address signal being independent of the latched external address signal during a period which the external address signal is latched;

a plurality of selecting circuits provided corresponding to said plurality of data buses respectively, for selecting a data bus out of said plurality of data buses in accordance with said decoded address signal received from said address circuit;

a data latching circuit for sampling and latching data transmitted by the selected data bus selected by the selecting circuits out of said plurality of data buses;

a data output buffer for receiving and outputting the data sampled by said data latching circuit in response to a second control signal; and a control circuit for generating said first and second control signals, to control said address circuit and said data latching circuit such that said data latching circuit samples the data transmitted by the selected data bus out of said plurality of data buses in response to said address strobe signal attaining the first level and to an elapse of a first predetermined time period since a transition of the external address signal, that said decoded address signal is dependent on said external address signal in response to said address strobe signal attaining a second level different from said first level and to an elapse of a second predetermined time period since the transition of the external address signal, and that said data latching circuit latches the data transmitted by the selected data bus before said decoded address signal, is rendered dependent on said external address signal, said second predetermined longer than said first predetermined time period.

2. The semiconductor memory device according to claim 1, wherein said address circuit includes, an address buffer receiving said external address signal and said first control signal, for providing an internal address signal according to said external address signal in response to said first control signal, and a precoder for receiving and decoding said internal address signal and providing said decoded address signal.

3. The semiconductor memory device according to claim 2, wherein said plurality of selecting circuits are included in a selector, and said data latching circuit and said data output buffer are included in an output circuit.

4. The semiconductor memory device according to claim 2, wherein said plurality of selecting circuits and said data latching circuit are commonly included in a selector.

* * * * *